US008212282B2

(12) United States Patent  (10) Patent No.: US 8,212,282 B2
Ohtsuka et al.  (45) Date of Patent: Jul. 3, 2012

(54) SEMICONDUCTOR DEVICE USED IN STEP-UP DC-DC CONVERTER, AND STEP-UP DC-DC CONVERTER

(75) Inventors: Masaya Ohtsuka, Hyogo (JP); Yoshinori Ueda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/889,695

(22) Filed: Sep. 24, 2010

(65) Prior Publication Data

US 2011/0012170 A1 Jan. 20, 2011

Related U.S. Application Data

(63) Continuation of application No. 11/811,435, filed on Jun. 8, 2007, now Pat. No. 7,842,967.

(30) Foreign Application Priority Data

Jun. 15, 2006 (JP) .................................. 2006-165589
Mar. 30, 2007 (JP) .................................. 2007-090883

(51) Int. Cl.
*H01L 29/66* (2006.01)

(52) U.S. Cl. ........ 257/121; 257/104; 257/288; 257/367; 257/570; 257/467; 257/498; 257/551; 257/603; 257/565; 257/E27.064; 257/E29.174; 257/E29.195; 257/E29.199; 257/E29.33; 257/E29.332; 323/282

(58) Field of Classification Search .................. 257/409, 257/492, 547, E27.064, E29.33, 46, 104, 257/106, 109, 121, 197, 199, 212, 288, 367, 257/498, 551, 570, 567, 603, E27.02, E27.017, 257/E27.019, E27.03, E27.031, E27.037–E27.039, 257/E29.174, E29.195, E29.199, E29.332
See application file for complete search history.

(56) References Cited

U.S. PATENT DOCUMENTS

| 4,814,852 | A | 3/1989 | Sundstrom |
| 5,286,995 | A | 2/1994 | Malhi |
| 5,471,082 | A * | 11/1995 | Maeda .......................... 257/362 |
| 5,591,657 | A | 1/1997 | Fujishima et al. |
| 6,034,413 | A | 3/2000 | Hastings et al. |
| 2002/0050619 | A1 | 5/2002 | Kawaguchi et al. |
| 2004/0253779 | A1 | 12/2004 | Hong |
| 2005/0017297 | A1 | 1/2005 | Shimizu et al. |
| 2005/0206361 | A1 | 9/2005 | Ito |
| 2006/0226499 | A1 | 10/2006 | Shimizu |

FOREIGN PATENT DOCUMENTS

| JP | 9-84333 | 3/1997 |
| JP | 2001-68561 | 3/2001 |
| JP | 3172642 | 3/2001 |
| JP | 2001-154627 | 6/2001 |
| JP | 2003-86790 | 3/2003 |

* cited by examiner

*Primary Examiner* — Meiya Li
(74) *Attorney, Agent, or Firm* — Cooper & Dunham LLP

(57) ABSTRACT

A power supply device is disclosed that is able to satisfy the power requirements of a device in service and has high efficiency. The power supply device includes a first power supply; a voltage step-up unit that steps up an output voltage of the first power supply; a voltage step-down unit that steps down an output voltage of the voltage step-up unit; and a load that is driven to operate by an output voltage of the voltage step-down unit. The voltage step-up unit steps up the output voltage of the first power supply to a lower limit of an operating voltage of the voltage step-down unit.

11 Claims, 63 Drawing Sheets

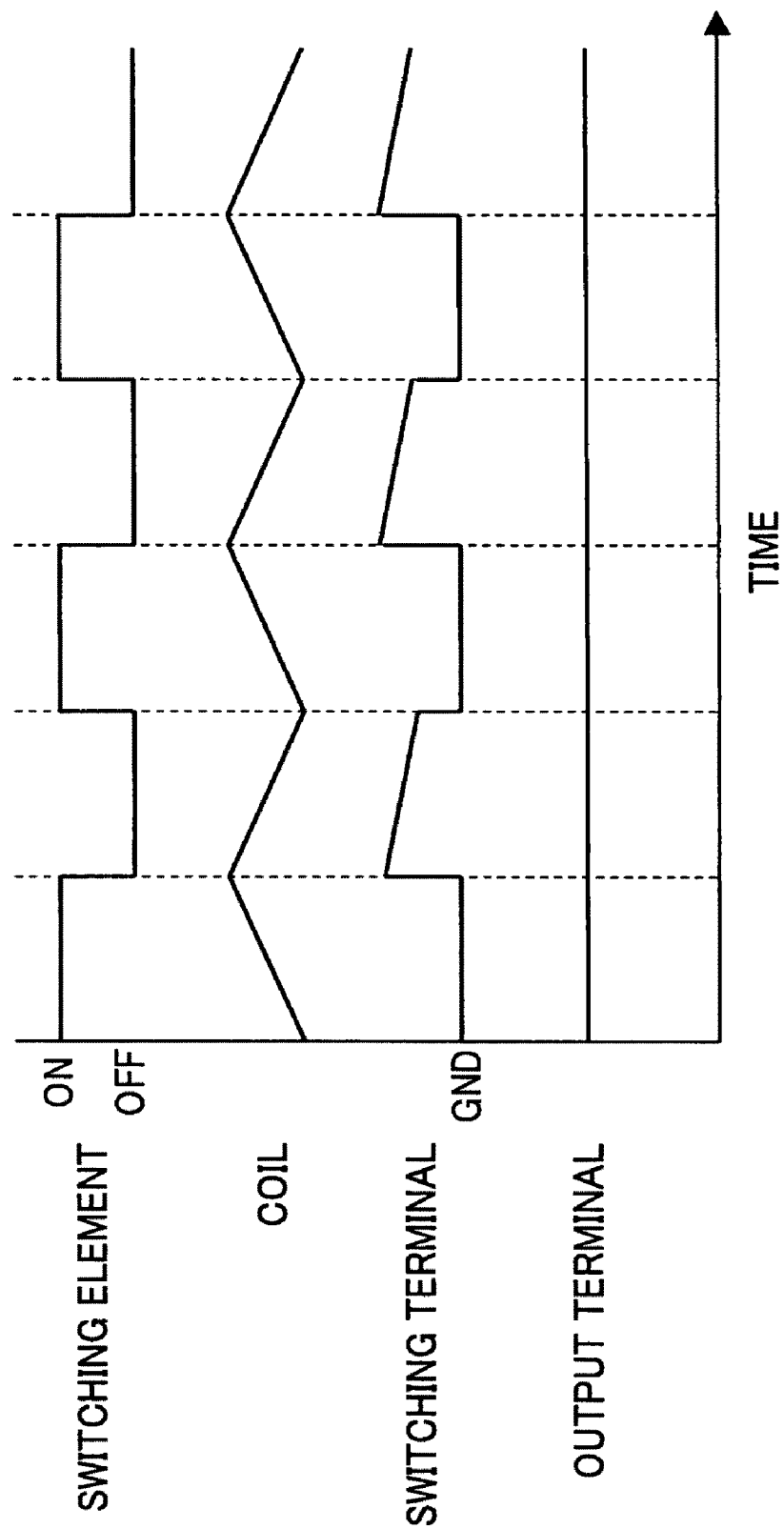

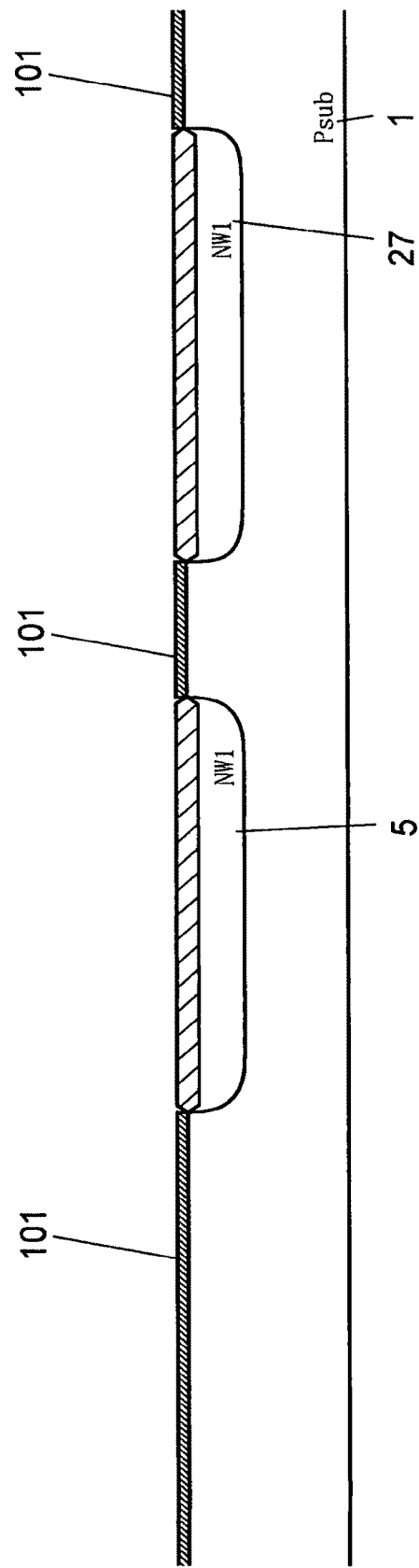

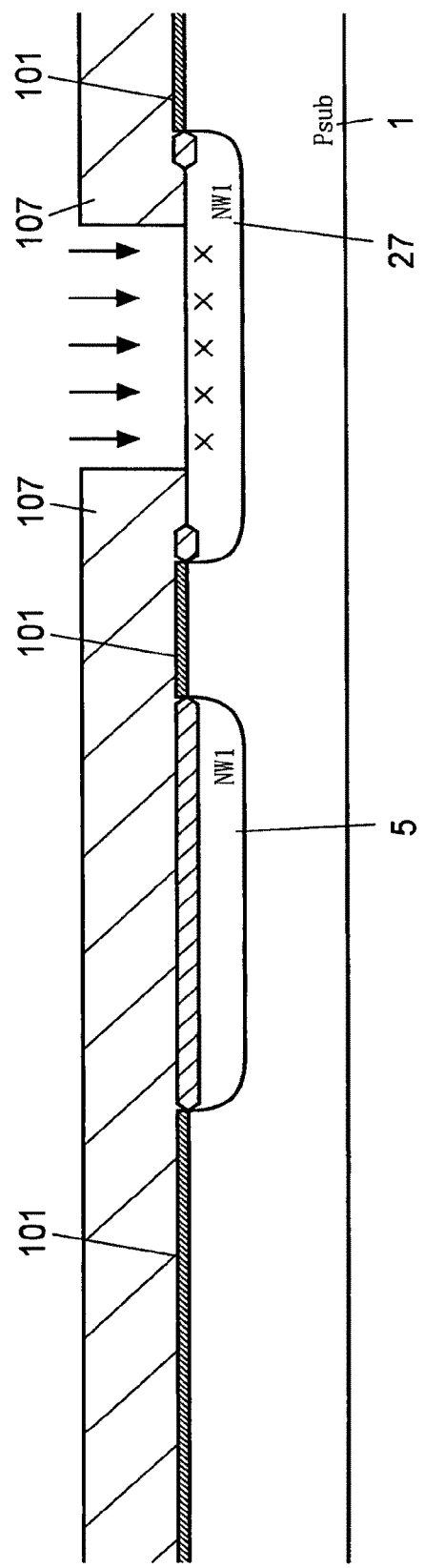

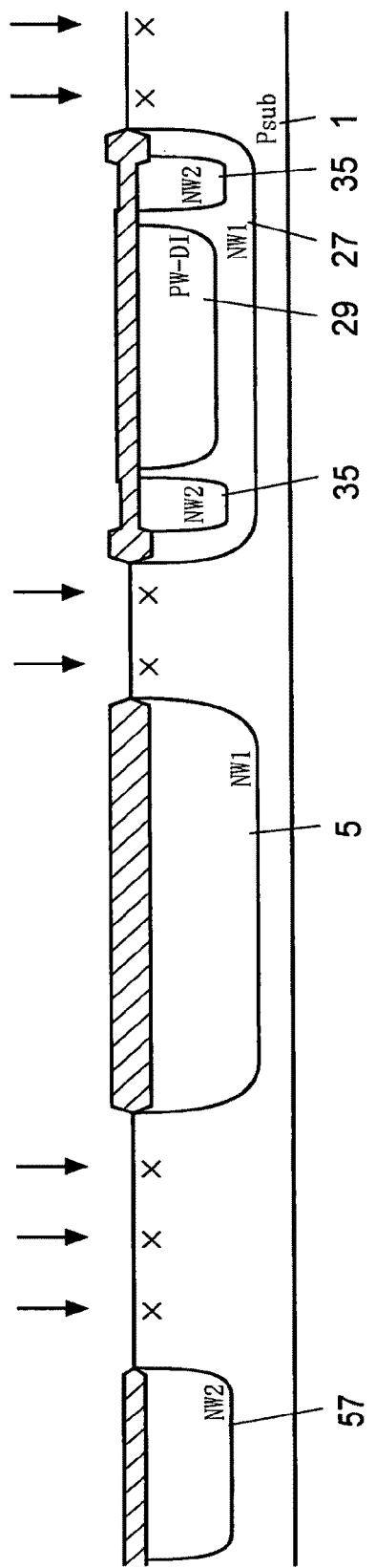

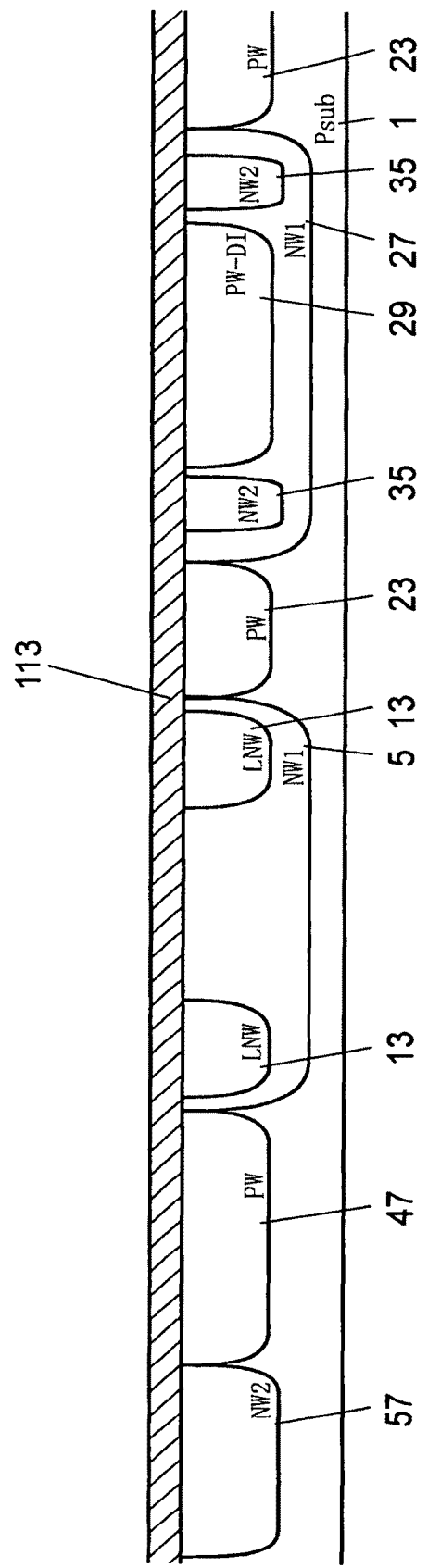

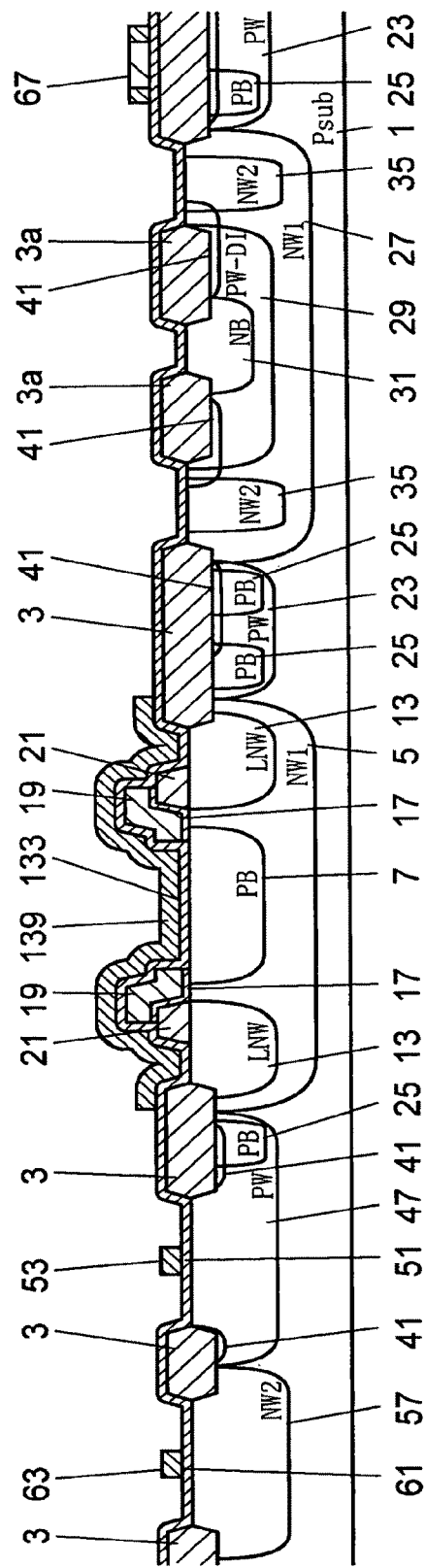

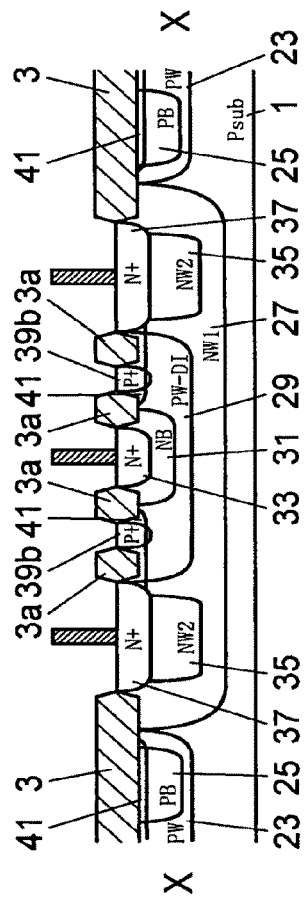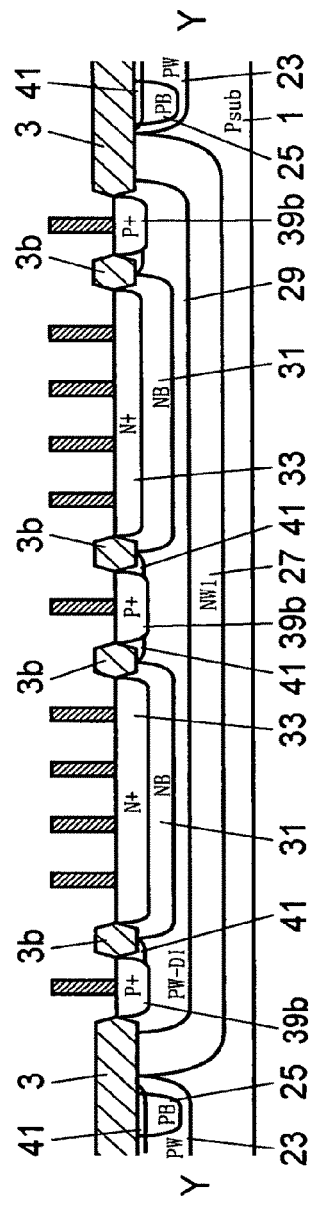

SEMICONDUCTOR DEVICE USED IN STEP-UP DC-DC CONVERTER, AND STEP-UP DC-DC CONVERTER

CROSS-REFERENCE TO RELATED APPLICATION

This application is a Rule 1.53(b) continuation of application Ser. No. 11/811,435, filed Jun. 8, 2007 now U.S. Pat. No. 7,842,967, the entire contents of which are incorporated by reference herein.

BACKGROUND

1. Technical Field

This disclosure relates to a semiconductor device which includes a switching element and a diode element, and is used in a step-up DC-DC converter, and a step-up DC-DC converter including the semiconductor device.

2. Description of the Related Art

Portable electronic devices, as typified by cellular phones, are applied to various fields at an explosive pace, and have been widely accepted. The portable device is driven by batteries. When a voltage higher than the output voltage of the batteries is required by the portable device, it is necessary to use a step-up transformer circuit. Usually, the step-up transformer circuit can be formed by a step-up DC-DC converter. For example, Japanese Laid-Open Patent Application No. 9-84333 (hereinafter referred to as "reference 1") and Japanese Laid-Open Patent Application No. 2001-154627 (hereinafter referred to as "reference 2") disclose step-up DC-DC converters.

FIG. 32 is a circuit diagram illustrating an example of the step-up DC-DC converter.

The step-up DC-DC converter shown in FIG. 32 includes an inductor (coil) 201, a diode element 203, a switching element 205, and a capacitor 207. An end of the coil 201 is connected to a DC (direct current) power supply 209, and another end of the coil 201 is connected to an anode of the diode element 203. One end of the switching element 205 is connected to a connection point A between the coil 201 and the diode element 203, and the other end of the switching element 205 is connected to ground (GND). One end of the capacitor 207 is connected to a cathode of the diode element 203, and the other end of the capacitor 207 is connected to a ground (GND). The cathode of the diode element 203 is connected to an output terminal B.

When the switching element 205 is turned ON, an electrical current flows through the DC power supply 209, the coil 201, the switching element 205, and to ground (GND). For example, if the resistance of the switching element 205 is 0Ω (ohm), the voltage at the connection point A is 0 V, a reverse bias is applied on the diode element 203, and the voltage induced on the capacitor 207 is output.

When the switching element 205 is turned OFF, a back electromotive force occurs on the two ends of the coil 201, and a voltage higher than an input voltage is induced at the connection point A. At this moment, a forward bias is applied on the diode element 203 and a current flows through the DC power supply 209, the coil 201, the diode element 203, and the output terminal B.

By switching ON and switching OFF the switching element 205 of the step-up DC-DC converter repeatedly, an output voltage higher than the input voltage can be extracted from the step-up DC-DC converter.

Generally, as disclosed in reference 2, the switching element 205 may be a MOS transistor, the diode element 203 may be an external part, and for example, may be a semiconductor device having a built-in Schottky diode.

In the step-up DC-DC converter as shown in FIG. 32, when the switching element 205 is switched ON, the voltage at the connection point A is basically 0 V, and the voltage at the output terminal B is at a high level. However, this may cause reverse bias leakage in the diode element 203. Especially, when the diode element 203 is formed of a Schottky diode, in which a metallic element is connected to a semiconductor layer, a reverse voltage leakage current may become large.

In addition, since the back electromotive force on the coil 201 is proportional to a current change per unit time, it is required that the switching element 205 be capable of high speed switching.

Further, when the switching element 205 is switched OFF, the voltage at the connection point A and the output terminal B is at a high level, and a high voltage reverse bias is applied on the drain of the switching element 205, which is formed from a MOS transistor. Due to this, when junction leakage and off leakage (off state source-to-drain leakage) occur, the voltage at the connection point A may decrease gradually.

The above problems may reduce conversion efficiency of the DC-DC converter.

SUMMARY

In a preferred embodiment of this disclosure, there is provide a semiconductor device used in a step-up DC-DC converter including a switching element and a diode element in the same semiconductor substrate and having high conversion efficiency, and a step-up DC-DC converter including the semiconductor device.

According to a first aspect of this disclosure, there is provided a semiconductor device used in a step-up DC-DC converter, comprising:

a switching element;

a diode element formed in the same semiconductor substrate as the switching element;

a switching terminal; and an output terminal, wherein the switching element includes a LDMOS transistor having a channel region formed of a surface portion of a channel diffusion layer below a gate electrode of the LDMOS, said LDMOS transistor comprising:

a source diffusion layer, a channel diffusion layer that has a conductivity opposite to a conductivity of the source diffusion layer, and is formed to enclose a side surface and a bottom surface of the source diffusion layer, and a drain diffusion layer that has a conductivity the same as the conductivity of the source diffusion layer, and is formed outside and neighboring the channel diffusion layer, the diode element includes a vertical bipolar transistor comprising:

a collector diffusion layer that forms a collector of the diode element, a base diffusion layer that has a conductivity opposite to a conductivity of the collector diffusion layer, and forms a base of the diode element in the collector diffusion layer, said base being connected to the collector, and an emitter diffusion layer that has a conductivity the same as the conductivity of the collector diffusion layer, and forms an emitter of the diode element in the base diffusion layer, a diode being produced between the base and the emitter, wherein a drain of the switching element and an anode of the diode element are connected to the switching terminal, and a cathode of the diode element is connected to the output terminal.

For details of the LDMOS, for example, reference can be made to Japanese Laid-Open Patent Application No. 2001-68561 (hereinafter referred to as "reference 3") and Japanese Laid-Open Patent Application No. 2003-86790 (hereinafter referred to as "reference 4").

As an embodiment, the diode element may have a base contact diffusion layer that has a conductivity the same as the conductivity of the base diffusion layer, and is formed in the base diffusion layer, and the base contact diffusion layer is separated from the emitter diffusion layer at a an interval and is formed to enclose the emitter diffusion layer.

More preferably, the semiconductor device further comprises:

a collector contact diffusion layer that has a conductivity the same as the conductivity of the collector diffusion layer, and is formed in the collector diffusion layer, a portion of the base contact diffusion layer arranged between the emitter diffusion layer and the collector contact diffusion layer is formed to be adjacent to the collector contact diffusion layer.

As an embodiment, in the semiconductor device, the diode element comprises:

a collector contact diffusion layer that has a conductivity the same as the conductivity of the collector diffusion layer, and is formed on a surface of the collector diffusion layer;

a field oxide film that is formed from a LOCOS oxide film deposited on a surface of a portion of the base diffusion layer between the emitter diffusion layer and the collector contact diffusion layer; and a second base diffusion layer that is disposed on a portion of the base diffusion layer below the field oxide film, wherein an impurity concentration of the second base diffusion layer is higher than an impurity concentration of the base diffusion layer.

As an alternative embodiment, in the semiconductor device, the diode element comprises:

a collector contact diffusion layer that has a conductivity the same as the conductivity of the collector diffusion layer, and is formed on a surface of the collector diffusion layer; and a field oxide film that is formed from a LOCOS oxide film deposited on a surface of a portion of the base diffusion layer between the emitter diffusion layer and the collector contact diffusion layer, wherein a part of the surface of the portion of the base diffusion layer between the emitter diffusion layer and the collector contact diffusion layer is not covered with the field oxide film.

As an embodiment, the drain diffusion layer and the collector diffusion layer have the same impurity concentration distribution.

According to a second aspect of this disclosure, there is provided a step-up DC-DC converter, comprising:

a semiconductor device;

a coil; and a capacitor, wherein the semiconductor device includes a switching element;

a diode element formed in the same semiconductor substrate as the switching element;

a switching terminal in connection to a coil; and an output terminal in connection to one end of a capacitor, wherein the switching element includes a LDMOS transistor having a channel region formed from a surface portion of a channel diffusion layer below a gate electrode of the LDMOS, said LDMOS transistor comprising:

a source diffusion layer, a channel diffusion layer that has a conductivity opposite to a conductivity of the source diffusion layer, and is formed to enclose a side surface and a bottom surface of the source diffusion layer, and a drain diffusion layer that has a conductivity the same as the conductivity of the source diffusion layer, and is formed outside and neighboring the channel diffusion layer, the diode element includes a vertical bipolar transistor comprising:

a collector diffusion layer that forms a collector of the diode element, a base diffusion layer that has a conductivity opposite to a conductivity of the collector diffusion layer, and forms a base of the diode element in the collector diffusion layer, said base being connected to the collector, and an emitter diffusion layer that has a conductivity the same as the conductivity of the collector diffusion layer, and forms an emitter of the diode element in the base diffusion layer, a diode being produced between the base and the emitter, wherein a drain of the switching element and an anode of the diode element are connected to the switching terminal, a cathode of the diode element is connected to the output terminal, one end of the coil is connected to the switching terminal, and one end of the capacitor is connected to the output terminal.

In the aforementioned semiconductor device and step-up DC-DC converter, the switching element includes the LDMOS, and the diode element includes a PN junction diode.

In the aforementioned step-up DC-DC converter, the step-up DC-DC converter includes a semiconductor device, a coil, and a capacitor, and one end of the coil is connected to the switching terminal of the semiconductor device, and one end of the capacitor is connected to the output terminal of the semiconductor device.

Since the switching element includes the LDMOS, it is possible to reduce the leakage current when a high reverse bias is applied on the drain of the switching element.

Further, since the diode element includes a PN junction diode, it is possible to reduce the reverse voltage leakage current compared to the case when a Schottky diode is used.

As a result, it is possible to improve the conversion efficiency of the step-up DC-DC converter.

In the aforementioned semiconductor device, the diode element may have a base contact diffusion layer that has a conductivity the same as the conductivity of the base diffusion layer, and is formed in the base diffusion layer, and the base contact diffusion layer is separated from the emitter diffusion layer at an interval and is formed to enclose the emitter diffusion layer. Therefore, it is possible to reduce the reverse bias leakage current compared to the case when a frame-like base contact diffusion layer is absent, and it is possible to improve the conversion efficiency of the step-up DC-DC converter.

In addition, the semiconductor device can further comprise a collector contact diffusion layer that has a conductivity the same as the conductivity of the collector diffusion layer, and is formed in the collector diffusion layer, and a portion of the base contact diffusion layer arranged between the emitter diffusion layer and the collector contact diffusion layer is formed to be adjacent to the collector contact diffusion layer.

When the portion of the base contact diffusion layer is separated from the collector contact diffusion layer by an interval, it is necessary to use a mask (for example, a photo resist) for ion implantation when forming the interval, or to form a field oxide film on the outer surface of the base diffusion layer, for example, a p-type well diffusion layer. Due to usage of the ion implantation mask, the region for forming the base diffusion layer has to be enlarged accordingly.

In contrast, when the portion of the base contact diffusion layer is adjacent to the collector contact diffusion layer, it is not necessary to use the ion implantation mask.

Therefore, compared to the case in which the portion of the base contact diffusion layer is separated from the collector contact diffusion layer by an interval, when the portion of the base contact diffusion layer is adjacent to the collector contact diffusion layer, the region for forming the base diffusion layer can become small; thus, it is possible to reduce the size of the diode element, and this makes layout of the device easy.

In addition, in the aforementioned semiconductor device, the diode element may have a collector contact diffusion layer having the same conductivity as the collector diffusion layer, and formed on a surface of the collector diffusion layer; a field oxide film which is formed from a LOCOS oxide film deposited on a surface of a portion of the base diffusion layer between the emitter diffusion layer and the collector contact diffusion layer; and a second base diffusion layer disposed on a portion of the base diffusion layer below the field oxide film, and the second base diffusion layer having an impurity concentration higher than that of the base diffusion layer.

Therefore, it is possible to reduce the reverse bias leakage current compared to the case when the second base diffusion layer is absent, and hence it is possible to further improve the conversion efficiency of the step-up DC-DC converter. This configuration is particularly effective in a structure in which the base diffusion layer is formed from a p-type diffusion layer, and the p-type impurities below the field oxide film are sucked out by the field oxide film.

In addition, in the aforementioned semiconductor device, the diode element may have a collector contact diffusion layer having the same conductivity as that of the collector diffusion layer and formed on a surface of the collector diffusion layer; and a field oxide film which is formed from a LOCOS oxide film deposited on a surface of a portion of the base diffusion layer disposed between the emitter diffusion layer and the collector contact diffusion layer, and a part of the surface of the portion of the base diffusion layer between the emitter diffusion layer and the collector contact diffusion layer is not covered with the field oxide film.

Therefore, it is possible to reduce the reverse bias leakage current compared to the case when the surface of the base diffusion layer between the emitter diffusion layer and the collector contact diffusion layer is totally covered with the field oxide film, and hence it is possible to further improve the conversion efficiency of the step-up DC-DC converter. This configuration is particularly effective in a structure in which the base diffusion layer is formed from a p-type diffusion layer, and the p-type impurities below the field oxide film are sucked out by the field oxide film.

In addition, the drain diffusion layer and the collector diffusion layer can have the same impurity concentration distribution. Due to this, the drain diffusion layer and the collector diffusion layer can be formed in the same impurity implantation step; this simplifies the fabrication process compared to the case in which the drain diffusion layer and the collector diffusion layer are formed in different steps.

The aforementioned aspects, features, and advantages will become more apparent from the following detailed description of preferred embodiments given with reference to the accompanying drawings

BRIEF DESCRIPTION OF THE DRAWINGS

FIG. 6 is a timing chart illustrating operations of the step-up DC-DC converter as shown in FIG. 5;

FIG. 7A through FIG. 7C are cross-sectional views illustrating part of a method of producing the semiconductor device of the present embodiment as shown in FIG. 4;

FIG. 8A through FIG. 8C, continuing from FIG. 7C, are cross-sectional views illustrating part of the method of producing the semiconductor device of the present embodiment as shown in FIG. 4;

FIG. 9A through FIG. 9C, continuing from FIG. 8C, are cross-sectional views illustrating part of the method of producing the semiconductor device of the present embodiment as shown in FIG. 4;

FIG. 10A through FIG. 10C, continuing from FIG. 9C, are cross-sectional views illustrating part of the method of producing the semiconductor device of the present embodiment as shown in FIG. 4;

FIG. 16A through FIG. 16C, continuing from FIG. 15C, are cross-sectional views illustrating part of the method of producing the semiconductor device of the present embodiment as shown in FIG. 4;

FIG. 22B is a cross-sectional view of the diode element at a position X-X as indicated in FIG. 22A;

FIG. 22C is a cross-sectional view of the diode element at a position Y-Y as indicated in FIG. 22A;

DESCRIPTION OF THE PREFERRED EMBODIMENTS

Below, preferred embodiments of the present invention are explained with reference to the accompanying drawings.

First Embodiment

Figure 1:
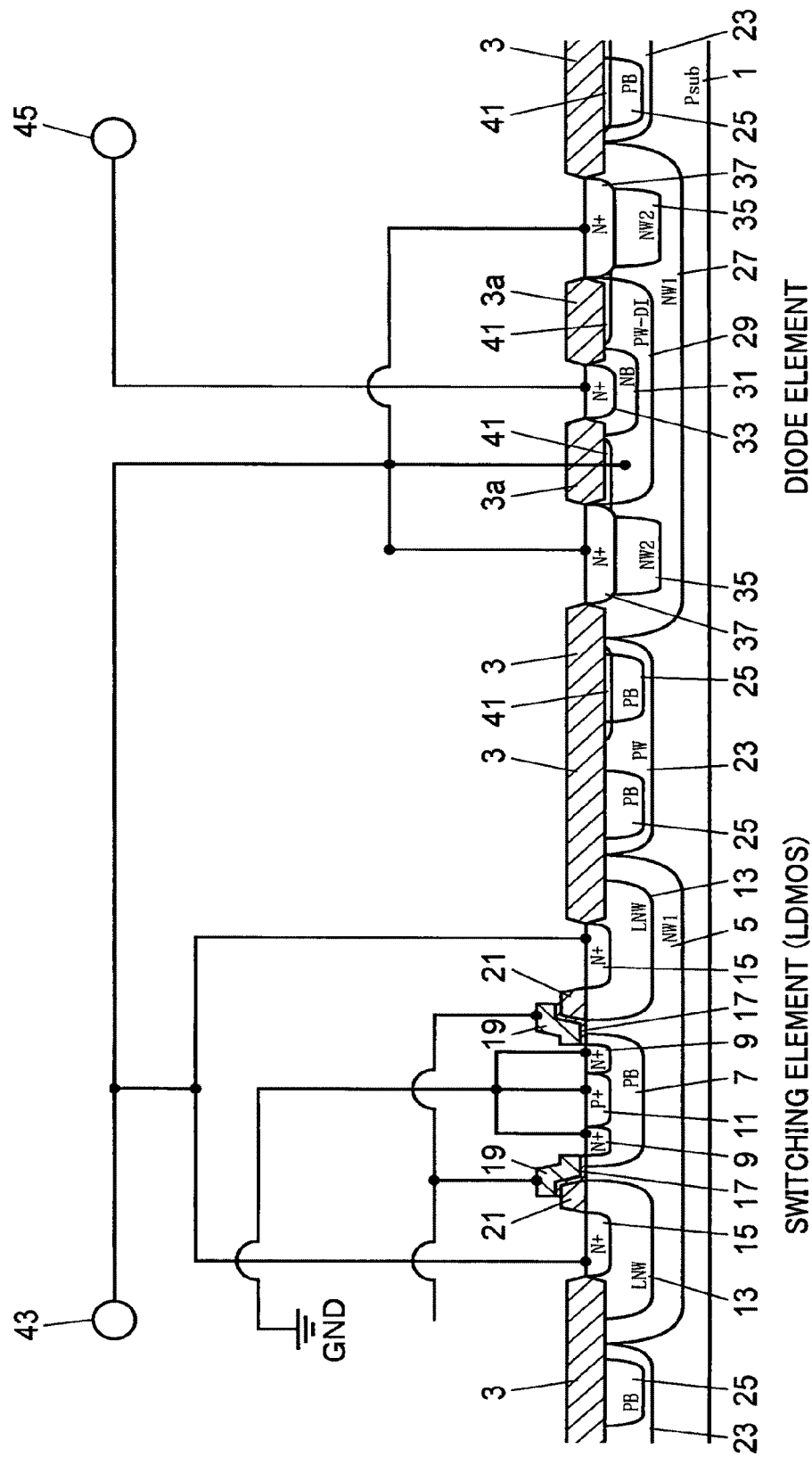
FIG. 1 is a cross-sectional view illustrating a switching element and a diode element according to a first embodiment of the present invention.

FIG. 1 is a cross-sectional view illustrating a switching element and a diode element according to a first embodiment of the present invention.

As shown in FIG. 1, the semiconductor device of the present embodiment mainly includes a switching element, for example, a LDMOS (Laterally Diffused Metal Oxide Semiconductor), and a diode element.

Next, the switching element of the present embodiment is explained with reference to FIG. 2A through FIG. 2C.

Figure 2A:
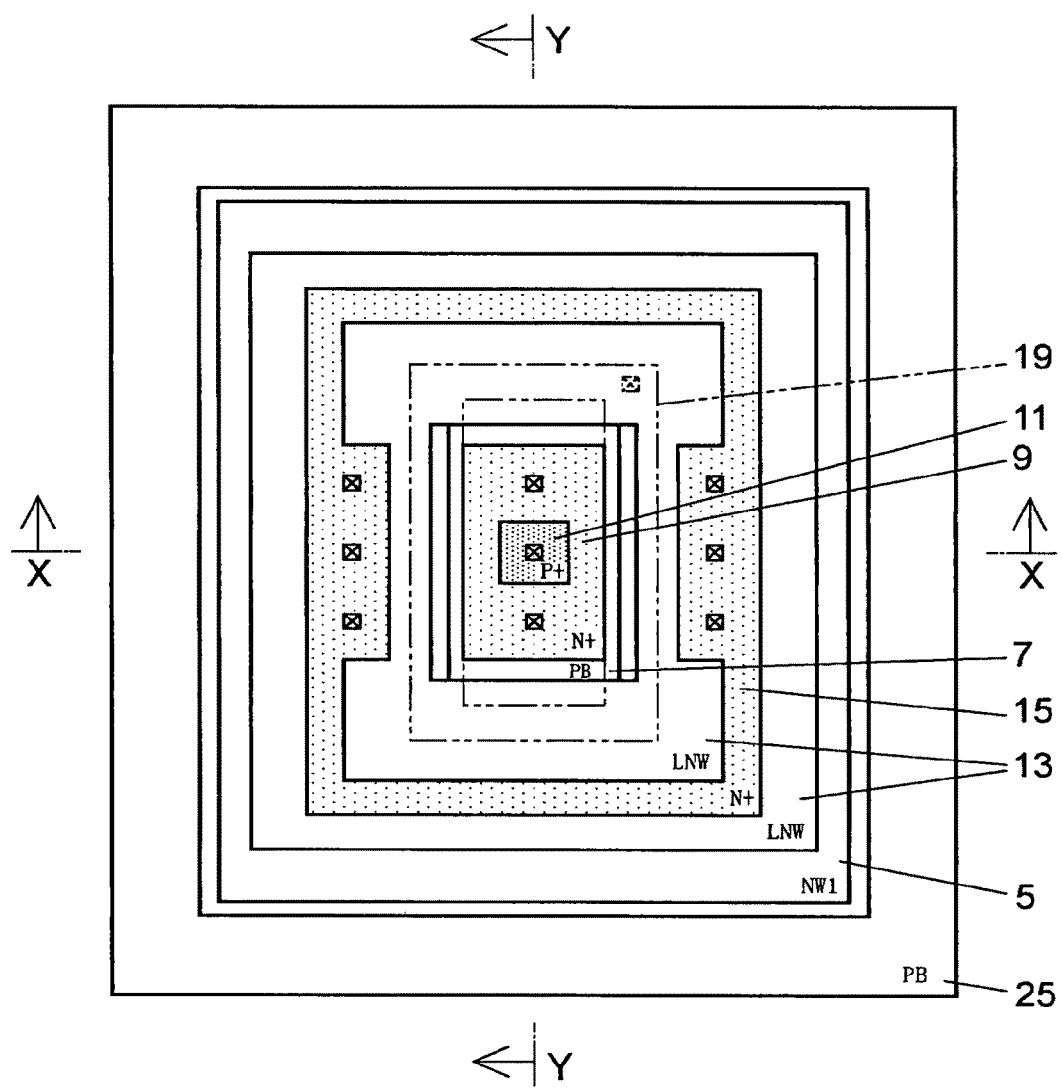
FIG. 2A is a plan view of the switching element shown in FIG. 1.
Figure 2B:
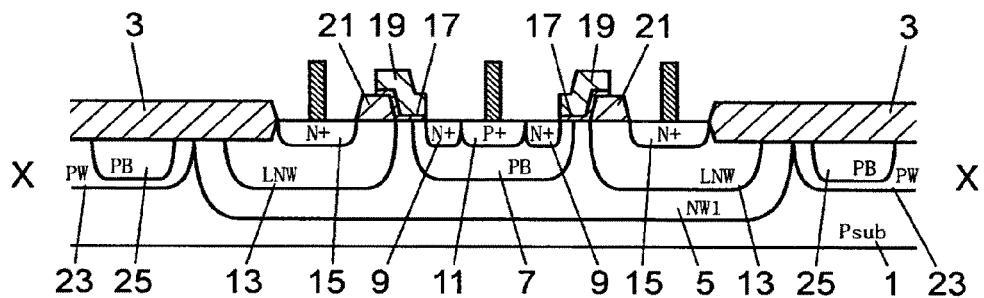
FIG. 2B is a cross-sectional view of the switching element at a position X-X as indicated in FIG. 2A.
Figure 2C:
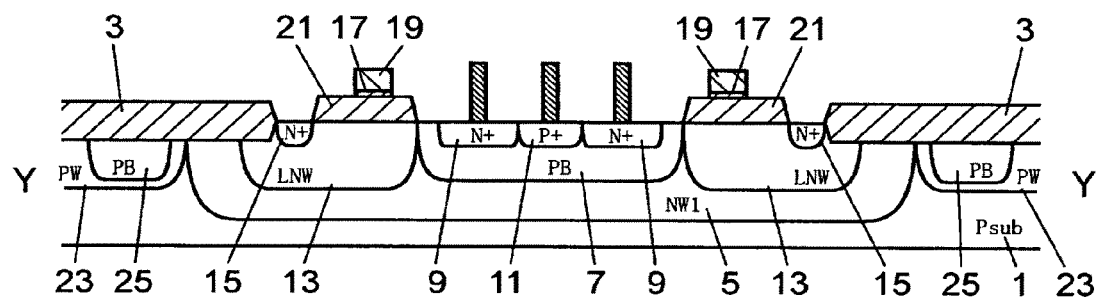
FIG. 2C is a cross-sectional view of the switching element at a position Y-Y as indicated in FIG. 2A.

FIG. 2A is a plan view of the switching element shown in FIG. 1,

FIG. 2B is a cross-sectional view of the switching element at a position X-X as indicated in FIG. 2A, FIG. 2C is a cross-sectional view of the switching element at a position Y-Y as indicated in FIG. 2A.

Here, the structure shown in FIG. 2B (and the structure shown in FIG. 3B, as described below) correspond to the structure shown in FIG. 1.

As shown in FIG. 2A through FIG. 2C, in the present embodiment, the switching element is formed of an n-channel LDMOS.

Here, illustration of a field oxide film for element separation and an oxide film for electric field relaxation is omitted in FIG. 2A. For example, a field oxide film 3 may be formed in a p-type semiconductor substrate (Psub) 1, which has a specific resistance of about 20 Ωcm, by means of LOCOS (Local Oxidation of Silicon).

As shown in FIG. 2A through FIG. 2C, an n-type well diffusion layer 5 (indicated as NW1 in FIG. 2A through FIG. 2C and corresponding to a drain diffusion layer of the LDMOS) is formed in a portion of a semiconductor substrate 1 in the LDMOS region, a p-type body diffusion layer 7 (indicated as PB in FIG. 2A through FIG. 2C and corresponding to a channel diffusion layer of the LDMOS) is formed in the n-type well diffusion layer 5, and an n-type source diffusion layer 9 (indicated as N+ in FIG. 2A through FIG. 2C) and a p-type high concentration diffusion layer 11 (indicated as P+ in FIG. 2A through FIG. 2C) are formed in the p-type body diffusion layer 7. The p-type high concentration diffusion layer 11 extracts the potential of the p-type body diffusion layer 7. The n-type source diffusion layer 9 is at an interval from the periphery of the p-type body diffusion layer 7, and is formed to be a frame to enclose the p-type high concentration diffusion layer 11.

A lightly doped n-type well diffusion layer 13 (indicated as LNW in FIG. 2A through FIG. 2C), which has an n-type impurity concentration higher than that of the n-type well diffusion layer 5, is formed in the n-type well diffusion layer 5. The lightly doped n-type well diffusion layer (LNW) 13 is formed to be a frame to enclose the p-type body diffusion layer 7.

An n-type high concentration diffusion layer 15 (indicated as N+ in FIG. 2A through FIG. 2C) is formed in the lightly doped n-type well diffusion layer (LNW) 13 at an interval from the p-type body diffusion layer 7.

The n-type well diffusion layer 5, the lightly n-type well diffusion layer (LNW) 13, and the n-type high concentration diffusion layer (N+) 15 form the drain of the LDMOS.

As shown in FIG. 2B, a gate oxide film 17 is formed over the n-type well diffusion layer 5 between the n-type source diffusion layer 9, the n-type high concentration diffusion layer (N+) 15, and the p-type body diffusion layer 7; a poly-silicon gate electrode 19 is formed on the gate oxide film 17. The surface of the p-type body diffusion layer 7, which is below the poly-silicon gate electrode 19, constitutes a channel region of the LDMOS. An electric field relaxation oxide film 21 is formed on the lightly n-type well diffusion layer (LNW) 13. The gate electrode 19 is formed to expand on the gate oxide film 17 up to an electric field relaxation oxide film 21.

A side surface of the gate electrode 19 on the side of the electric field relaxation oxide film 21 is arranged on the electric field relaxation oxide film 21 at an interval from an end of the electric field relaxation oxide film 21 on the side of the n-type high concentration diffusion layer (N+) 15. The electric field relaxation oxide film 21 is separately formed relative to the field oxide film 3, and is thicker than the gate oxide film 17. The cross-sectional shape of the electric field relaxation oxide film 21 in a thickness direction is approximately a trapezoid. But the shape of the electric field relaxation oxide film 21 is not limited to a trapezoid. For example, the field oxide film 3 may be used as the electric field relaxation oxide film 21.

A p-type well diffusion layer 23 is formed in the semiconductor substrate 1 surrounding the n-type well diffusion layer 5; a p-type body diffusion layer 25 is formed in the p-type well diffusion layer 23 to enclose the region where the n-type well diffusion layer 5 is formed.

The p-type well diffusion layer 23 and the p-type body diffusion layer 25 electrically isolate the LDMOS from other elements. The field oxide film 3 covers the surfaces of the p-type well diffusion layer 23 and the p-type body diffusion layer 25.

Next, the diode element of the present embodiment is explained with reference to FIG. 3A through FIG. 3C.

Figure 3A:
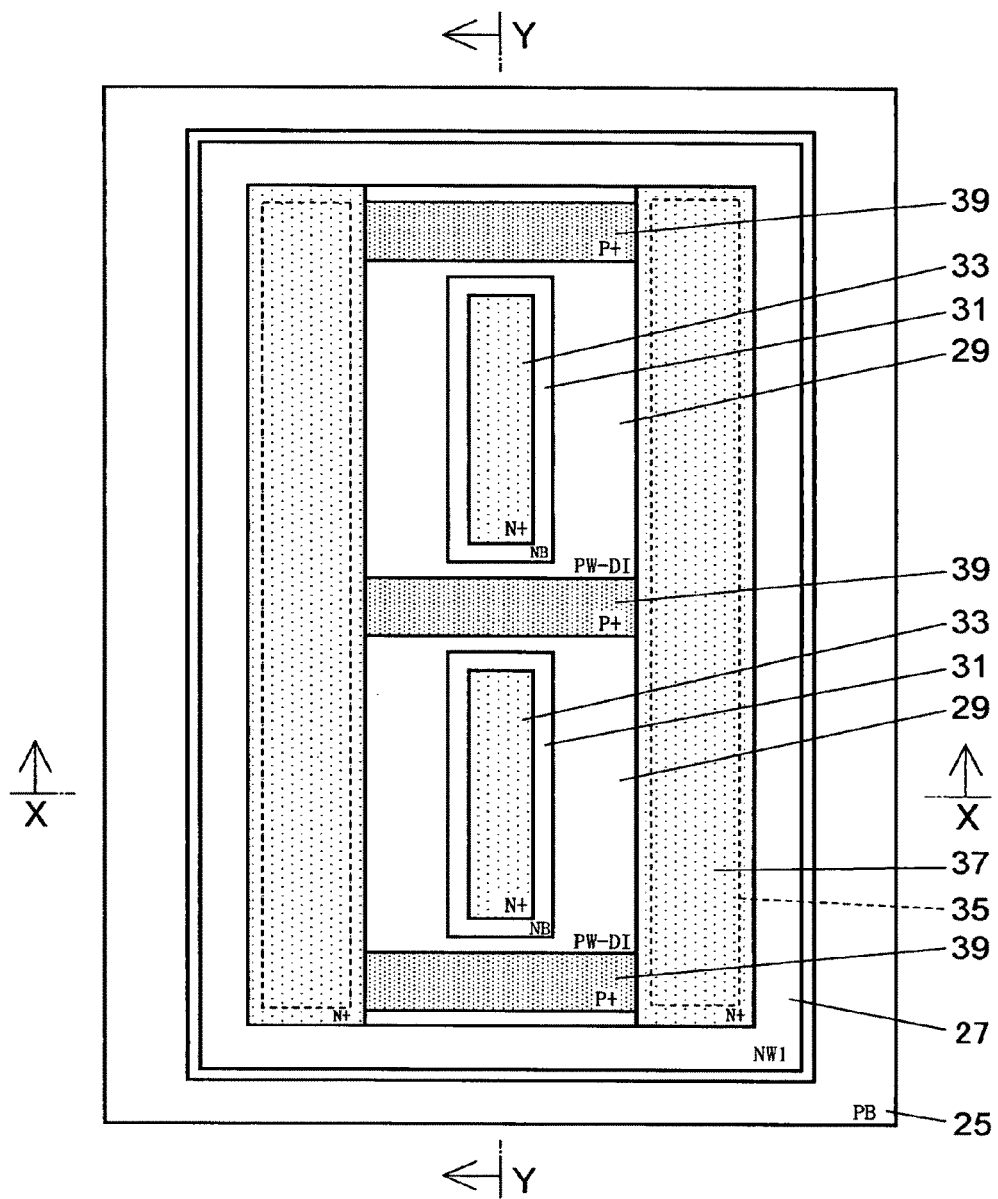
FIG. 3A is a plan view of the diode element shown in FIG. 1.
Figure 3B:
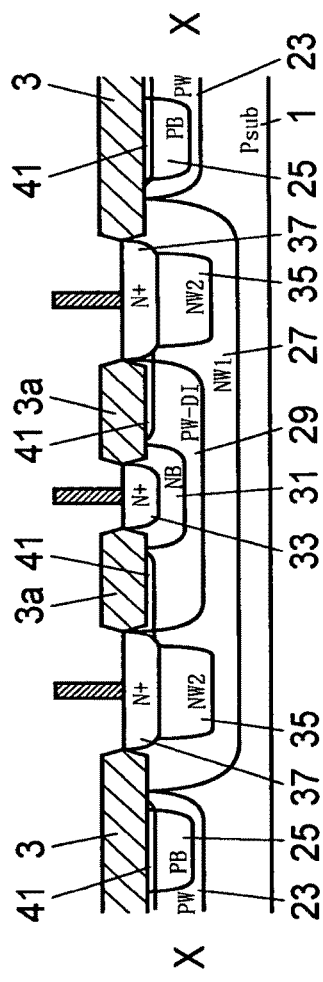
FIG. 3B is a cross-sectional view of the diode element at the position X-X as indicated in FIG. 3A.
Figure 3C:
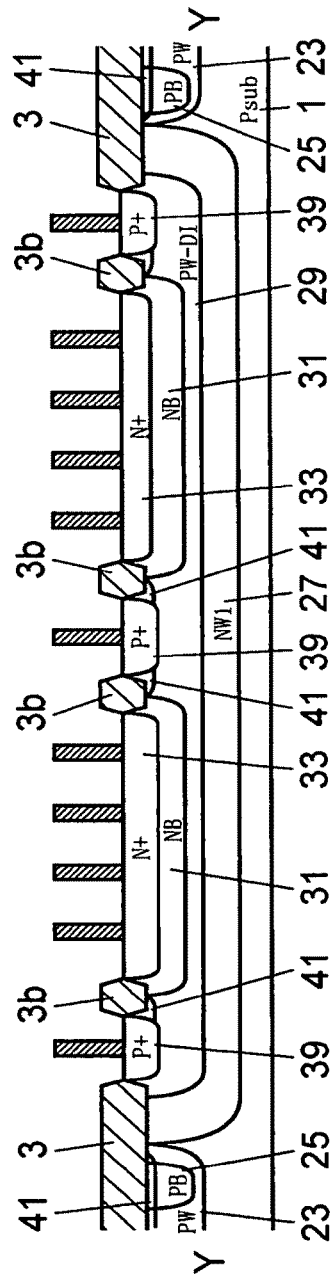
FIG. 3C is a cross-sectional view of the switching element at the position Y-Y as indicated in FIG. 3A.

FIG. 3A is a plan view of the diode element shown in FIG. 1,

FIG. 3B is a cross-sectional view of the diode element at the position X-X as indicated in FIG. 3A, the same as that in FIG. 2A, FIG. 3C is a cross-sectional view of the switching element at the position Y-Y as indicated in FIG. 3A, the same as that in FIG. 2A.

Here, the structure shown in FIG. 3B (and the structure shown in FIG. 2B, as described above) correspond to the structure shown in FIG. 1.

As shown in FIG. 3A through FIG. 3C, the diode element of the present embodiment has a vertical bipolar transistor structure, in which a PN diode is produced between a base and an emitter, and the base is connected to a collector to shield the PN diode from the p-type semiconductor substrate Psub.

It should be noted that illustration of a field oxide film is omitted in FIG. 3A.

An n-type well diffusion layer 27 (indicated as NW1 in FIG. 3A through FIG. 3C and corresponding to a collector diffusion layer of the diode element) is formed in a portion of the semiconductor substrate 1 in the diode element region enclosed by the field oxide film 3. A p-type well diffusion layer 29 (indicated as PW-DI in FIG. 3A through FIG. 3C, and corresponding to a base diffusion layer of the diode element) is formed in the n-type well diffusion layer 27. An n-type body diffusion layer 31 (indicated as NB in FIG. 3A through FIG. 3C and corresponding to an emitter diffusion layer of the diode element) is formed in the p-type well diffusion layer 29.

An n-type high concentration diffusion layer 33 (indicated as N+ in FIG. 3A through FIG. 3C), which has an n-type impurity concentration higher than that of the n-type body diffusion layer 31, is formed in the n-type body diffusion layer 31.

In the present embodiment, the planar shapes of the n-type body diffusion layer 31 and the n-type high concentration diffusion layer (N+) 33 are rectangles.

As shown in FIG. 3A, in the p-type well diffusion layer 29, there are two groups of the n-type body diffusion layer 31 and the n-type high concentration diffusion layer 33; the two groups of the n-type body diffusion layer 31 and the n-type high concentration diffusion layer 33 are arranged to be on the same straight line in the longitudinal direction of the p-type well diffusion layer 29, but are separated from each other by an interval.

The planar shape of the p-type well diffusion layer 29 is also a rectangle, and has the same longitudinal direction as those of the n-type body diffusion layer 31 and the n-type high concentration diffusion layer 33 (indicated as N+ in FIG. 3A through FIG. 3C).

In the n-type well diffusion layer 27, an n-type well diffusion layer (indicated as NW2 in FIG. 3A through FIG. 3C) 35 is formed along the longitudinal direction of the p-type well diffusion layer 29 at an interval from the p-type well diffusion layer 29. The n-type well diffusion layer (NW2) 35 has an n-type impurity concentration higher than that of the n-type well diffusion layer 27.

An n-type high concentration diffusion layer (indicated as N+ in FIG. 3A through FIG. 3C and corresponding to a collector contact diffusion layer of the diode element) is formed on the n-type well diffusion layer (NW2) 35 in the n-type well diffusion layer 27. The n-type high concentration diffusion layer 37 has an n-type impurity concentration higher than that of the n-type well diffusion layer 35.

P-type high concentration diffusion layers 39 (indicated as P+ in FIG. 3A through FIG. 3C and corresponding to the base contact diffusion layers of the diode element) are formed in the p-type well diffusion layer 29 in a direction intersecting the longitudinal direction of the p-type well diffusion layer 29. The p-type high concentration diffusion layers 39 have a p-type impurity concentration higher than that of the p-type well diffusion layer 29.

The p-type high concentration diffusion layers 39 are arranged to correspond to the two ends of the longitudinal side of the n-type body diffusion layers 31, and are at intervals from the two ends of the n-type body diffusion layers 31.

The surfaces of the n-type body diffusion layers 31 and the p-type well diffusion layer 29 between the n-type high concentration diffusion layers (N+) 33 and the n-type high concentration diffusion layer 37 are covered with a field oxide film 3a (refer to FIG. 3B). The surfaces of the n-type body diffusion layers 31 and the p-type well diffusion layer 29 between the n-type high concentration diffusion layers (N+) 33 and the p-type high concentration diffusion layers 39 is covered with a field oxide film 3b (refer to FIG. 3C). A p-type field dope layer 41 is formed below the field oxide film 3a and the field oxide film 3b in such a way that the field dope layer 41 does not overlap the n-type body diffusion layer 31.

Similar to the LDMOS region, the p-type well diffusion layer 23 and the p-type body diffusion layer 25 are formed in the semiconductor substrate 1 surrounding the n-type well diffusion layer 27. The field oxide film 3 covers the surfaces of the p-type well diffusion layer 23 and the p-type body diffusion layer 25. The p-type field dope layer 41 is formed below the field oxide film 3 in the p-type well diffusion layer 23 and the p-type body diffusion layer 25 surrounding the diode element.

As shown in FIG. 1, the n-type high concentration diffusion layer (N+) 15 of the LDMOS (drain) is connected to a switching terminal 43, and the p-type well diffusion layer 29 (base) and the n-type high concentration diffusion layer 37 (collector) of the diode element are also connected to the switching terminal 43. The n-type high concentration diffusion layer (N+) 33 (emitter) of the diode element is connected to the output terminal 45.

The n-type source diffusion layer 9 and the p-type high concentration diffusion layer 11 of the LDMOS are connected to ground (GND).

A control signal is input to the gate electrode 19 of the LDMOS.

Figure 4:
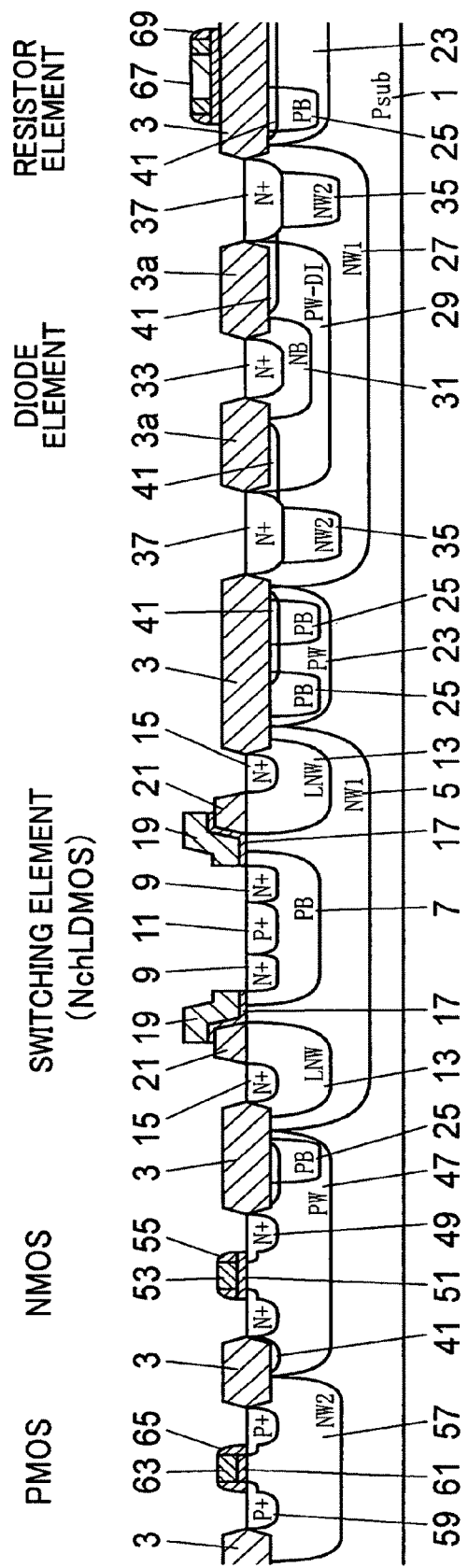
FIG. 4 is a cross-sectional view illustrating a MOS transistor and a resistor, which form a controller in the present embodiment.

FIG. 4 is a cross-sectional view illustrating a MOS transistor and a resistor, which form a controller in the present embodiment.

As shown in FIG. 4, an n-channel MOS transistor (below, referred to as "NMOS") is provided in a region different from the LDMOS region and the diode element region. A p-type well diffusion layer 47 (indicated as PW in FIG. 4) is formed in a portion of the semiconductor substrate 1 in the NMOS region. The NMOS region is separated from other element regions by the field oxide film 3 and the field dope layer 41.

In the present embodiment, for example, the NMOS has a LDD (lightly doped drain) structure, and includes a source-drain diffusion layer 49, which has a LDD (lightly doped drain) structure, a gate oxide film 51, a gate electrode 53, and a sidewall 55. It is certain that the NMOS is not limited to the LDD structure.

A p-channel MOS transistor (below, referred to as "PMOS") is provided in a region different from the LDMOS region, the diode element region, and the NMOS region. An n-type well diffusion layer 57 (indicated as NW2 in FIG. 4) is formed in a portion of the semiconductor substrate 1 in the PMOS region. The PMOS region is separated from other element regions by the field oxide film 3.

In the present embodiment, for example, the PMOS has a LDD (lightly doped drain) structure and includes a source-drain diffusion layer 59 that has a double diffusion structure, a gate oxide film 61, a gate electrode 63, and a sidewall 65. It is certain that the PMOS is not limited to the LDD structure.

In addition, although it is described that there are provided one NMOS transistor and one PMOS transistor, which serve as the MOS transistors of the controller of the present embodiment, the present embodiment is not limited to this. For example, plural types of NMOS and PMOS may be formed, which have different transistor properties. To implement the controller of the present embodiment, any kind of MOS transistors generally used in semiconductor devices can be used.

A resistor element 67 formed of poly-silicon is provided on the field oxide film 3, and a sidewall 69 is formed on the side surface of the resistor element 67.

Figure 5:
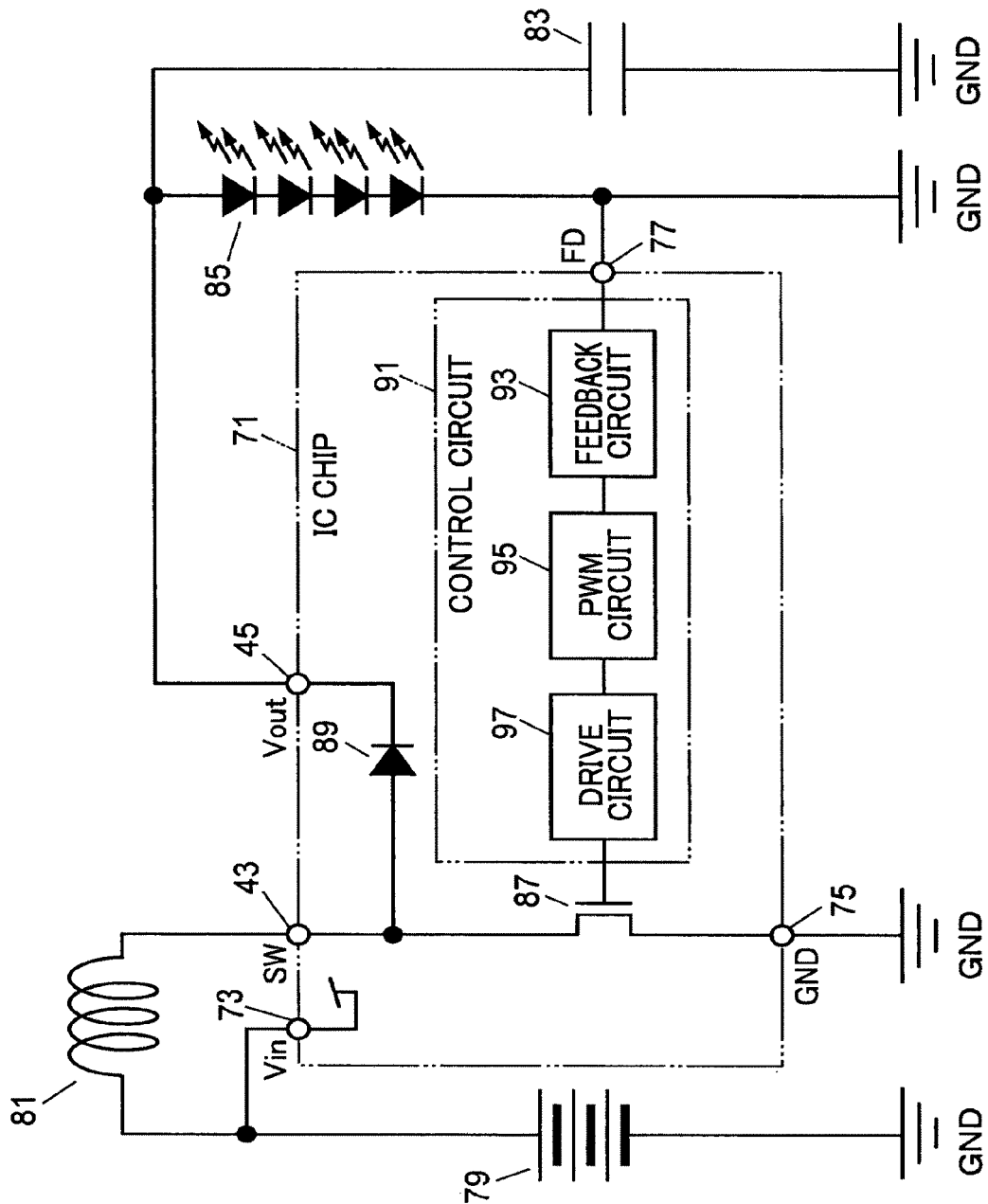
FIG. 5 is a circuit diagram illustrating a step-up DC-DC converter including the semiconductor device of the present embodiment.

FIG. 5 is a circuit diagram illustrating a step-up DC-DC converter including the semiconductor device of the present embodiment.

In this example, it is assumed that the step-up DC-DC converter of the present embodiment is used to light four LEDs (Light Emission Diodes).

The semiconductor device used in the step-up DC-DC converter of the present embodiment is packed as an IC chip 71. As shown in FIG. 5, the step-up DC-DC converter of the present embodiment includes the IC chip 71, the switching terminal (SW) 43, the output terminal (Vout) 45, a power supply terminal (Vin) 73, a ground terminal (GND) 75, and a feedback terminal (FD) 77.

A DC power supply 79 is connected between the power supply terminal (Vin) 73 and the ground terminal (GND) 75, and a coil 81 is connected between the DC power supply 79 and the switching terminal (SW) 43. A capacitor 83 and a cascade LED circuit 85 are connected in parallel between the output terminal (Vout) 45 and the ground terminal (GND) 75.

In the IC chip 71, there are formed a switching element 87, a diode element 89, and a control circuit 91.

The control circuit 91 includes a feedback circuit 93, a PWM (Pulse Width Modulation) circuit 95, and a drive circuit 97.

The switching element 87 includes the n-channel LDMOS as described with reference to FIG. 1 and FIG. 2A through FIG. 2C.

The diode element 89 includes the vertical bipolar diode structure as described with reference to FIG. 1 and FIG. 3A through FIG. 3C.

The control circuit 91 includes the MOS transistor and resistor as described with reference to FIG. 4.

It should be noted that the semiconductor device of the present embodiment is not limited to the above configuration, but can have any structure as long as the switching element, the diode element, the switching terminal, and the output terminal are provided.

The drain of the switching element 87 and the anode of the diode element 89 are connected to the switching terminal 43. The source of the switching element 87 is connected to the ground terminal (GND) 75. The cathode of the diode element 89 is connected to the output terminal (Vout) 45. The feedback terminal (FD) 77 is connected to the feedback circuit 93 of the control circuit 91.

FIG. 6 is a timing chart illustrating operations of the step-up DC-DC converter as shown in FIG. 5.

As shown in FIG. 6, the switching element 87 is repeatedly turned ON and OFF by the control circuit 91. For example, the control circuit 91 controls ON and OFF of the switching element 87 based on a feedback signal from the feedback terminal (FD) 77.

When the switching element 87 is turned ON, a current flows through the DC power supply 79, the coil 81, the switching terminal (SW) 43, the switching element 87, and the ground terminal (GND) 75 in order. In this case, a reverse bias is applied on the diode element 89, and the voltage induced on the capacitor 83 is output to the cascade LED circuit 85.

When the switching element 87 is turned OFF, a back electromotive force occurs on the two ends of the coil 81, and a voltage higher than an input voltage is induced at the switching terminal (SW) 43. In this case, a forward bias is applied on the diode element 89 and a current flows through the DC power supply 79, the coil 81, the switching terminal (SW) 43, the diode element 89, the output terminal 45, and the cascade LED circuit 85.

By switching ON and switching OFF the switching element 87 of the step-up DC-DC converter repeatedly, an output voltage higher than the input voltage can be extracted from the step-up DC-DC converter.

According to the semiconductor device and the step-up DC-DC converter of the present embodiment, since the LDMOS is used as the switching element, and a PN junction diode is used as the diode element, the leakage current can be reduced, and it is possible to improve the conversion efficiency of the step-up DC-DC converter.

Below, a method of producing the semiconductor device as shown in FIG. 4 is described with reference to FIG. 7A through FIG. 18C.

In the following descriptions, unevenness might be formed on a semiconductor substrate surface due to formation and removal of a thermal oxide film, but the unevenness is not expressly illustrated in FIG. 7A through FIG. 18C. In addition, descriptions of some steps, such as RCA cleaning, are omitted.

Figure 7A:
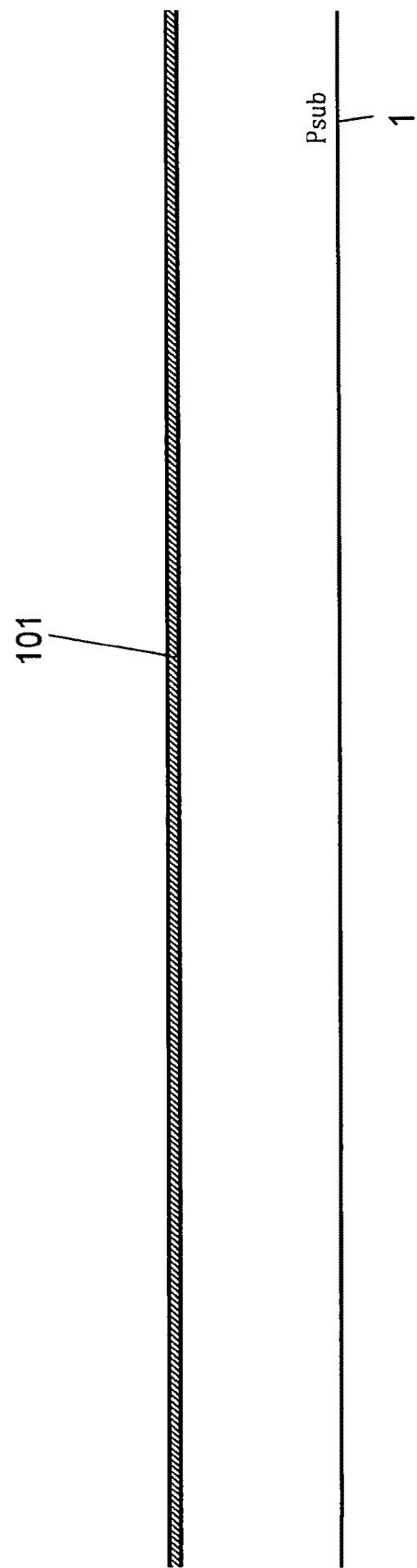
Figure 7B:
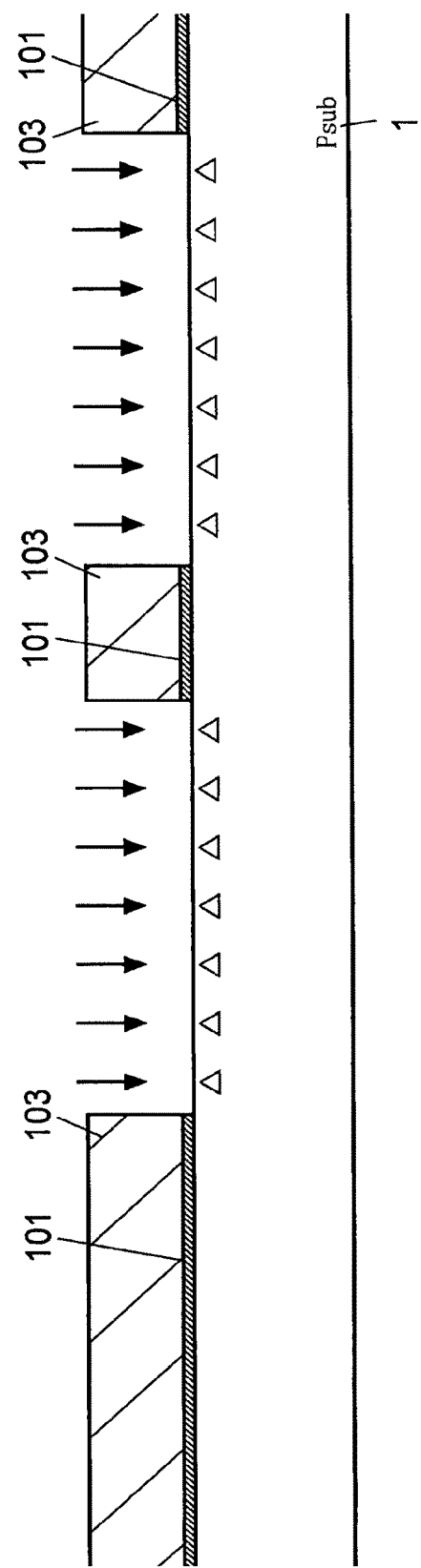

FIG. 7A through FIG. 7C are cross-sectional views illustrating part of a method of producing the semiconductor device of the present embodiment as shown in FIG. 4.

In the step shown in FIG. 7A, a not-illustrated buffer oxide film is deposited on a semiconductor substrate 1 to a thickness of 25 nm (250 angstroms), then a silicon nitride film 101 is deposited on the buffer oxide film to a thickness of 100 nm (1000 angstroms).

In the step shown in FIG. 7B, a photo resist 103 is formed, which has openings respectively corresponding to the LDMOS region and the diode element region.

The silicon nitride film 101 is removed by etching with the photo resist 103 as a mask. Then, with the photo resist 103 as a mask, phosphorus ions (indicated by triangles "Δ" in FIG. 7B), which serve as N-type impurities, are implanted into the semiconductor substrate 1 at an implantation energy of 160 keV and a dose of $3.4 \times 10^{12}$ cm$^{-2}$.

In the step shown in FIG. 7C, the photo resist 103 is removed. Then, thermal processing is performed on the semiconductor substrate 1 at a temperature of 1180° C. for 14.5 hours to form the n-type well diffusion layer 5 in the LDMOS region, and form the n-type well diffusion layer 27 in the diode element region. In this step, a silicon oxide film is formed on surfaces of the LDMOS region and the diode element region.

In this way, the n-type well diffusion layer 5 (corresponding to the drain diffusion layer of the LDMOS) and the n-type well diffusion layer 27 (corresponding to the collector diffusion layer of the diode element) are formed at the same time; hence, the n-type well diffusion layer 5 and the n-type well diffusion layer 27 have the same impurity concentration.

Figure 8A:
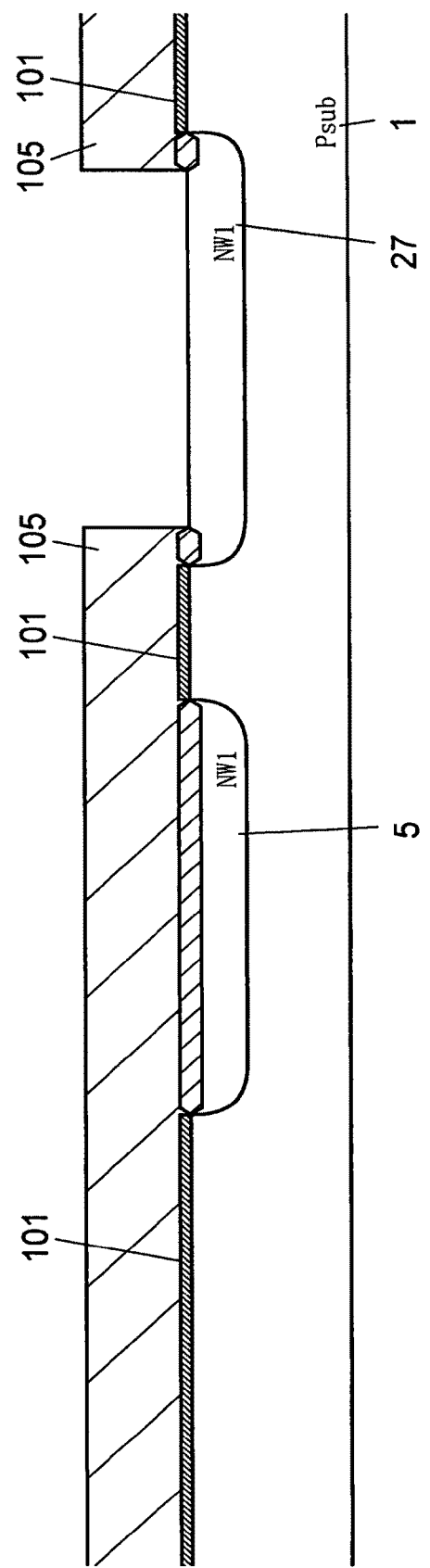
Figure 8C:
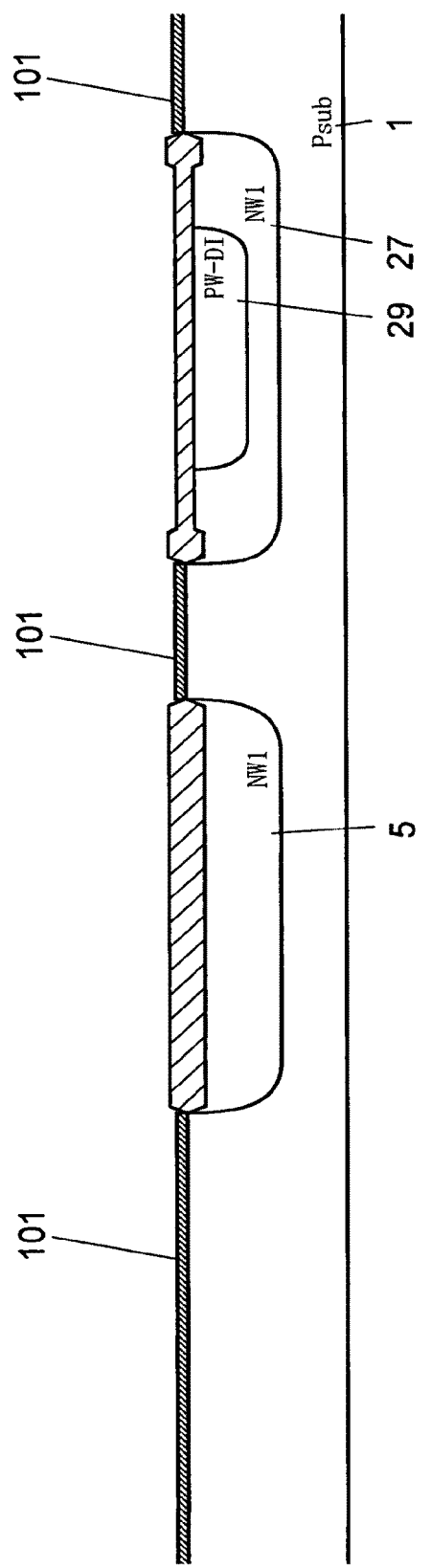

FIG. 8A through FIG. 8C, continuing from FIG. 7C, are cross-sectional views illustrating part of the method of producing the semiconductor device of the present embodiment as shown in FIG. 4.

In the step shown in FIG. 8A, a photo resist 105 is formed, which has an opening corresponding to the diode element region. With the photo resist 105 as a mask, a silicon oxide film, which is formed on the surface of the n-type well diffusion layer 27 in the diode element region, is removed.

In the step shown in FIG. 8B, the photo resist 105 is removed. Then, thermal oxidation processing is performed on the semiconductor substrate 1 to form a buffer oxide layer (not illustrated) on the surface of the n-type well diffusion layer 27.

A photo resist 107 is formed, which has an opening corresponding to the p-type well diffusion layer 29 in the diode element region (refer to FIG. 3A through FIG. 3C). With the photo resist 107 as a mask, boron ions (indicated by crosses "X" in FIG. 8B), which serve as P-type impurities, are implanted into the semiconductor substrate 1 at an implantation energy of 30 keV and a dose of $1.5 \times 10^{13}$ cm$^{-2}$.

In the step shown in FIG. 8C, the photo resist 107 is removed. Then, thermal oxidation processing is performed on the semiconductor substrate 1 at a temperature of 1150° C. for 3.5 hours to form the p-type well diffusion layer 29 in the n-type well diffusion layer 27.

Figure 9A:
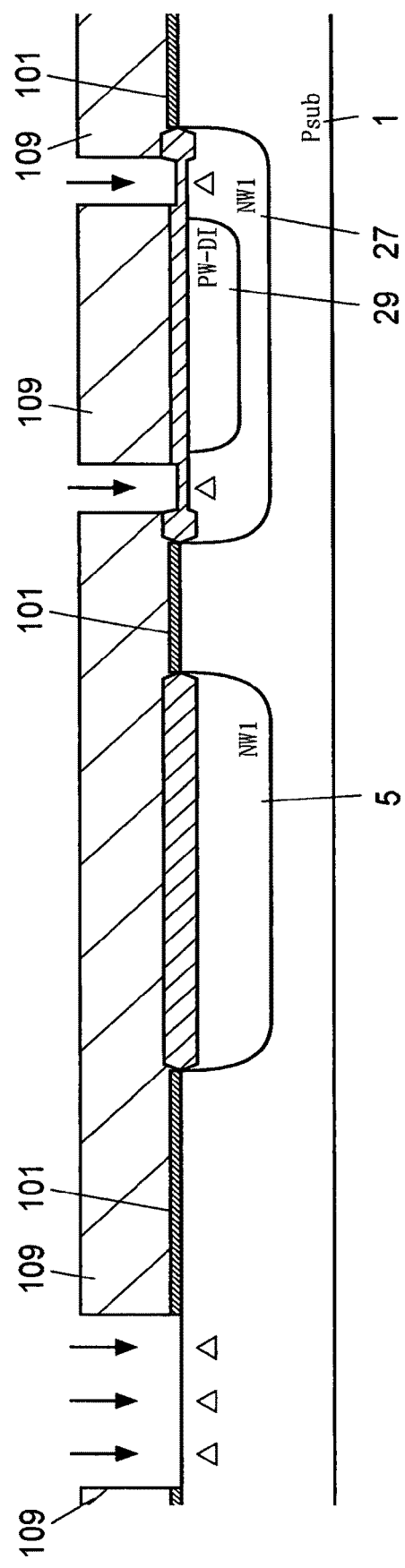
Figure 9B:
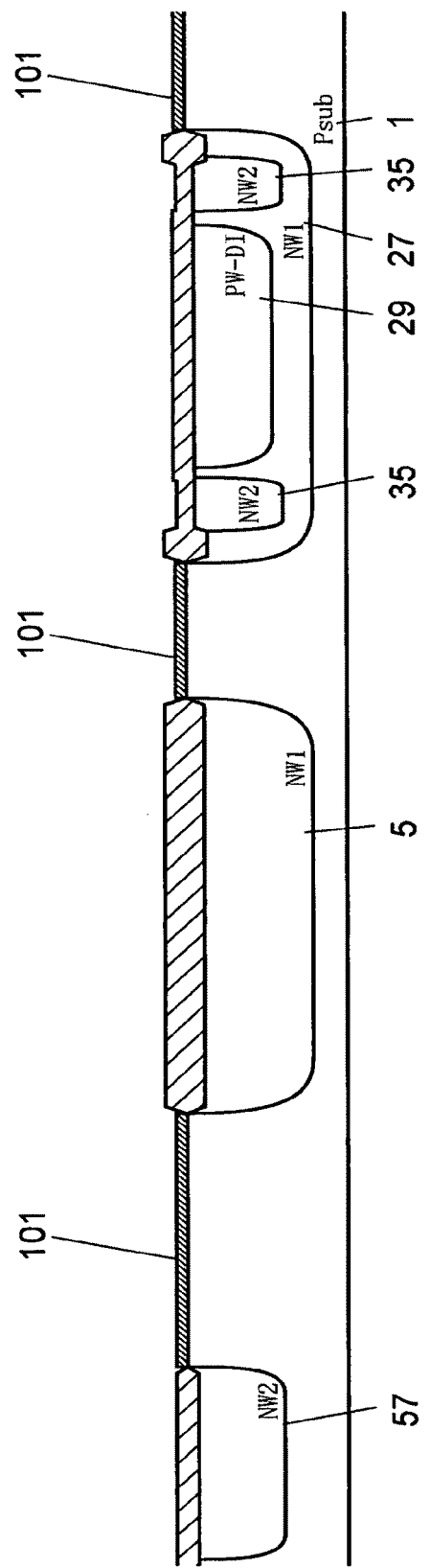

FIG. 9A through FIG. 9C, continuing from FIG. 8C, are cross-sectional views illustrating part of the method of producing the semiconductor device of the present embodiment as shown in FIG. 4.

In the step shown in FIG. 9A, a photo resist 109 is formed, which has an opening corresponding to the PMOS region and the n-type well diffusion layer 35 in the diode element region (refer to FIG. 3A through FIG. 3C). With the photo resist 109 as a mask, the silicon nitride film 101 is removed by etching. In this step, a part of a silicon oxide film exposed in the opening of the photo resist 109 in the diode element region is also removed. Then, with the photo resist 109 as a mask, phosphorus ions (indicated by triangles "Δ" in FIG. 9A) are implanted into the semiconductor substrate 1 at an implantation energy of 160 keV and a dose of $7.7 \times 10^{12}$ cm$^{-2}$.

In the step shown in FIG. 9B, thermal processing is performed on the semiconductor substrate 1 to form the n-type well diffusion layer 57 in the PMOS region, and the n-type well diffusion layer 35 is formed in the n-type well diffusion layer 27 in the diode element region. In this step, a silicon oxide film having a thickness of 300 nm (3000 angstroms) is formed on the surface of the n-type well diffusion layer 27; hence, the thickness of the silicon oxide film in other regions is increased.

Then, etching is performed on the silicon oxide film covering the whole surface of the semiconductor substrate 1 to reduce the thickness of the silicon oxide film by 30 nm (300 angstroms).

In the step shown in FIG. 9C, the silicon oxide film that is formed on surfaces of the LDMOS region, the diode element region, and the PMOS region as a mask, and the residual silicon nitride film 101 that is on the surface of the semiconductor substrate 1 in a p-well region including the NMOS region are totally removed. Then, thermal oxidation processing is performed on the semiconductor substrate 1 to form a buffer oxide layer (not illustrated).

Then, with the silicon oxide film on surfaces of the LDMOS region, the diode element region, and the PMOS region as a mask, boron ions (indicated by crosses "X" in FIG. 9C) are implanted into the semiconductor substrate 1 at an implantation energy of 25 keV and a dose of $2.1 \times 10^{13}$ cm$^{-2}$.

Figure 10A:
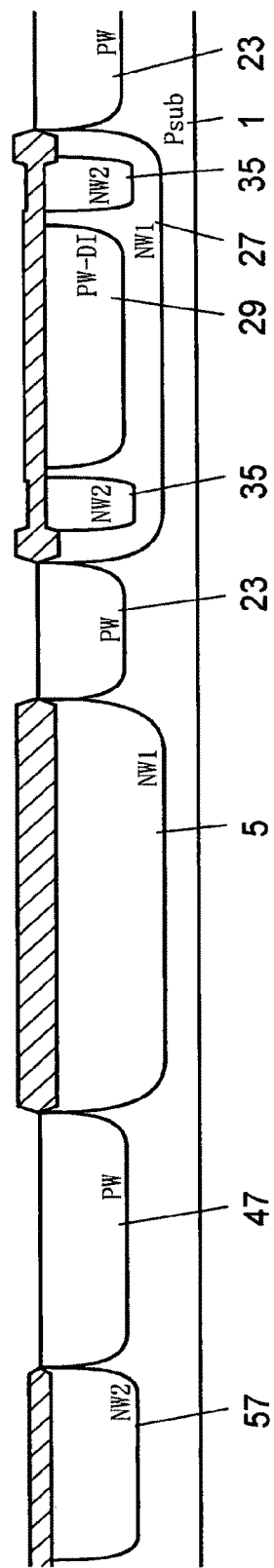
Figure 10B:
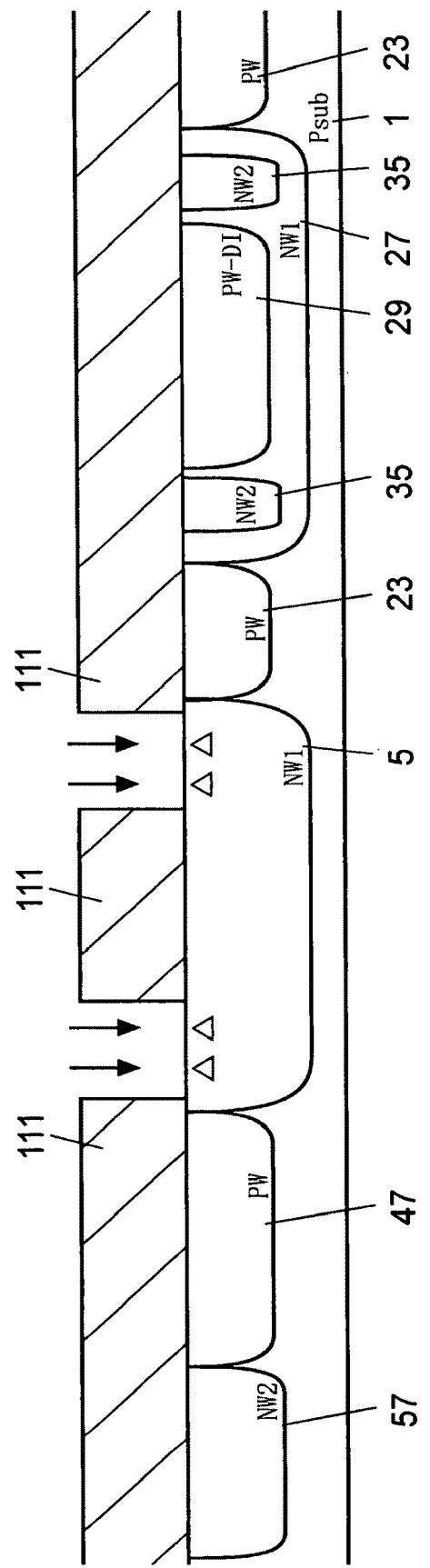

FIG. 10A through FIG. 10C, continuing from FIG. 9C, are cross-sectional views illustrating part of the method of producing the semiconductor device of the present embodiment as shown in FIG. 4.

In the step shown in FIG. 10A, thermal oxidation processing is performed on the semiconductor substrate 1 at a temperature of 1150° C. for 44 minutes to form the p-type well diffusion layer 47 in the NMOS region. In this step, the p-type well diffusion layer 23 is formed in the element separation region.

In the step shown in FIG. 10B, the silicon oxide film on the semiconductor substrate 1 is totally removed, and a buffer oxide layer (not illustrated) is formed on the whole semiconductor substrate 1.

A photo resist 111 is formed, which has an opening corresponding to the lightly doped n-type well diffusion layer 13 in the LDMOS region (refer to FIG. 2A through FIG. 2C).

With the photo resist 111 as a mask, phosphorus ions (indicated by triangles "Δ" in FIG. 10B) are implanted into the semiconductor substrate 1 at an implantation energy of 100 keV and a dose of $2.0 \times 10^{12}$ cm$^{-2}$.

In the step shown in FIG. 10C, the photo resist 111 is removed. Then, thermal oxidation processing is performed on the semiconductor substrate 1 to form the lightly doped n-type well diffusion layer 13 in the n-type well diffusion layer 5 in the NMOS region. In this step, the buffer oxide layer becomes thick, and the silicon oxide film 113 is formed to have a thickness of 300 nm (3000 angstroms).

Figure 11A:
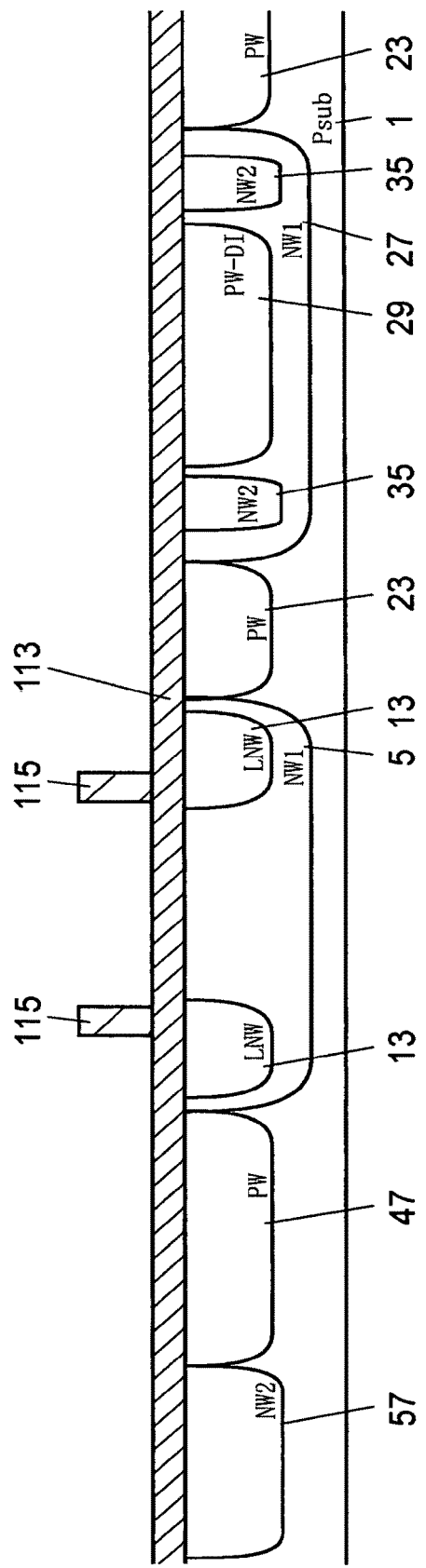
FIG. 11A through FIG. 11C, continuing from FIG. 10C, are cross-sectional views illustrating part of the method of producing the semiconductor device of the present embodiment as shown in FIG. 4.
Figure 11B:
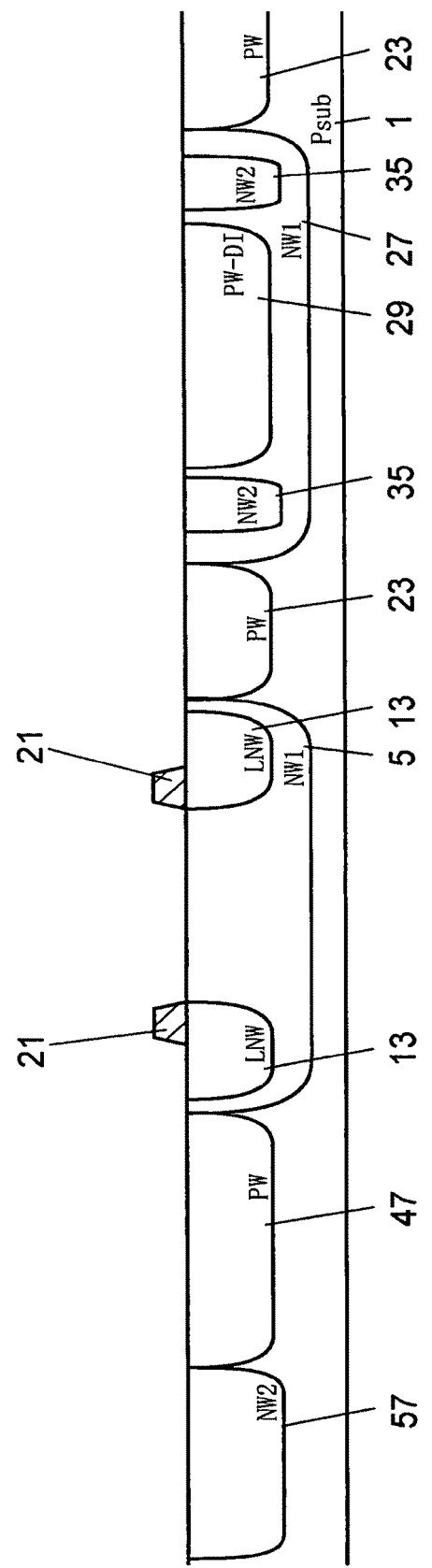
Figure 11C:
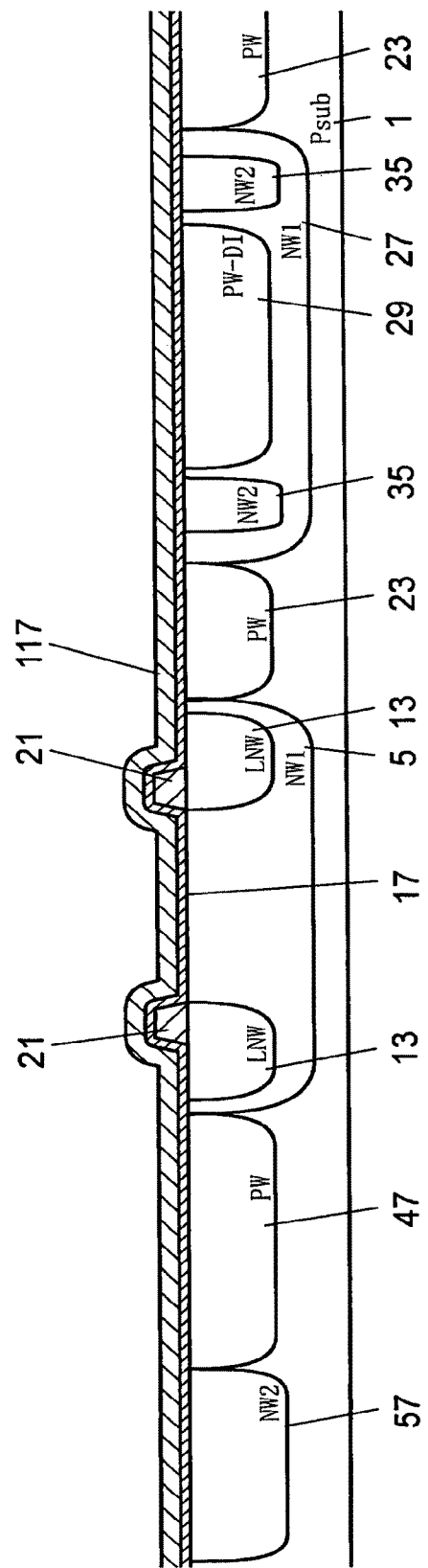

FIG. 11A through FIG. 11C, continuing from FIG. 100, are cross-sectional views illustrating part of the method of producing the semiconductor device of the present embodiment as shown in FIG. 4.

In the step shown in FIG. 11A, a photo resist 115 is formed, which corresponds to the electric field relaxation oxide film 21 (refer to FIG. 2A through FIG. 2C) in the LDMOS region.

In the step shown in FIG. 11B, with the photo resist 115 as a mask, thermal processing is performed on the silicon oxide film 113 to form the electric field relaxation oxide film 21 in the LDMOS region. Then the photo resist 115 is removed.

In the step shown in FIG. 11C, thermal oxidation processing is performed on the semiconductor substrate 1 to form the gate oxide film 17 to a thickness of 25 nm (250 angstroms). The poly-silicon film 117 is formed on the gate oxide film 17. It should be noted that the electric field relaxation oxide film 21 becomes thick when forming the gate oxide film 17, but the gate oxide film 17 and the electric field relaxation oxide film 21 are illustrated as separate films in FIG. 1, FIG. 2A through FIG. 2C, FIG. 4 and FIG. 11C for convenience of illustration.

Figure 12A:
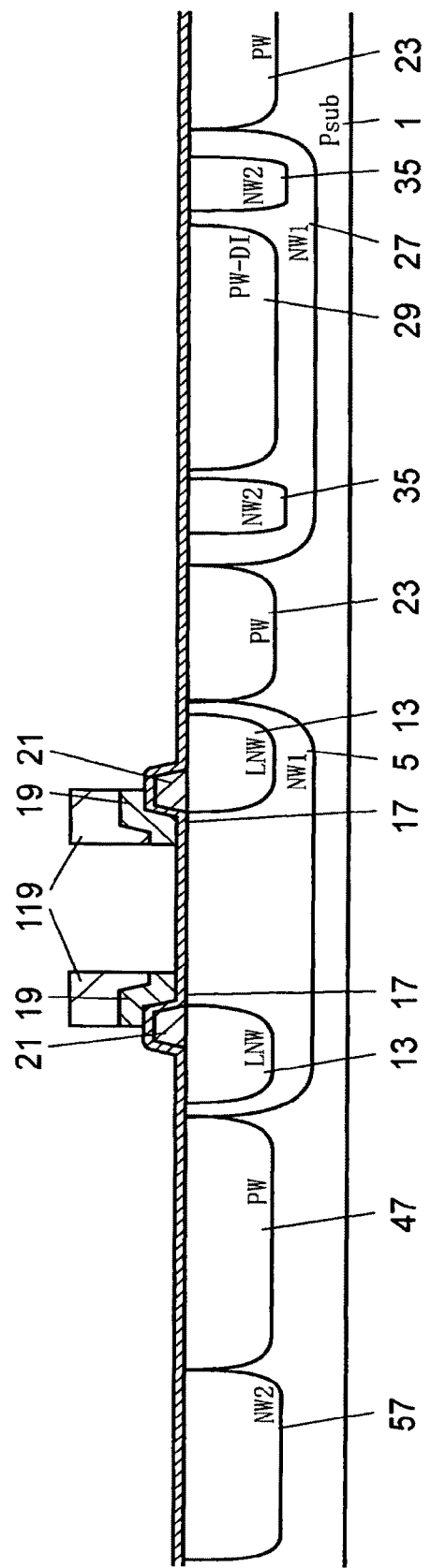
FIG. 12A through FIG. 12C, continuing from FIG. 11C, are cross-sectional views illustrating part of the method of producing the semiconductor device of the present embodiment as shown in FIG. 4.
Figure 12B:
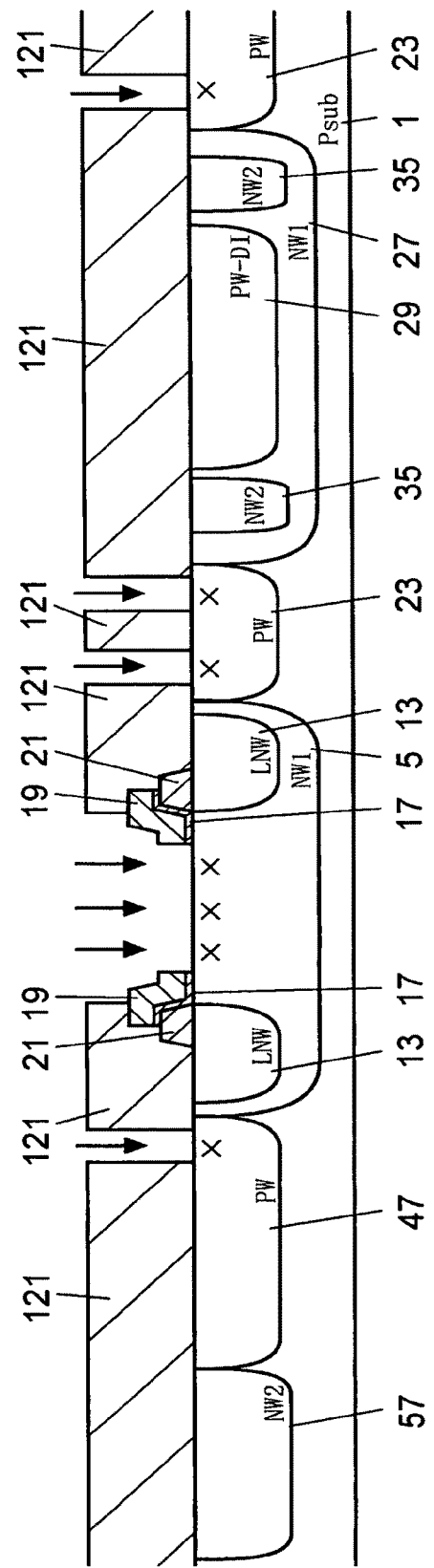
Figure 12C:
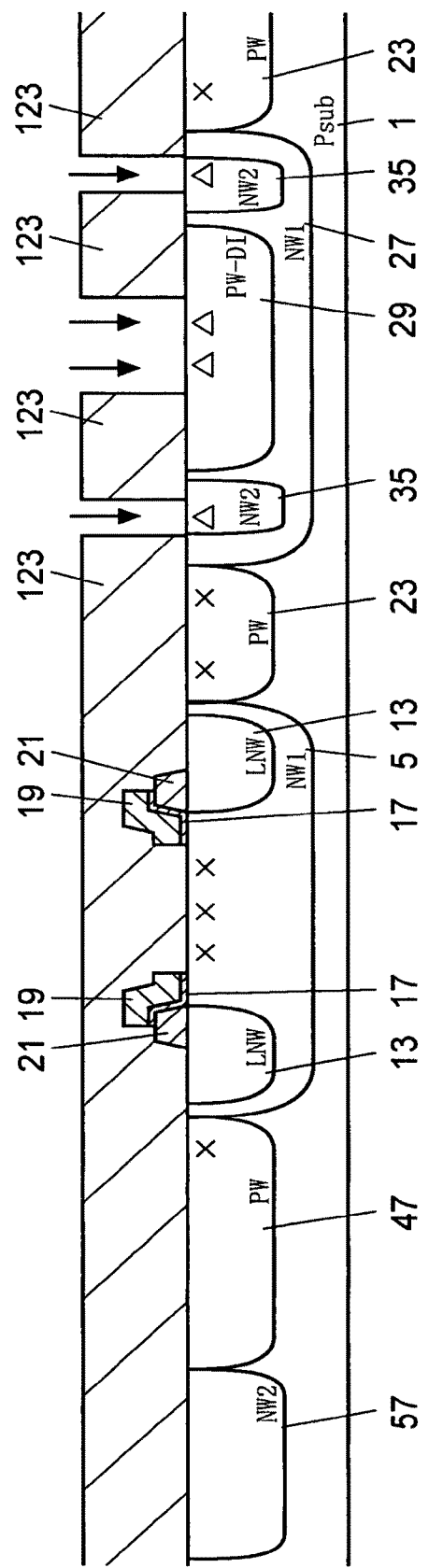

FIG. 12A through FIG. 12C, continuing from FIG. 11C, are cross-sectional views illustrating part of the method of producing the semiconductor device of the present embodiment as shown in FIG. 4.

In the step shown in FIG. 12A, a photo resist 119 is formed on the poly-silicon film 117 to define a region where the poly-silicon gate electrode 19 in the LDMOS region is to be formed.

The poly-silicon film 117 is patterned with the photo resist 119 as a mask to form the poly-silicon gate electrode 19 on the gate oxide film 17 and the electric field relaxation oxide film 21 in the LDMOS region.

In the step shown in FIG. 12B, the photo resist 119 is removed. In addition, the gate oxide film 17 is removed by using the poly-silicon gate electrode 19 as a mask with a portion of the gate oxide film 17 remaining below the poly-silicon gate electrode 19. Then, a buffer oxide (not-illustrated) is formed.

A photo resist 121 is formed, which has openings respectively corresponding to the p-type body diffusion layer 7 in the LDMOS region (refer to FIG. 2A through FIG. 2C) and the p-type body diffusion layer 25 enclosing the LDMOS region and the diode element region (refer to FIG. 2A through FIG. 2C, and FIG. 3A through FIG. 3C). With the photo resist 121 and the gate electrode 19 as masks, boron ions (indicated by crosses "X" in FIG. 12B) are implanted into the semiconductor substrate 1 at an implantation energy of 25 keV and a dose of $2.1 \times 10^{13}$ cm$^{-2}$.

In the step shown in FIG. 12C, the photo resist 121 is removed.

A photo resist 123 is formed, which has an opening corresponding to the n-type body diffusion layer 31 in the diode element region (refer to FIG. 3A through FIG. 3C). Here, the photo resist 123 also has an opening corresponding to the side of the n-type well diffusion layer (NW2) 35, which side is near the edge of the n-type well diffusion layer 27 (refer to FIG. 3A through FIG. 3C).

With the photo resist 123 as a mask, phosphorus ions (indicated by triangles "Δ" in FIG. 12C) are implanted into the semiconductor substrate 1 at an implantation energy of 100 keV and a dose in a range from $8.0 \times 10^{12}$ cm$^{-2}$ to $20.0 \times 10^{12}$ cm$^{-2}$.

Figure 13A:
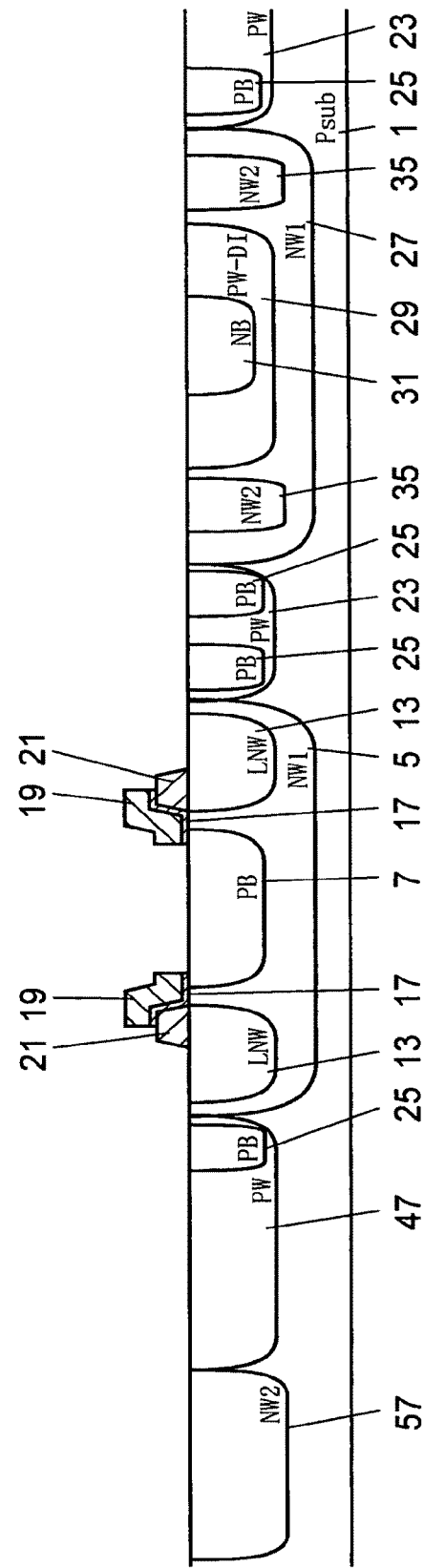
FIG. 13A through FIG. 13C, continuing from FIG. 12C, are cross-sectional views illustrating part of the method of producing the semiconductor device of the present embodiment as shown in FIG. 4.
Figure 13B:
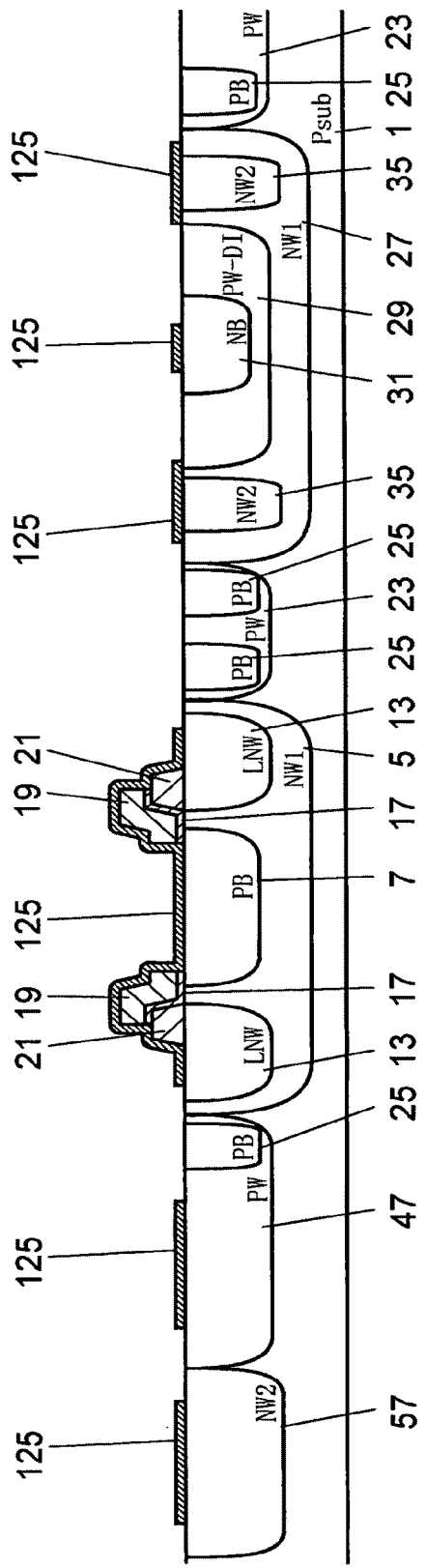
Figure 13C:
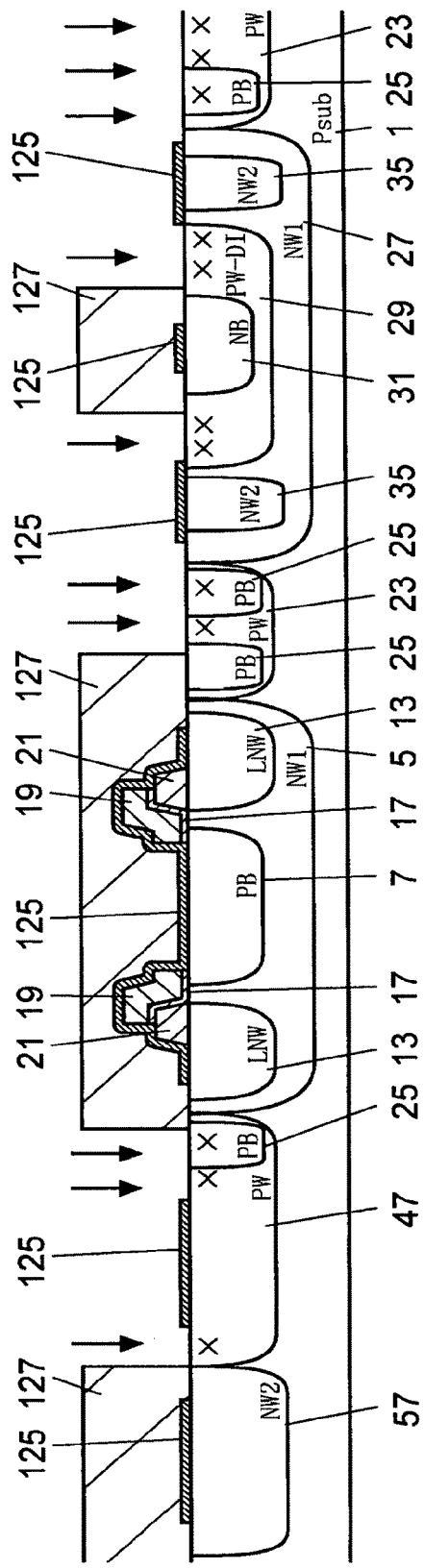

FIG. 13A through FIG. 13C, continuing from FIG. 12C, are cross-sectional views illustrating part of the method of producing the semiconductor device of the present embodiment as shown in FIG. 4.

In the step shown in FIG. 13A, the photo resist 123 is removed. Then, thermal processing is performed on the semiconductor substrate 1 at a temperature of 1100° C. for 140 minutes to form the p-type body diffusion layer 7 in the n-type well diffusion layer 5 in the LDMOS region, form the p-type body diffusion layer 25 in the p-type well diffusion layer 23 surrounding the LDMOS region and the diode element region, and form the n-type body diffusion layer 31 in the p-type well diffusion layer 29 in the diode element region.

In the diode element region, the portion of the n-type well diffusion layer 35 implanted with phosphorus ions has a high phosphorus concentration. For convenience, in FIG. 13A, this implanted portion and other portions of the n-type well diffusion layer 35 as a whole are illustrated as one element. In addition, a thermal oxide film is formed during thermal processing, but illustration of the thermal oxide film is omitted.

In the step shown in FIG. 13B, a silicon nitride film 125 is deposited on the whole the thermal oxide film formed during thermal processing. The silicon nitride film 125 is patterned by using a photo resist for defining a region where the field oxide film 3 is formed. Then, the photo resist is removed.

In the step shown in FIG. 13C, a photo resist 127 is formed, which has an opening corresponding to a region where the field dope layer 41 (refer to FIG. 3A through FIG. 3C, and FIG. 4) is formed. The photo resist 127 covers the n-type body diffusion layer 31 and surroundings so that impurities used in field doping are not implanted into the n-type body diffusion layer 31 in the diode element region.

With the photo resist 127 and the silicon nitride film 125 as masks, boron ions (indicated by crosses "X" in FIG. 13C) are implanted into the semiconductor substrate 1 at an implantation energy of 15 keV and a dose of $3.0 \times 10^{13}$ cm$^{-2}$.

Figure 14A:
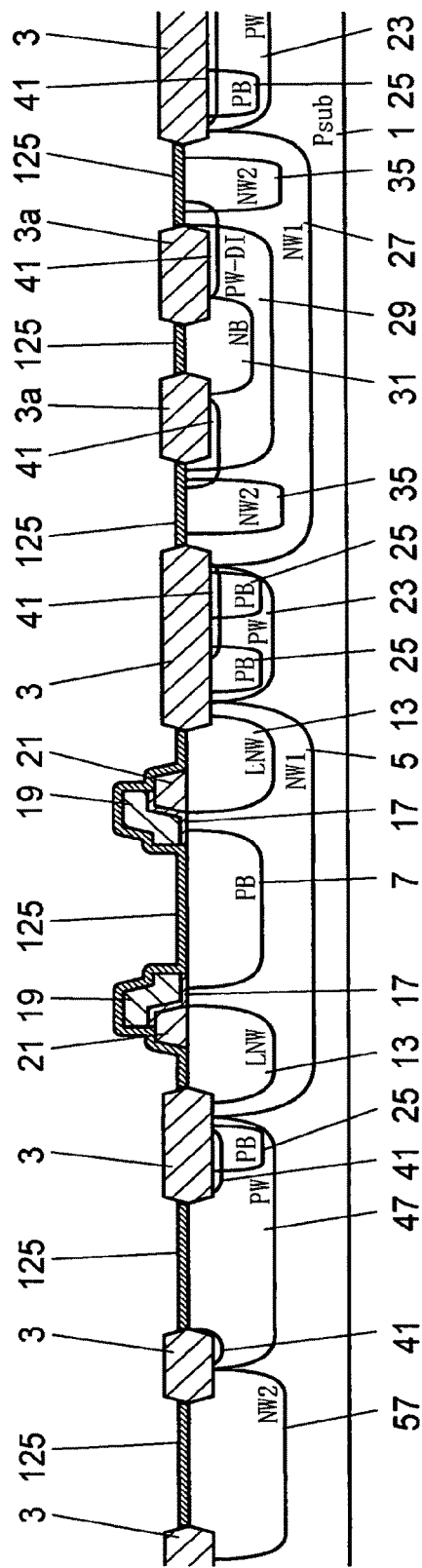
FIG. 14A through FIG. 14C, continuing from FIG. 12C, are cross-sectional views illustrating part of the method of producing the semiconductor device of the present embodiment as shown in FIG. 4.
Figure 14B:
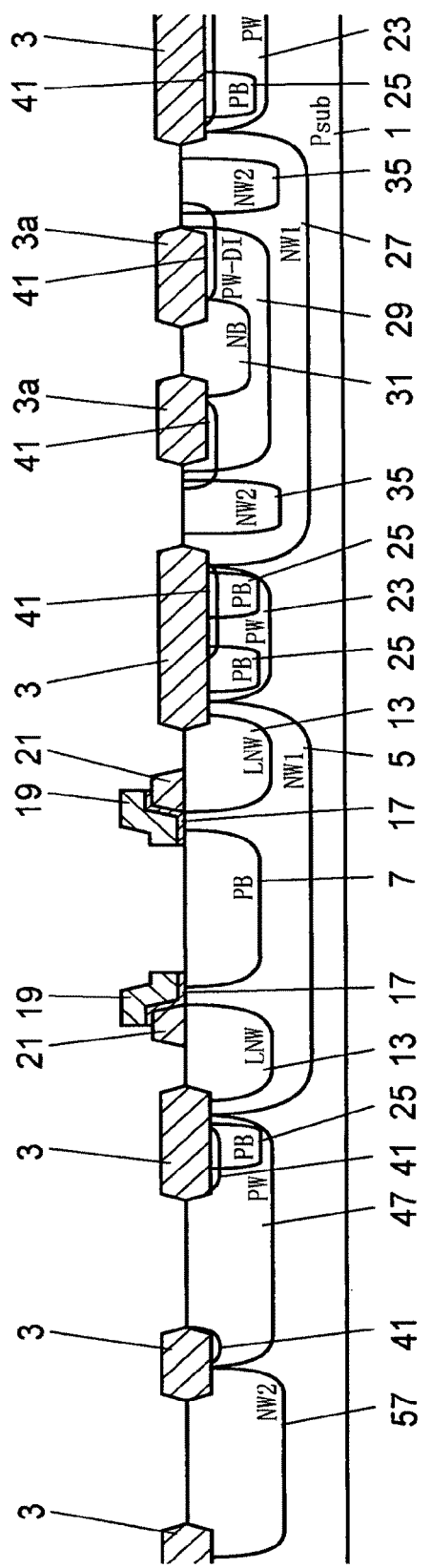
Figure 14C:
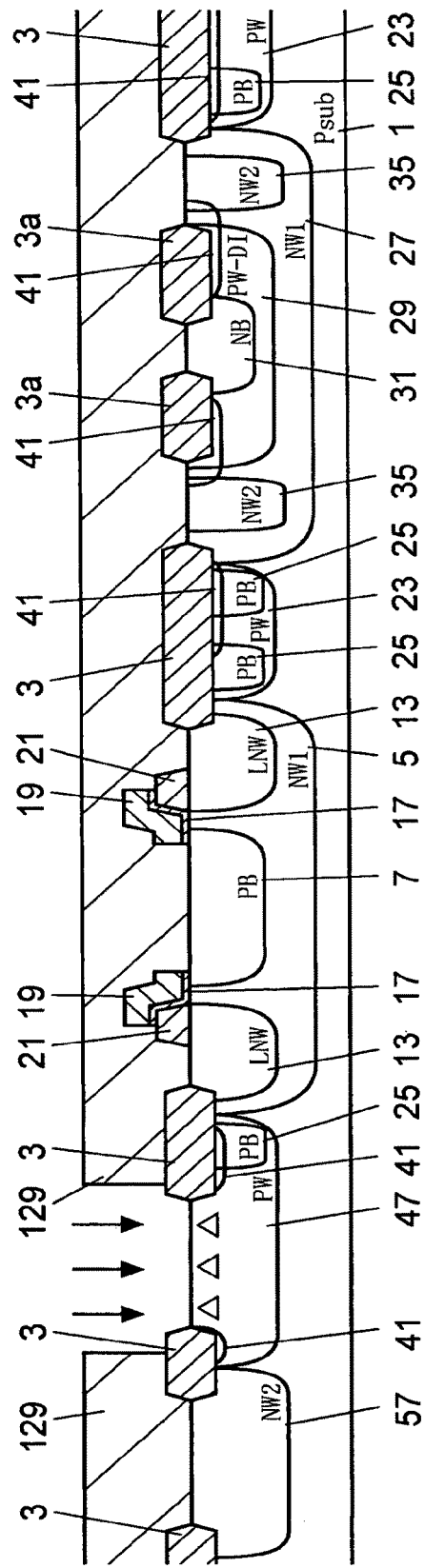

FIG. 14A through FIG. 14C, continuing from FIG. 13C, are cross-sectional views illustrating part of the method of producing the semiconductor device of the present embodiment as shown in FIG. 4.

In the step shown in FIG. 14A, the photo resist 127 is removed.

Thermal processing is performed on the semiconductor substrate 1 at a temperature of 1000° C. for 200 minutes to form the field oxide film 3, the field oxide film 3a, and the field oxide film 3b (refer to FIG. 3A through FIG. 3C). In this step, the boron ions implanted in the step shown in FIG. 12A thermally diffuse, and the field dope layer 41 is formed.

In the step shown in FIG. 14B, the oxide film all over the semiconductor substrate 1 is removed, and etching is performed to reduce the thickness of the field oxide film 3, the field oxide film 3a, and the field oxide film 3b by 30 nm (300 angstroms).

Then, the silicon nitride film 125 is removed.

In the step shown in FIG. 14C, thermal oxidation processing is performed on the semiconductor substrate 1 to form a pre-gate oxide layer (not illustrated) having a thickness of 11 nm (110 angstroms).

A photo resist 129 is formed, which has an opening corresponding to the NMOS region. Then, channel doping is performed with the photo resist 129 as a mask.

Figure 15A:
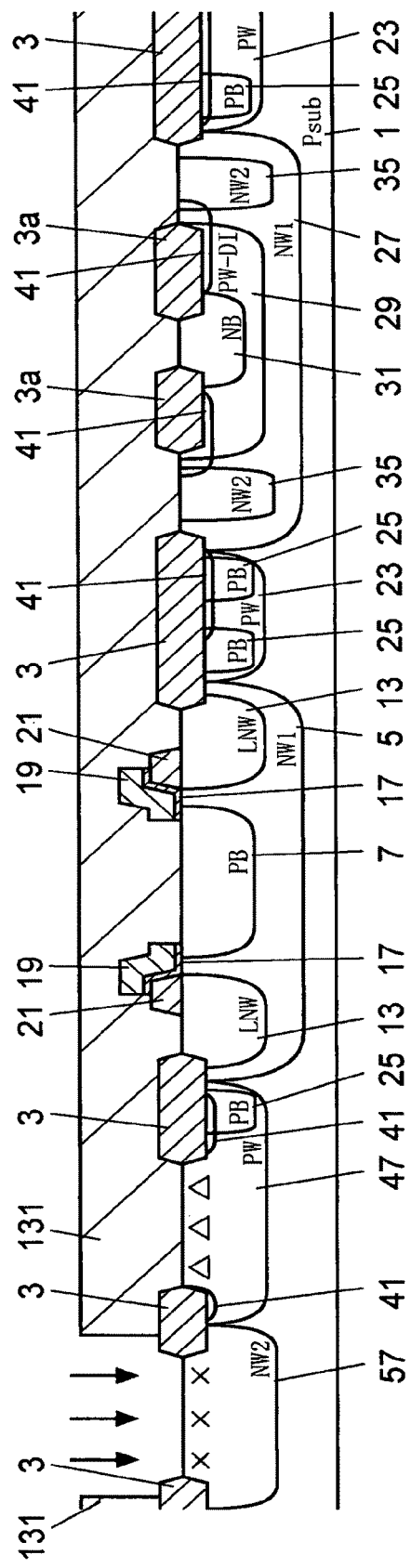
FIG. 15A through FIG. 15C, continuing from FIG. 12C, are cross-sectional views illustrating part of the method of producing the semiconductor device of the present embodiment as shown in FIG. 4.
Figure 15B:
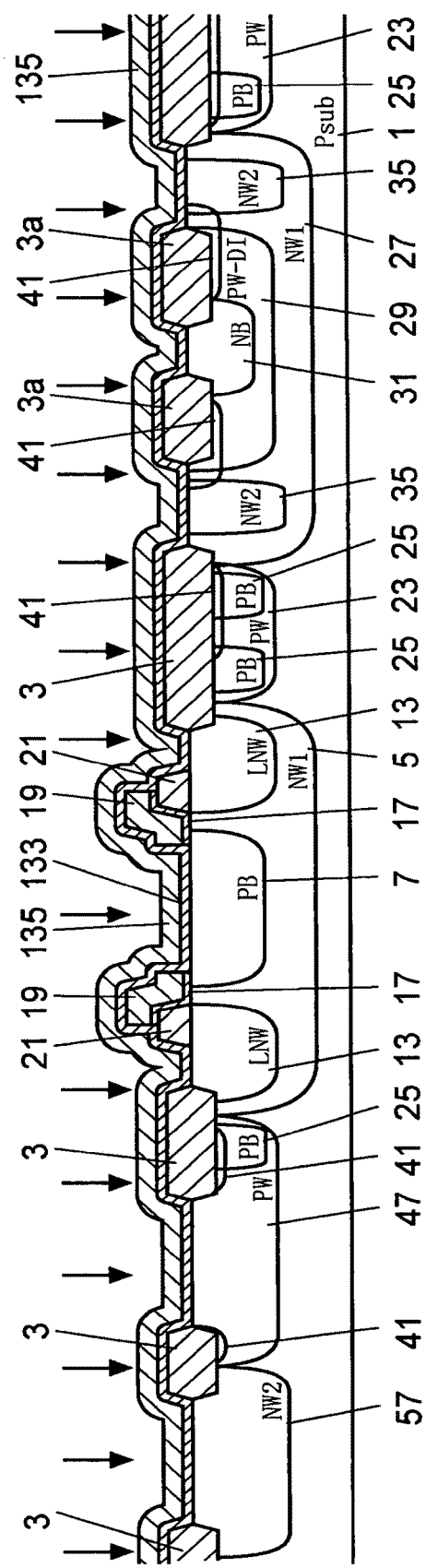
Figure 15C:
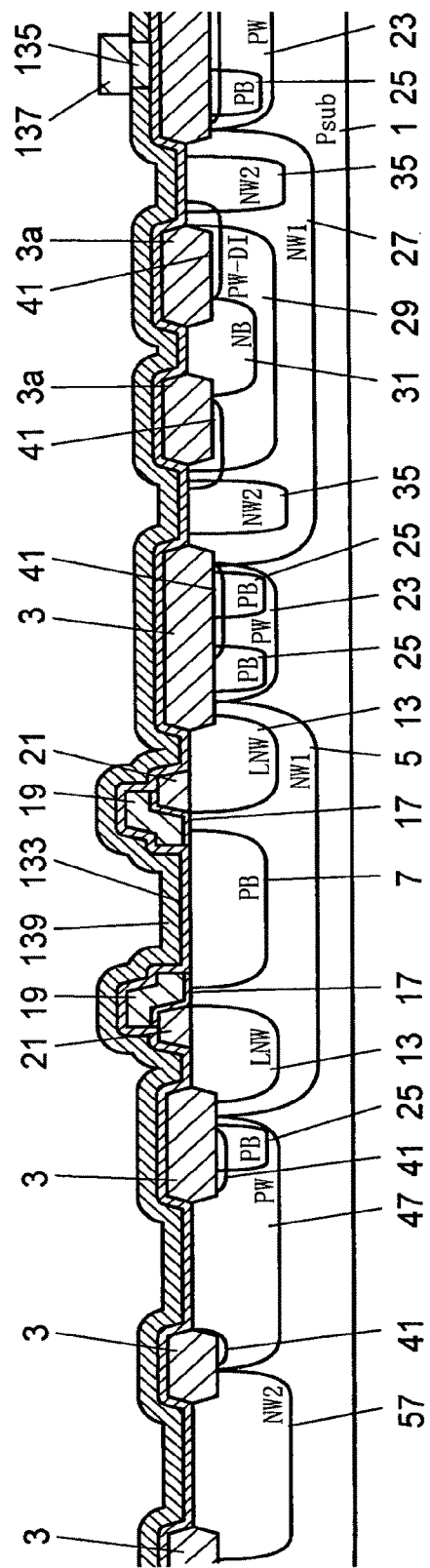

FIG. 15A through FIG. 15C, continuing from FIG. 12C, are cross-sectional views illustrating part of the method of producing the semiconductor device of the present embodiment as shown in FIG. 4.

In the step shown in FIG. 15A, the photo resist 129 is removed. A photo resist 131 is formed, which has an opening corresponding to the PMOS region. Then, channel doping is performed with the photo resist 131 as a mask.

In the step shown in FIG. 15B, the photo resist 131 is removed. After RCA cleaning, thermal processing is performed on the semiconductor substrate 1 at a temperature of 920° C. to form a silicon oxide film 133 to a thickness of 13.5 nm (135 angstroms), which is used as a gate oxide film. Then, a poly-silicon film 135 is formed on the silicon oxide film 133 to a thickness of 35 nm (350 angstroms). Then, phosphorus ions are implanted into the poly-silicon film 135 with implantation energy of 30 keV and a dose determined according to an object resistance of the resistor element.

It should be noted that the field oxide film 3, the field oxide film 3a, the field oxide film 3b, and the electric field relaxation oxide film 21 become thick when forming the silicon oxide film 133, but the silicon oxide film 133, the field oxide film 3, the field oxide film 3a, the field oxide film 3b, and the electric field relaxation oxide film 21 are illustrated as separate films in FIG. 15B for convenience of illustration.

In the step shown in FIG. 15C, a high temperature oxide film 137 is deposited on the poly-silicon film 135 to a thickness of 250 nm (2500 angstroms). The high temperature oxide film 137 is patterned by photoengraving and etching, while leaving a portion of the high temperature oxide film 137 corresponding to a forming region of the poly-silicon film 135 in a region determining the resistance of the resistor element.

With the high temperature oxide film 137 as a mask, phosphor silicate glass (PSG) is deposited on the poly-silicon film 135 and the high temperature oxide film 137. Then thermal processing is performed on the semiconductor substrate 1, and phosphorus ions diffuse into the poly-silicon film 135. Thus a poly-silicon film 139 is formed, which has a concentration of phosphorus higher than that of the poly-silicon film 135. A portion of the poly-silicon film 135, which determines the resistance of the resistor element, remains below the high temperature oxide film 137.

Then, the phosphor silicate glass (PSG) is removed.

Figure 16A:
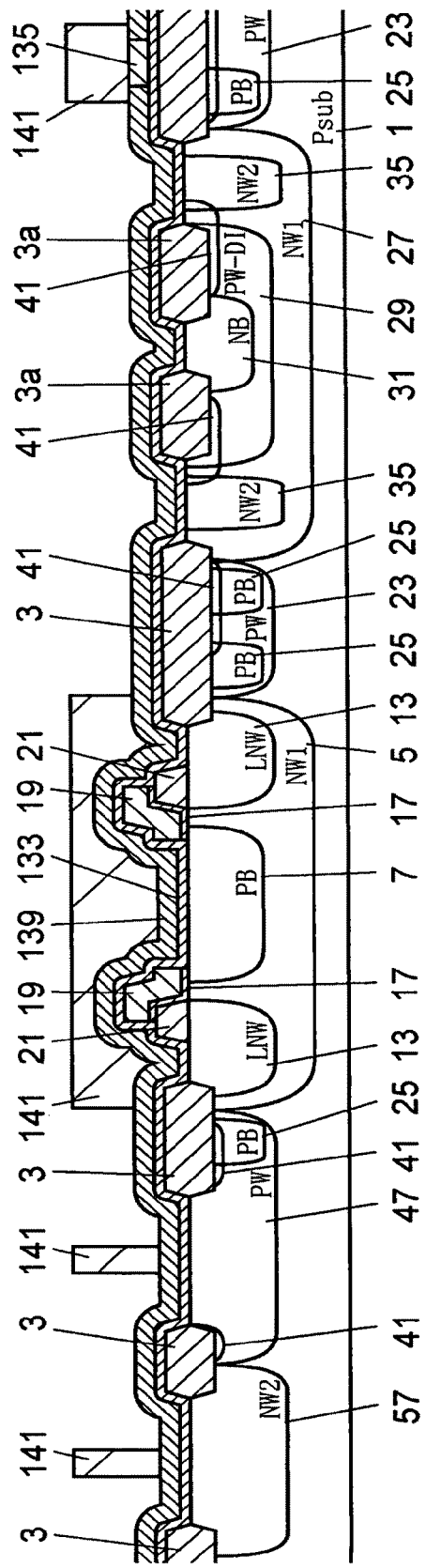
Figure 16C:
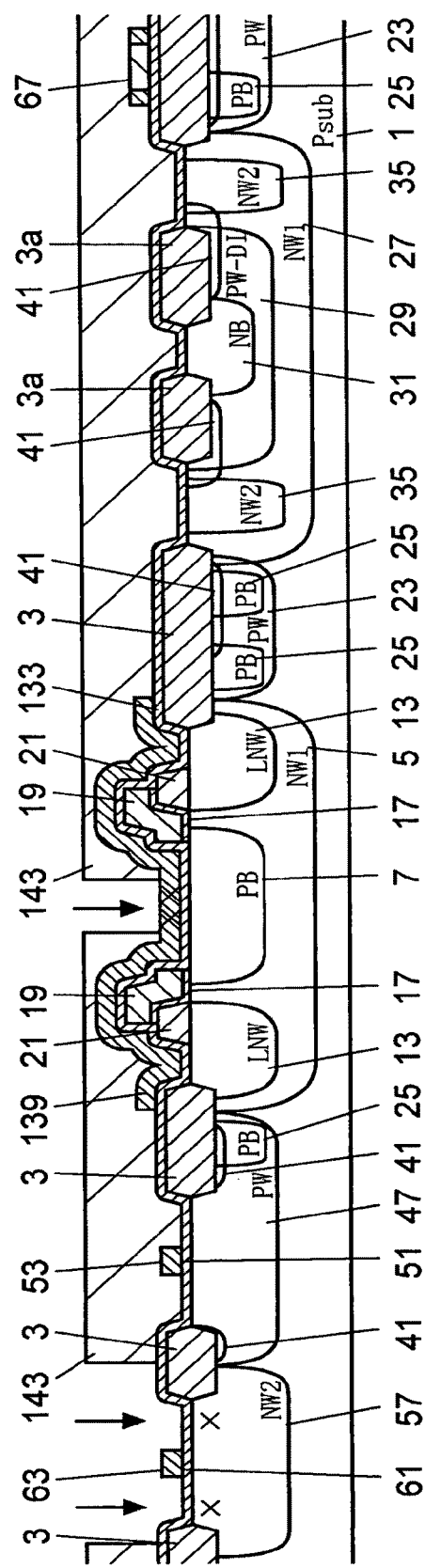

FIG. 16A through FIG. 16C, continuing from FIG. 15C, are cross-sectional views illustrating part of the method of producing the semiconductor device of the present embodiment as shown in FIG. 4.

In the step shown in FIG. 16A, the high temperature oxide film 137 is removed.

A photo resist 141 is formed, which defines a region for gate electrodes of the MOS transistor (except for the LDMOS) and the resistor element on the poly-silicon film 135 and the poly-silicon film 139. The photo resist 141 covers the LDMOS region.

In step shown in FIG. 16B, the poly-silicon film 135 and the poly-silicon film 139 are patterned with the photo resist 141 as a mask to form gate electrodes 53, 63 and the resistor element 67.

A portion of the silicon oxide film 133 below the gate electrode 53 constitutes a gate oxide film 51, and a portion of the silicon oxide film 133 below the gate electrode 63 constitutes a gate oxide film 61. A portion of the poly-silicon film 139 remains in the LDMOS region.

Then, the photo resist 141 is removed. Next, thermal processing is performed on the semiconductor substrate 1 to form a silicon oxide film (not illustrated) on the gate electrodes 53, 63, the resistor element 67, and the poly-silicon film 139 to a thickness of 13.5 nm (135 angstroms).

In the step shown in FIG. 16C, a photo resist 143 is formed, which has openings respectively corresponding to the p-type high concentration diffusion layer 11 in the LDMOS region, the PMOS region, and the p-type high concentration diffusion layer 39 in the diode element region (refer to FIG. 3A through FIG. 3C). The reticle (photo mask) used for forming the photo resist 143 is also used in the step shown in FIG. 18C.

With the photo resist 143 as a mask, boron ions (indicated by crosses "X" in FIG. 16C) are implanted into the semiconductor substrate 1 at an implantation energy of 15 keV and a dose of $2.0 \times 10^{13}$ cm$^{-2}$. In the LDMOS region, the boron ions are blocked by the poly-silicon film 139 and cannot arrive at the semiconductor substrate 1.

Figure 17A:
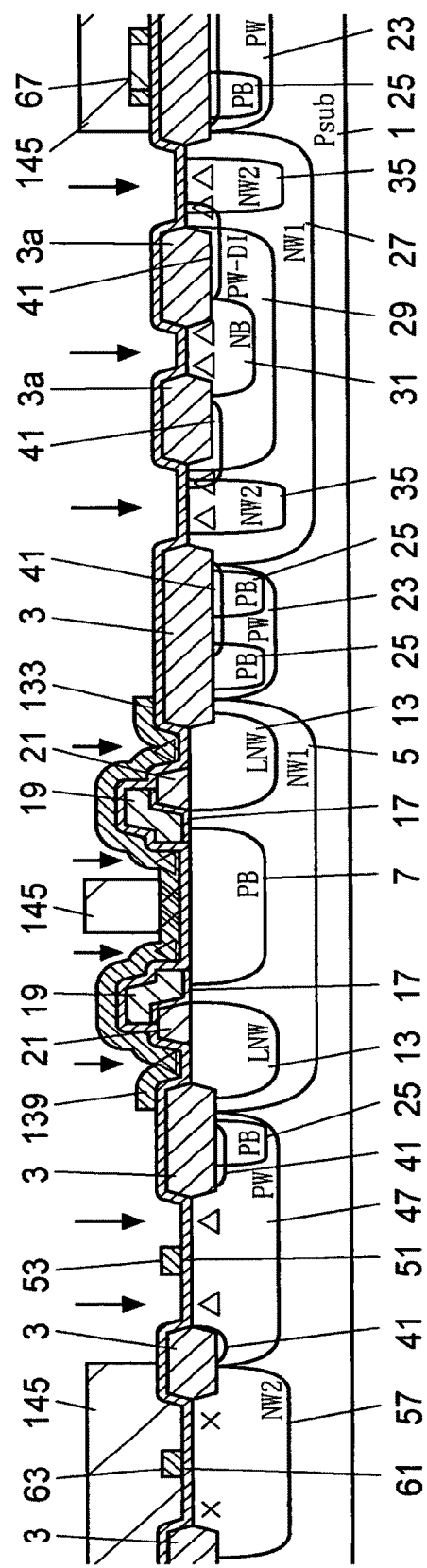
FIG. 17A through FIG. 17C, continuing from FIG. 16C, are cross-sectional views illustrating part of the method of producing the semiconductor device of the present embodiment as shown in FIG. 4.
Figure 17B:
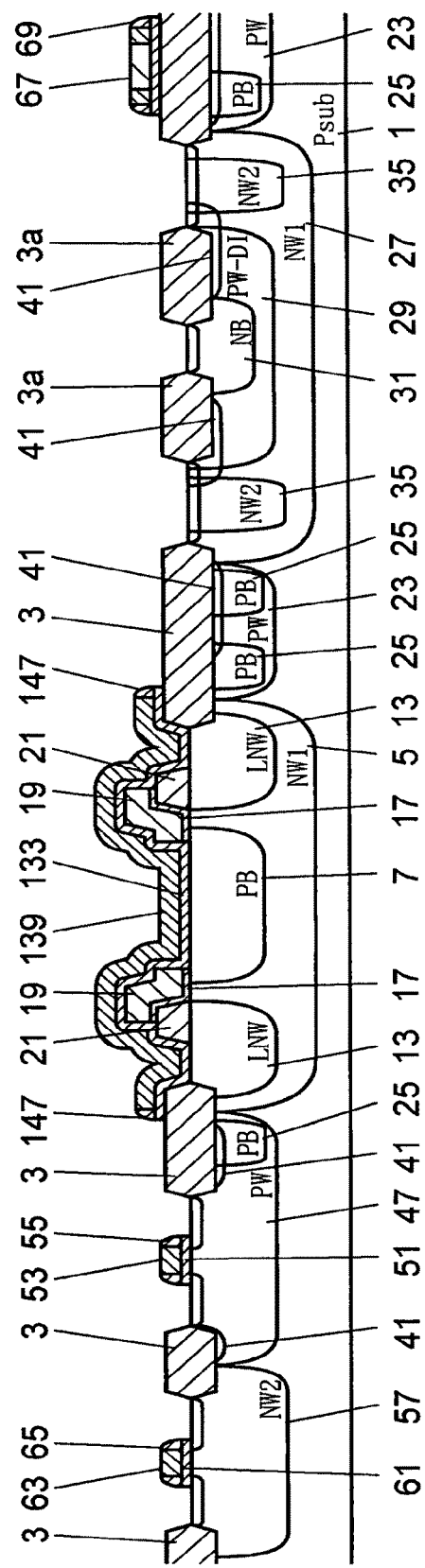
Figure 17C:
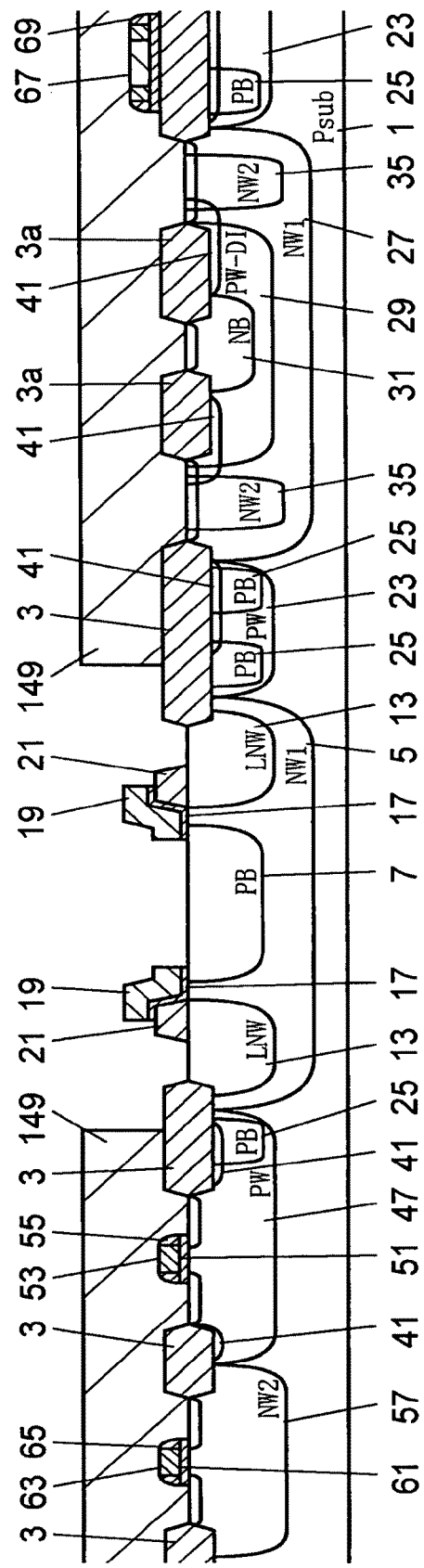

FIG. 17A through FIG. 17C, continuing from FIG. 16C, are cross-sectional views illustrating part of the method of producing the semiconductor device of the present embodiment as shown in FIG. 4.

In the step shown in FIG. 17A, the photo resist 143 is removed. A photo resist 145 is formed, which has openings respectively corresponding to the LDMOS region, the diode element region, and the NMOS region. In the LDMOS region, the photo resist 145 covers the p-type high concentration diffusion layer 11 (refer to FIG. 2A through FIG. 2C). The reticle (photo mask) used for forming the photo resist 145 is also used in the step shown in FIG. 18A.

With the photo resist 145 as a mask, phosphorus ions (indicated by triangles "Δ" in FIG. 17A) are implanted into the semiconductor substrate 1 at an implantation energy of 70 keV and a dose of $2.5 \times 10^{13}$ cm$^{-2}$. In the LDMOS region, the phosphorus ions are blocked by the poly-silicon film 139 and cannot arrive at the semiconductor substrate 1.

In the step shown in FIG. 17B, the photo resist 145 is removed. Then, a high temperature oxide film, which is used as a sidewall, is deposited all over the semiconductor substrate 1 to a thickness of 150 nm (1500 angstroms). The high temperature oxide film is etched back, and a sidewall 55 is formed on the side surface of the gate electrode 53, a sidewall 65 is formed on the side surface of the gate electrode 63, and a sidewall 69 is formed on the side surface of the resistor element 67. Further, a sidewall 147 is formed on the side surface of the poly-silicon film 139.

In the step shown in FIG. 17C, a photo resist 149 is formed, which has an opening corresponding to the LDMOS region. With the photo resist 149 as a mask, the sidewall 147, the poly-silicon film 139, and the silicon oxide film 133 are removed.

Figure 18A:
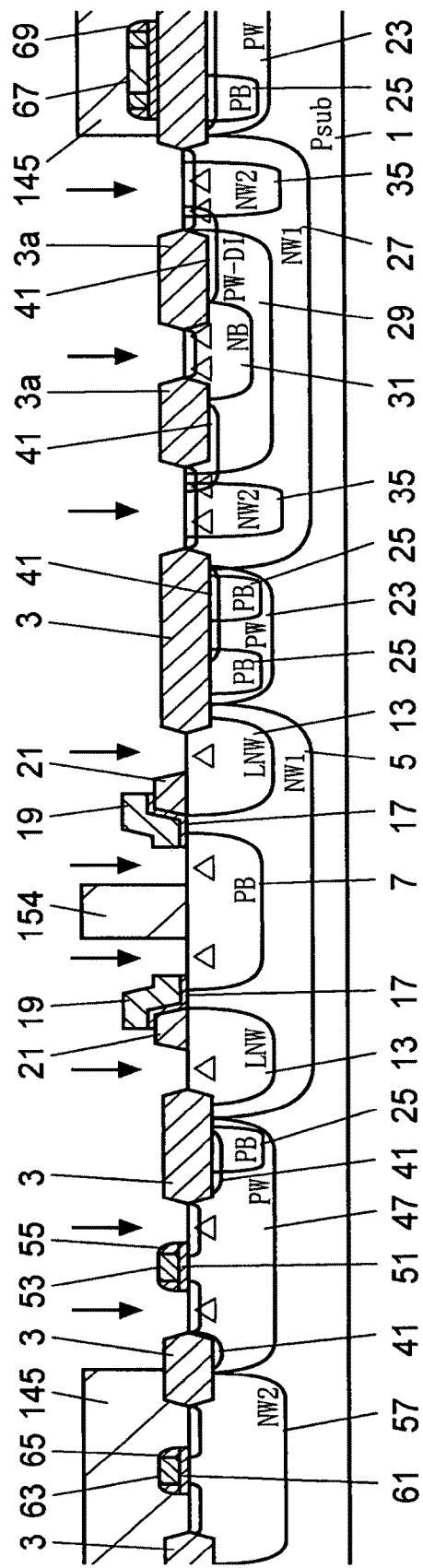
FIG. 18A through FIG. 18C, continuing from FIG. 17C, are cross-sectional views illustrating part of the method of producing the semiconductor device of the present embodiment as shown in FIG. 4.
Figure 18B:
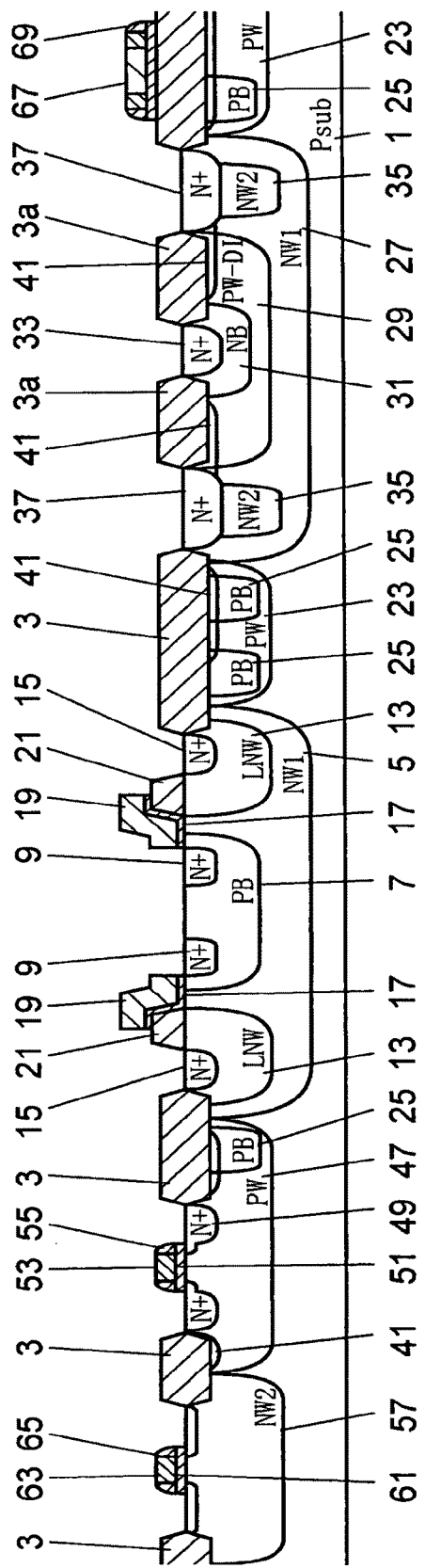
Figure 18C:
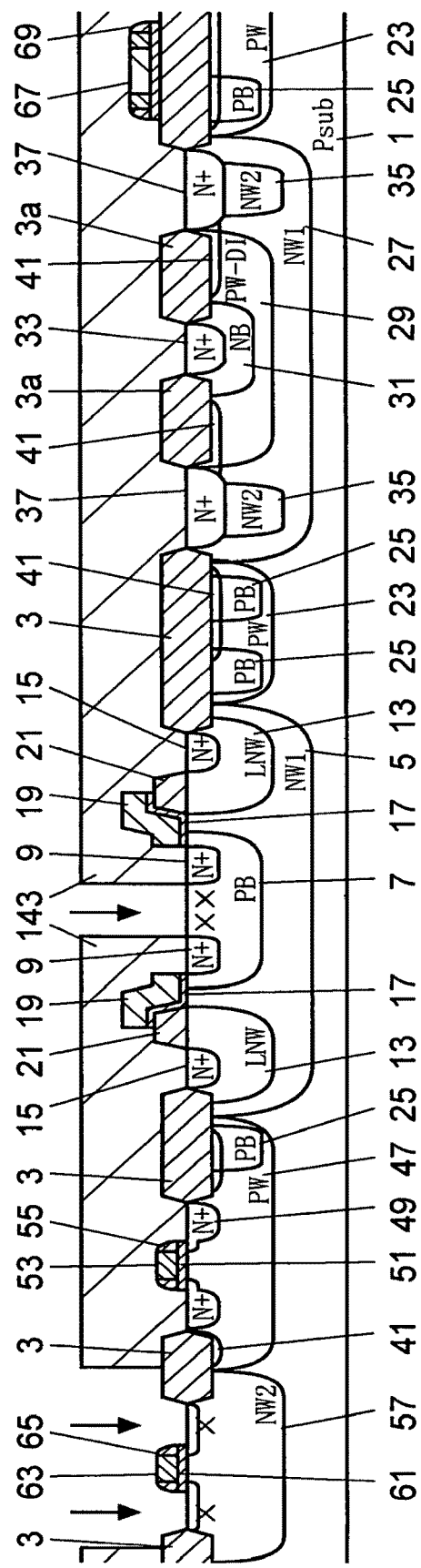

FIG. 18A through FIG. 18C, continuing from FIG. 17C, are cross-sectional views illustrating part of the method of producing the semiconductor device of the present embodiment as shown in FIG. 4.

In step shown in FIG. 18A, the photo resist 149 is removed. The aforesaid reticle in the step shown in FIG. 17A is used to form the photo resist 145. With the photo resist 145 as a mask, arsenic ions (indicated by triangles "Δ" in FIG. 18A) are implanted into the LDMOS region, the diode element region, and the NMOS region at an implantation energy of 50 keV and a dose of $6.0 \times 10^{15}$ cm$^{-2}$.

In the step shown in FIG. 18B, the photo resist 145 is removed. Thermal processing is performed on the semiconductor substrate 1 at a temperature of 900° C. for one hour in an nitrogen atmosphere to thermally diffuse the arsenic ions, thereby forming the n-type source diffusion layer 9 and the n-type high concentration diffusion layer 15 in the LDMOS transistor region, the n-type high concentration diffusion layer 33 and the n-type high concentration diffusion layer 37 in the diode element region, and n-type source and drain diffusion layer 49 in the NMOS region.

In the step shown in FIG. 18C, the aforesaid reticle in the step shown in FIG. 16C is used to form the photo resist 143. With the photo resist 143 as a mask, boron ions (indicated by crosses "X" in FIG. 18C) are implanted into the LDMOS region, the diode element region, and the NMOS region with implantation energy of 50 keV and a dose of $3.0 \times 10^{15}$ cm$^{-2}$.

Afterward, the photo resist 143 is removed. Thermal processing is performed on the semiconductor substrate 1 at a temperature of 850° C. for 27 minutes to thermally diffuse the boron ions, thereby forming the p-type high concentration diffusion layer 11 in LDMOS transistor region, the p-type high concentration diffusion layer 39 (refer to FIG. 3A through FIG. 3C) in the diode element region, and p-type source and drain diffusion layer 59 in the PMOS region (refer to FIG. 4).

In the above, a method of producing the semiconductor device as shown in FIG. 4 is exemplified with reference to FIG. 7A through FIG. 18C; it is certain that the present embodiment is not limited to the above example.

Second Embodiment

Figure 19A:
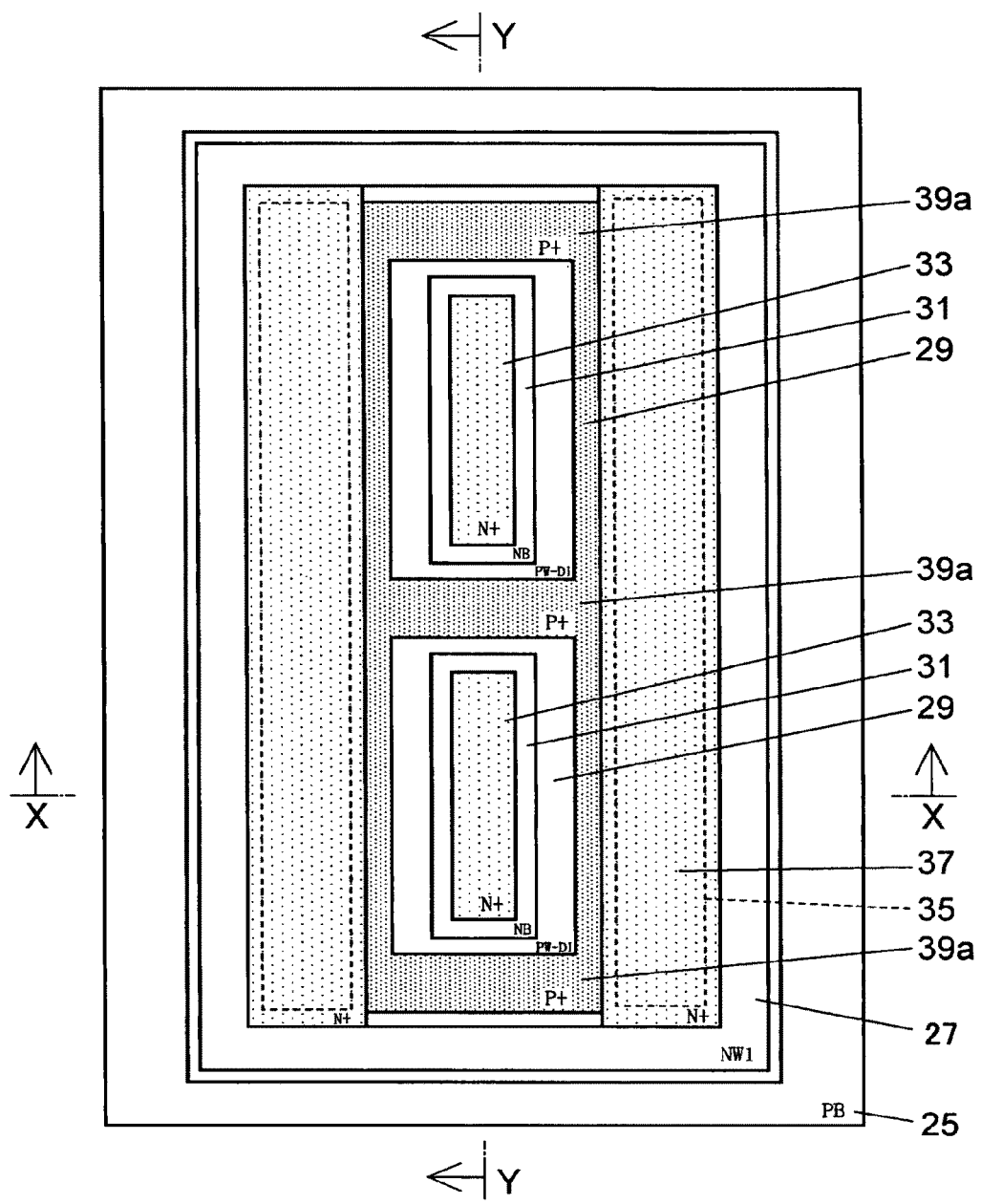
FIG. 19A is a plan view of the diode element according to the second embodiment.
Figure 19B:
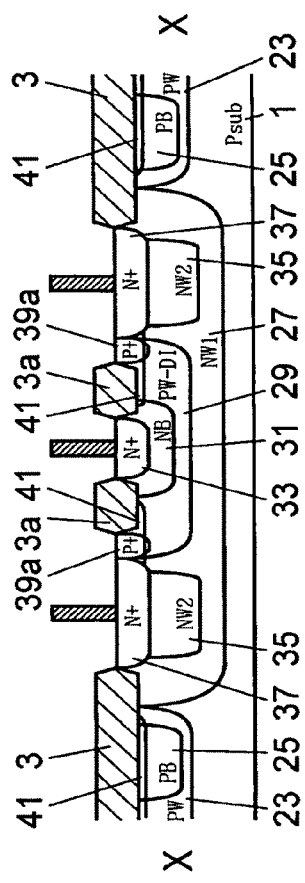
FIG. 19B is a cross-sectional view of the diode element at a position X-X as indicated in FIG. 19A.
Figure 19C:
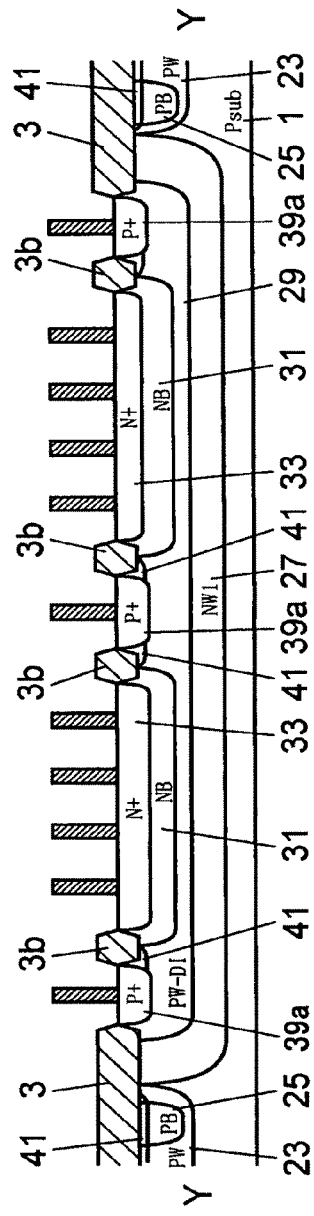
FIG. 19C is a cross-sectional view of the diode element at a position Y-Y as indicated in FIG. 19A.

FIG. 19A through FIG. 19C illustrates a diode element according to a second embodiment of the present invention.

Specifically, FIG. 19A is a plan view of the diode element according to the second embodiment.

FIG. 19B is a cross-sectional view of the diode element at a position X-X as indicated in FIG. 19A.

FIG. 19C is a cross-sectional view of the diode element at a position Y-Y as indicated in FIG. 19A.

In FIG. 19A through FIG. 19C, the same reference numbers are assigned to the same elements as those illustrated in FIG. 3A through FIG. 3C, and overlapping descriptions are omitted.

The diode element shown in FIG. 19A through FIG. 19C differs from the diode element shown in FIG. 3A through FIG. 3C in that a p-type high concentration diffusion layer 39a, which constitutes the base contact diffusion layer of the diode element, is formed like a frame, specifically, the p-type high concentration diffusion layer 39a is formed like strips (slit shape) adjacent to the n-type high concentration diffusion layer 37 and in the longitudinal direction of the n-type body diffusion layer 31 and the n-type high concentration diffusion layer 33.

Figure 20A:
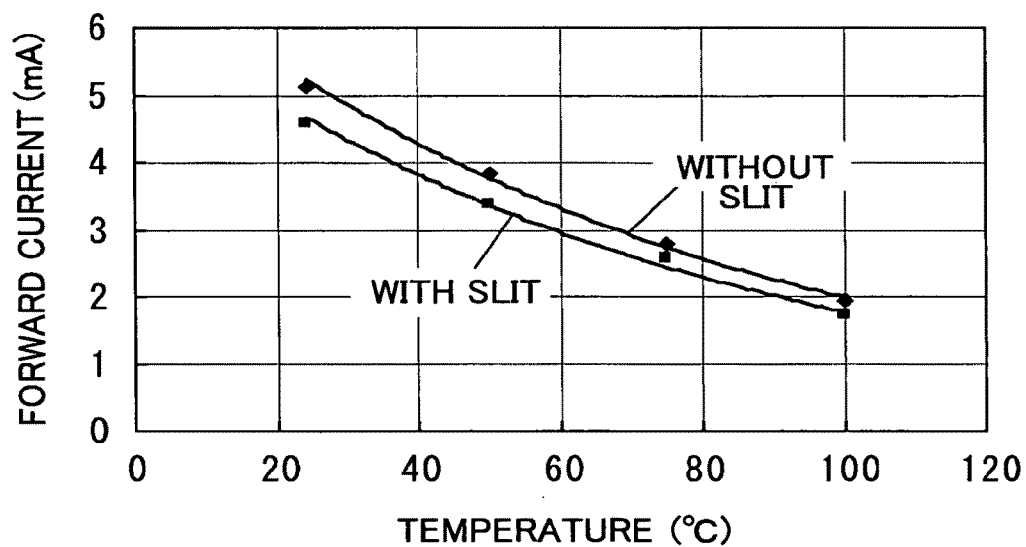
FIG. 20A and FIG. 20B are graphs respectively illustrating properties of the diode element shown in FIG. 3A through FIG. 3C, which does not have slits, and the diode element shown in FIG. 19A through FIG. 19C, which has the slits.
Figure 20B:
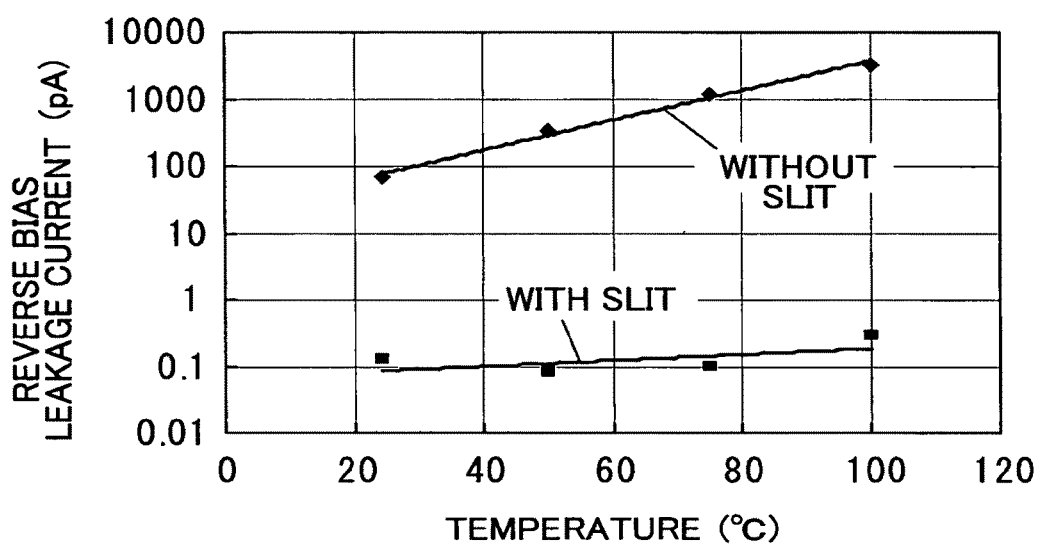

FIG. 20A and FIG. 20B are graphs respectively illustrating properties of the diode element shown in FIG. 3A through FIG. 3C, which does not have the aforesaid slits, and the diode element shown in FIG. 19A through FIG. 19C, which has the aforesaid slits.

Specifically, FIG. 20A presents dependence of a forward current on the temperature, and FIG. 20B presents dependence of a reverse bias leakage current on the temperature.

In FIG. 20A, the abscissa indicates the temperature (° C.), and the ordinate indicates the forward current in units of mA (mili-ampere); in FIG. 20B, the abscissa indicates the temperature (° C.), and the ordinate indicates the reverse bias leakage current in units of pA (pico-ampere).

In these examples, in the measurement of the reverse bias leakage current, a leakage current is measured under the conditions that a voltage of 20 V is applied between the base and the emitter while the base and the collector are shorted.

As for the dependence of the forward current on the temperature, as shown in FIG. 20A, this dependence changes little when the aforesaid slit is present compared to when the aforesaid slit is absent.

As for the dependence of the reverse bias leakage current on the temperature, since the p-type high concentration diffusion layer 39a (the base contact diffusion layer of the diode element) is formed to enclose the n-type body diffusion layer 31 (the emitter diffusion layer of the diode element), that is, the aforesaid slit is present, the reverse bias leakage current is small compared to the reverse bias leakage current when the aforesaid slit is not present, as the diode element shown in FIG. 3A through FIG. 3C.

Figure 21A:
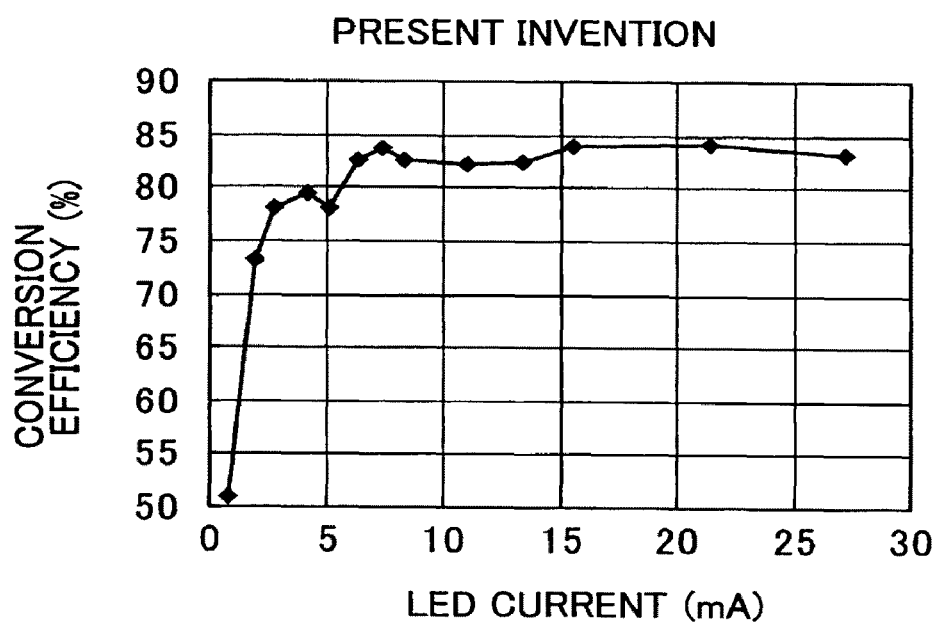
FIG. 21A illustrates measurement results of the conversion efficiency of a DC-DC converter, which is equivalent to the DC-DC converter shown in FIG. 5 with the diode element being replaced by the diode element shown in FIG. 19A through FIG. 19C.

FIG. 21A illustrates measurement results of the conversion efficiency of a DC-DC converter, which is equivalent to the DC-DC converter shown in FIG. 5 with the diode element being replaced by the diode element shown in FIG. 19A through FIG. 19C.

Figure 21B:
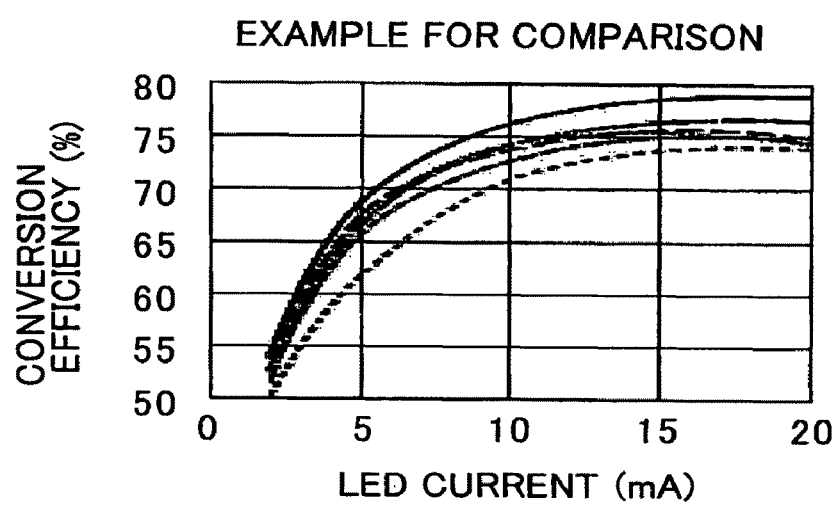
FIG. 21B illustrates measurement results of the conversion efficiency of a DC-DC converter for comparison, in which a built-in Schottky diode is used as the diode element.

FIG. 21B illustrates measurement results of the conversion efficiency of a DC-DC converter for comparison, in which a built-in Schottky diode is used as the diode element.

In FIG. 21A and FIG. 21B, the abscissa indicates the LED current in units of mA (mili-ampere), and the ordinate indicates the conversion efficiency (%). In addition, in the examples shown in FIG. 21A and FIG. 21B, a DC power supply outputs a DC voltage of 3.6 V, the inductance of the coil used in the above examples is 22 µH (micro Henry), and the measurement is made at an environmental temperature of 25° C. The conversion efficiency is expressed as a ratio of the output consumption power of the DC-DC converter over the consumption power of the DC power supply, where the consumption power equals the product of relevant current and voltage.

When the LED current is 5 mA, in the example for comparison as shown in FIG. 21B, the conversion efficiency is slightly less than 70%; in comparison, in the present embodiment as shown in FIG. 21A, the conversion efficiency is near 80%.

Thus, according to the semiconductor device and the DC-DC converter of the present embodiment, since the LDMOS is used as the switching element, and a PN junction diode is used as the diode element, the leakage current can be reduced, and it is possible to improve the conversion efficiency of the step-up DC-DC converter.

Third Embodiment

Figure 22A:
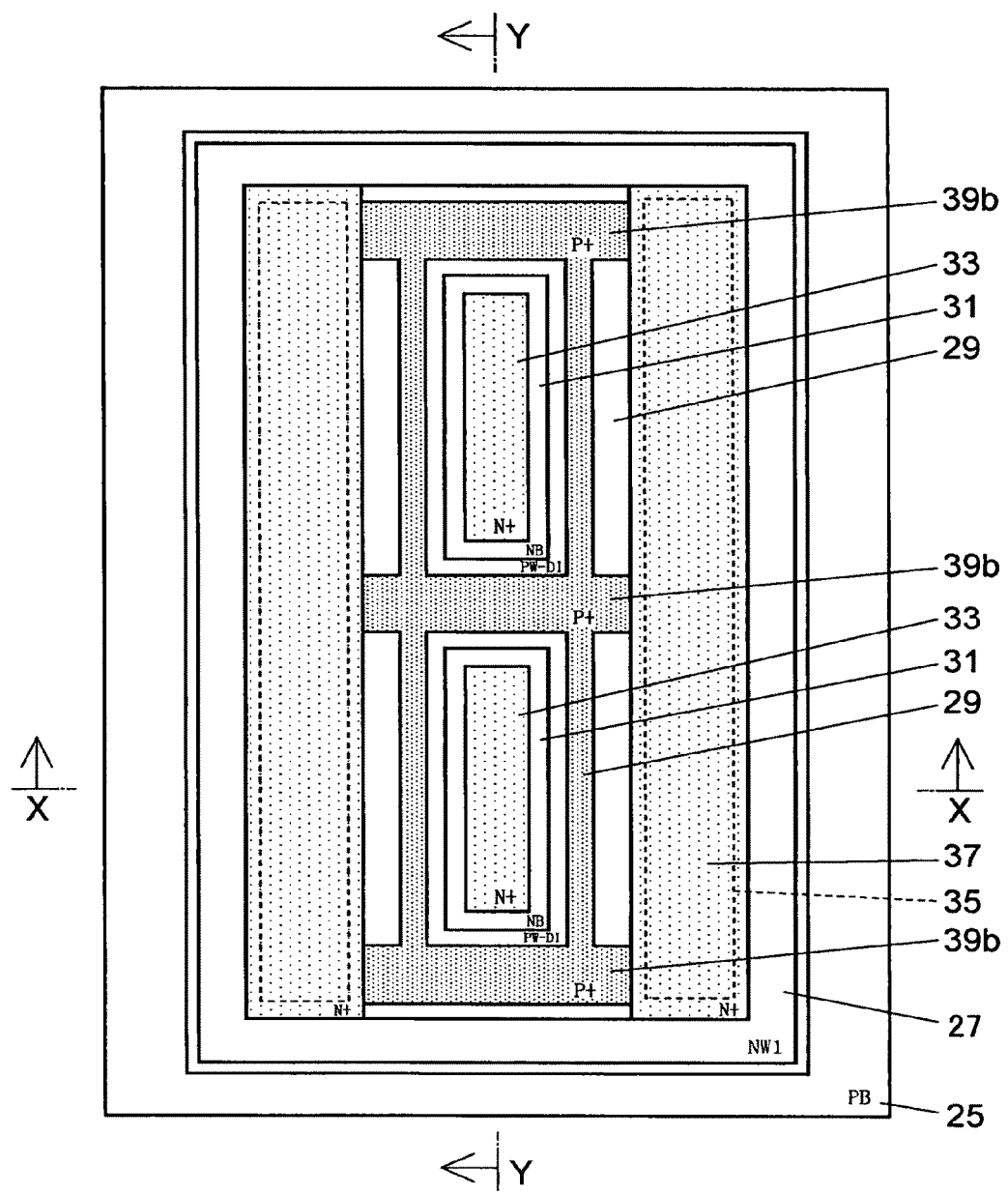
FIG. 22A is a plan view of the diode element according to the third embodiment.

FIG. 22A through FIG. 22C illustrates a diode element according to a third embodiment of the present invention.

Specifically, FIG. 22A is a plan view of the diode element according to the third embodiment.

FIG. 22B is a cross-sectional view of the diode element at a position X-X as indicated in FIG. 22A, FIG. 22C is a cross-sectional view of the diode element at a position Y-Y as indicated in FIG. 22A.

In FIG. 22A through FIG. 22C, the same reference numbers are assigned to the same elements as those illustrated in FIG. 3A through FIG. 3C, and FIG. 19A through FIG. 19C, and overlapping descriptions are omitted.

The diode element shown in FIG. 22A through FIG. 22C differs from the diode element shown in FIG. 19A through FIG. 19C in that a portion of the p-type high concentration diffusion layer 39a (corresponding to the base contact diffusion layers of the diode element) between the n-type body diffusion layer 31 (corresponding to an emitter diffusion layer of the diode element) and the n-type high concentration diffusion layer 37 (corresponding to a collector contact diffusion layer of the diode element) is separated from the n-type high concentration diffusion layer 37 by a distance.

Similar to the diode element shown in FIG. 19A through FIG. 19C, the diode element of the present embodiment also has a small reverse bias leakage current compared to the diode element shown in FIG. 3A through FIG. 3C, which does not have the slit.

Figure 23:
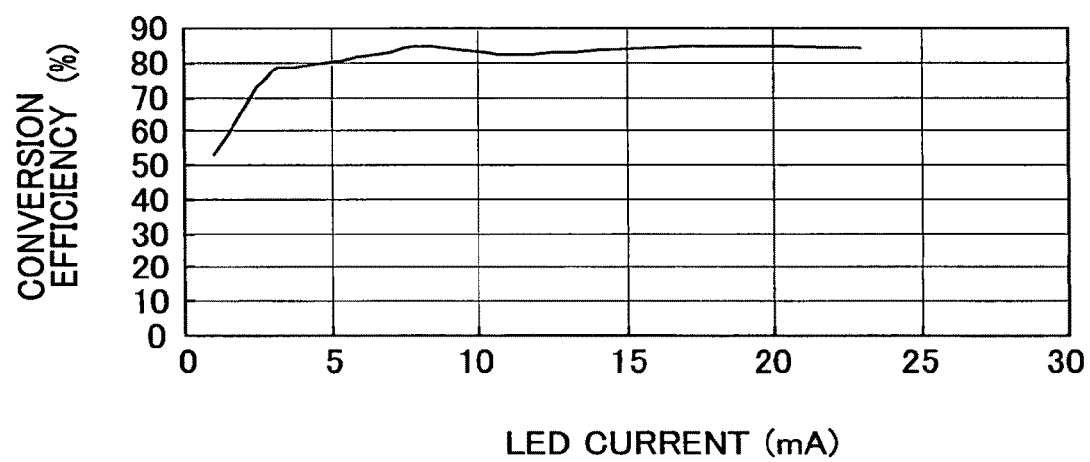
FIG. 23 illustrates measurement results of the conversion efficiency of a DC-DC converter, which is equivalent to the DC-DC converter shown in FIG. 5 with the diode element being replaced by the diode element shown in FIG. 22A through FIG. 22C.

FIG. 23 illustrates measurement results of the conversion efficiency of a DC-DC converter, which is equivalent to the DC-DC converter shown in FIG. 5 with the diode element being replaced by the diode element shown in FIG. 22A through FIG. 22C.

In FIG. 23, the abscissa indicates the LED current in units of mA (mili-ampere), and the ordinate indicates the conversion efficiency (%). In this example, a DC power supply outputs a DC voltage of 3.6 V, the inductance of the coil used in the above examples is 22 µH (micro Henry), and the measurement is made at an environmental temperature of 25° C. The conversion efficiency is expressed as a ratio of the output consumption power of the DC-DC converter over the consumption power of the DC power supply, and the consumption power equals the product of relevant current and voltage.

As shown in FIG. 23, in the present embodiment, when the LED current is 5 mA, the conversion efficiency is about 80%. Therefore, compared to the example in FIG. 21B, in which a built-in Schottky diode is used as the diode element, the leakage current is reduced, and the conversion efficiency of the step-up DC-DC converter is improved.

Fourth Embodiment

Figure 24A:
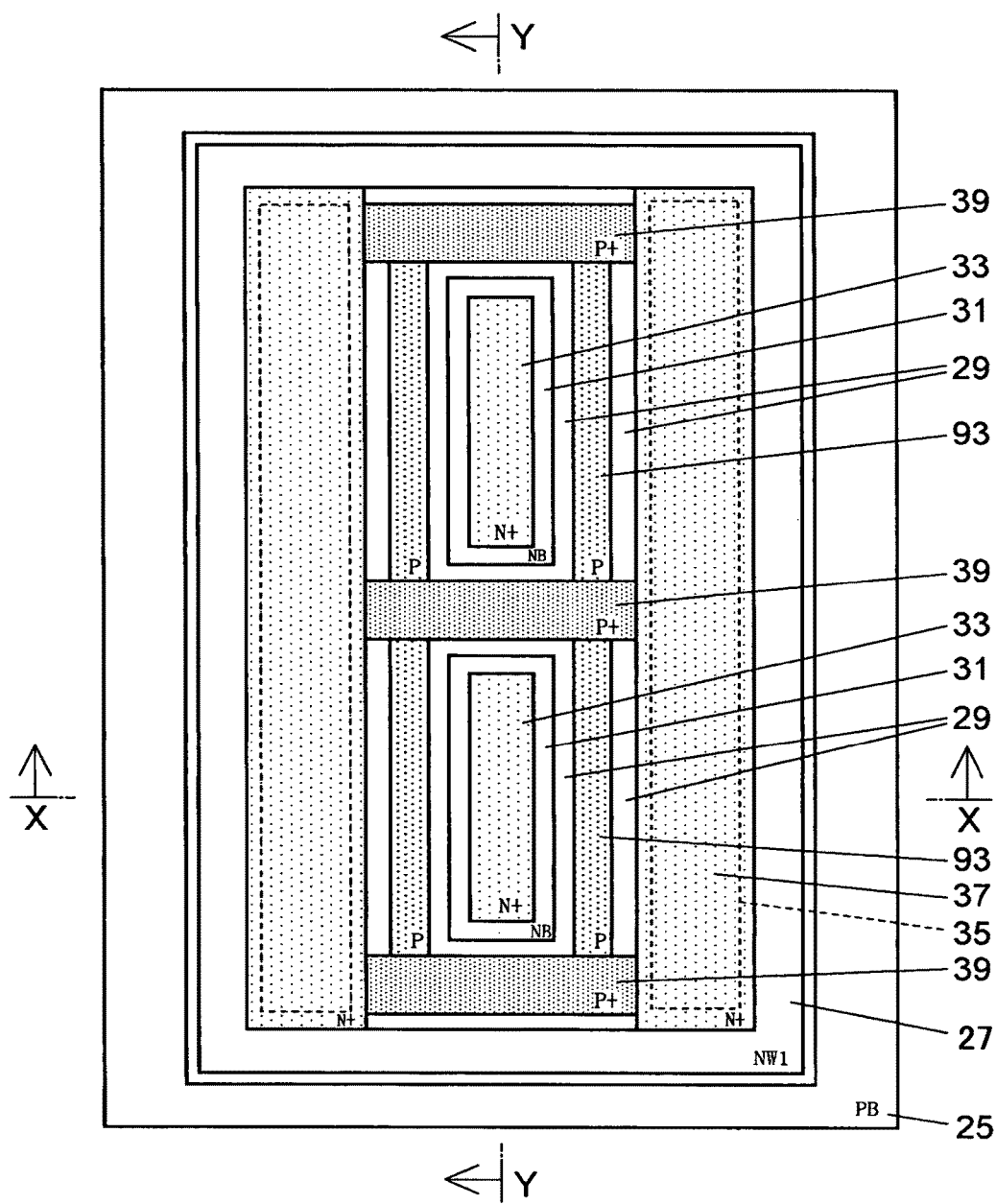
FIG. 24A is a plan view of the diode element according to the fourth embodiment of the present invention.
Figure 24B:
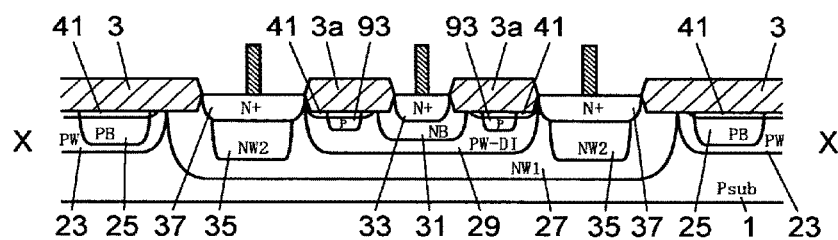
FIG. 24B is a cross-sectional view of the diode element at a position X-X as indicated in FIG. 24A.
Figure 24C:
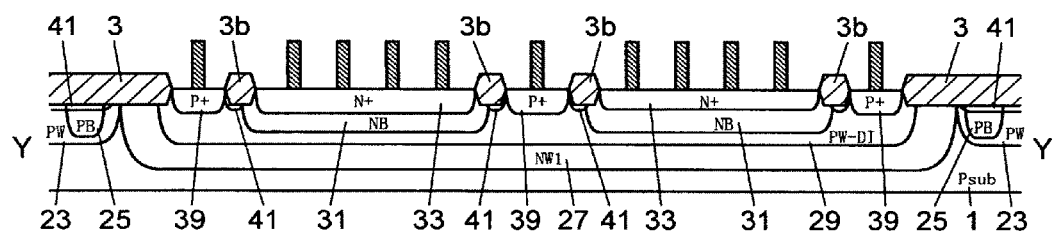
FIG. 24C is a cross-sectional view of the diode element at a position Y-Y as indicated in FIG. 24A.

FIG. 24A through FIG. 24C illustrates a diode element according to a fourth embodiment of the present invention.

Specifically, FIG. 24A is a plan view of the diode element according to the fourth embodiment.

FIG. 24B is a cross-sectional view of the diode element at a position X-X as indicated in FIG. 24A.

FIG. 24C is a cross-sectional view of the diode element at a position Y-Y as indicated in FIG. 24A.

In FIG. 24A through FIG. 24C, the same reference numbers are assigned to the same elements as those illustrated in FIG. 3A through FIG. 3C, and overlapping descriptions are omitted.

The diode element shown in FIG. 24A through FIG. 24C differs from the diode element shown in FIG. 3A through FIG. 3C in that a p-type high concentration diffusion layer 93 (corresponding to the second base diffusion layer in claims of the present application) is provided in the p-type well diffusion layer 29 below the field oxide film 3a and to be separated from the n-type body diffusion layer 31 (corresponding to the emitter diffusion layer of the diode element) and the n-type high concentration diffusion layer 37 (corresponding to the collector contact diffusion layer of the diode element) by a distance. The field oxide film 3a is formed on a part of the surface of the p-type well diffusion layer 29 (corresponding to a base diffusion layer of the diode element) between the n-type body diffusion layer 31 (the emitter diffusion layer of the diode element) and the n-type high concentration diffusion layer 37 (the collector contact diffusion layer of the diode element). Moreover, the p-type high concentration diffusion layer 93 has an impurity concentration higher than that of the p-type well diffusion layer 29.

According to the present embodiment, it is possible to reduce the reverse bias leakage current (the leakage current between the collector and the emitter) compared to the case when the p-type high concentration diffusion layer 93 is absent. The configuration of the present embodiment is particularly effective in a structure in which the p-type impurities of the p-type well diffusion layer 29 below the field oxide film 3a are sucked out by the field oxide film 3a.

In the above, it is described that the p-type high concentration diffusion layer 93 (the second base diffusion layer) is provided to be separated from the n-type body diffusion layer 31 (the emitter diffusion layer of the diode element) and the n-type high concentration diffusion layer 37 (the collector contact diffusion layer of the diode element) by a distance. It should be noted that the present embodiment is not limited to this; the p-type high concentration diffusion layer 93 may be formed to be adjacent to the n-type body diffusion layer 31 or the n-type high concentration diffusion layer 37, or be adjacent to both of the n-type body diffusion layer 31 and the n-type high concentration diffusion layer 37. The structure of the present embodiment can be fabricated in the same way as that shown in FIG. 4, and FIG. 7A through FIG. 18C, except that the following additional step is executed between the step shown in FIG. 14B and the step shown in FIG. 14C.

Figure 25:
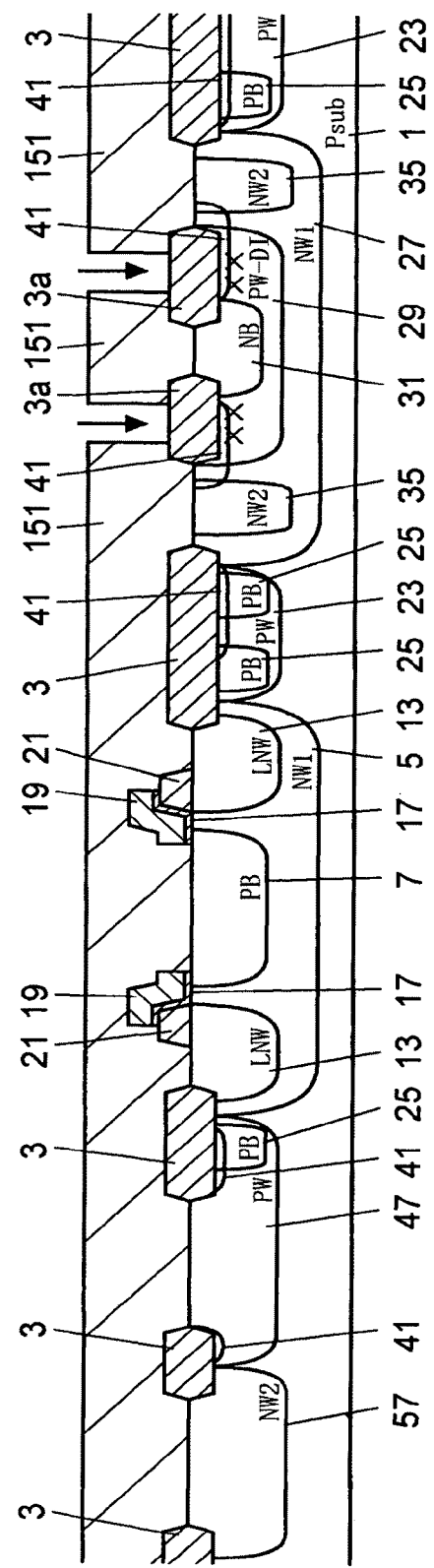
FIG. 25 is a cross-sectional view of illustrating a step of the method of producing the semiconductor device of the present embodiment as shown in FIG. 24A through FIG. 24C, which is executed between the step in FIG. 14B and the step shown in FIG. 14C.

FIG. 25 is a cross-sectional view illustrating a step of the method of producing the semiconductor device of the present embodiment as shown in FIG. 24A through FIG. 24C, which is executed between the step in FIG. 14B and the step shown in FIG. 14C.

As described in the first embodiment, the field oxide films 3, 3a, 3b are formed in the step in FIG. 14A, and the silicon nitride film 125 is removed in the step in FIG. 14B.

After that, in the step shown in FIG. 25, a photo resist 151 is formed, which has an opening corresponding to the position of the p-type well diffusion layer 29 below the field oxide film 3a. With the photo resist 151 as a mask, boron ions (indicated by crosses "X" in FIG. 25) are implanted into the p-type well diffusion layer 29 via the field oxide film 3a, for example, at an implantation energy of 160 keV and a dose of $1.0 \times 10^{12}$ cm$^{-2}$ to $1.0 \times 10^{13}$ cm$^{-2}$. Then, the photo resist 151 is removed. For purpose of illustration, the photo resist 151 is presented in FIG. 25.

Then, the steps shown in FIG. 14C through FIG. 18C are executed, thereby, the p-type high concentration diffusion layer 93 is formed in the p-type well diffusion layer 29 below the field oxide film 3a.

The boron ions, which are used to form the p-type high concentration diffusion layer 93, can be activated through activation treatment specific to the boron ions, or through the activation treatment specific to the boron ions and activation treatment for other ions simultaneously.

Fifth Embodiment

Figure 26A:
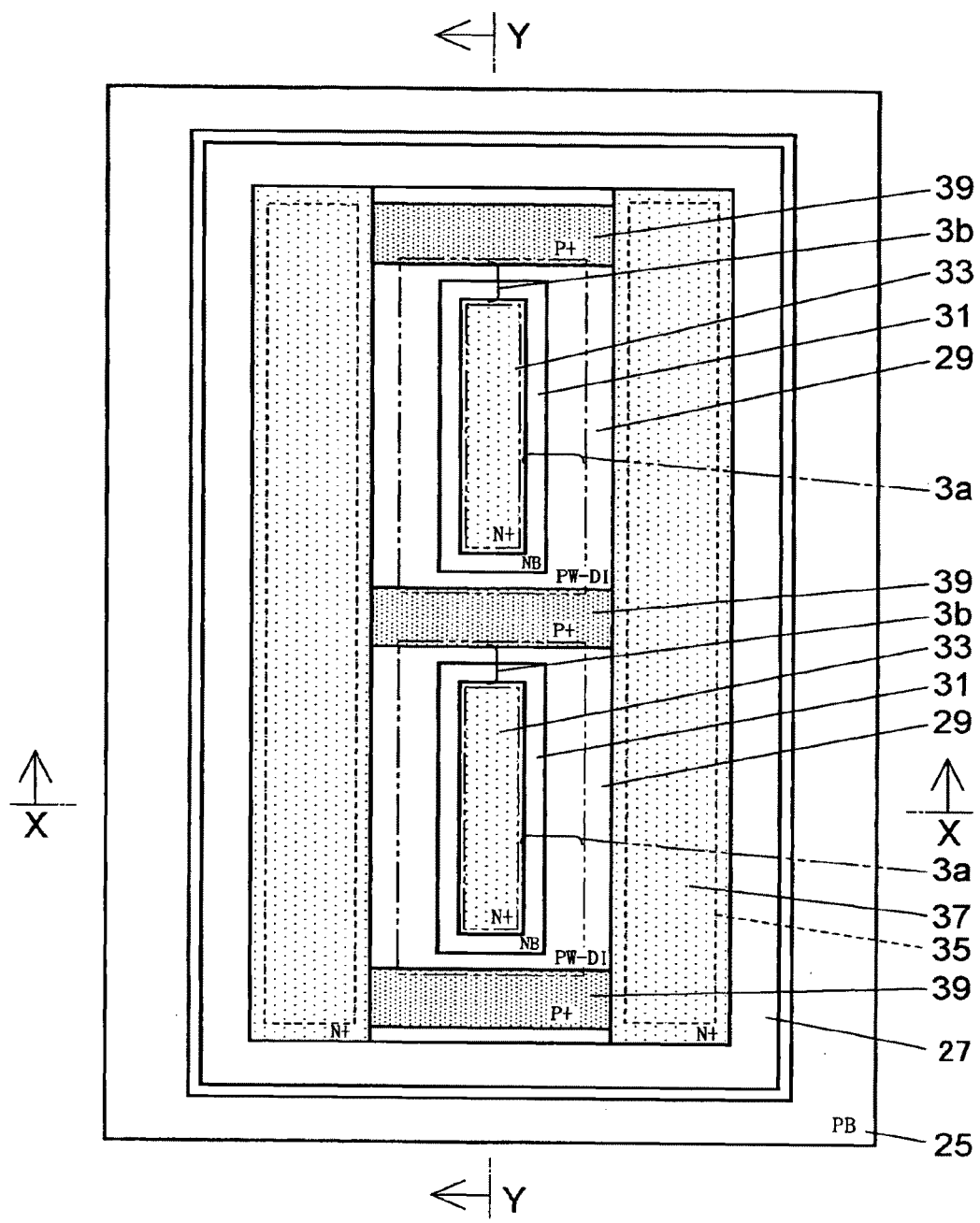
FIG. 26A is a plan view of the diode element according to the fifth embodiment.
Figure 26B:
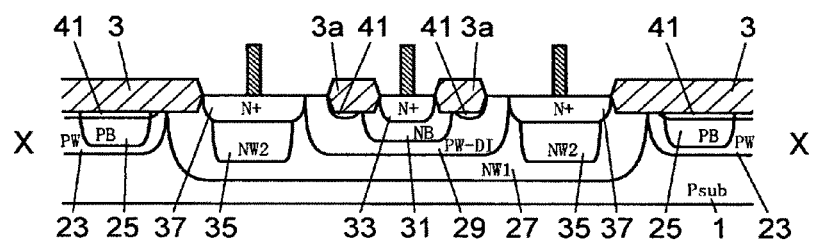
FIG. 26B is a cross-sectional view of the diode element at a position X-X as indicated in FIG. 26A.
Figure 26C:
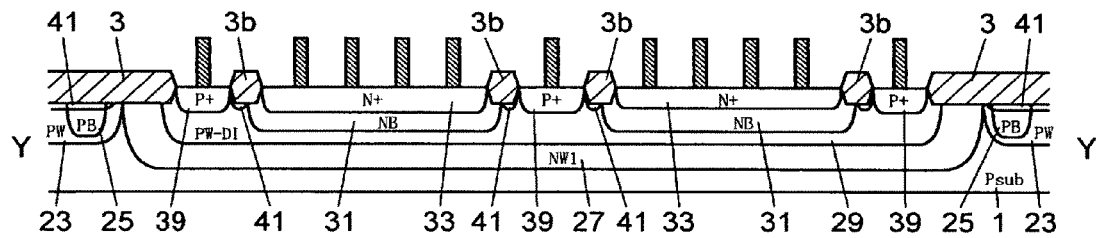
FIG. 26C is a cross-sectional view of the diode element at a position Y-Y as indicated in FIG. 26A.

FIG. 26A through FIG. 26C illustrates a diode element according to a fifth embodiment of the present invention.

Specifically, FIG. 26A is a plan view of the diode element according to the fifth embodiment.

FIG. 26B is a cross-sectional view of the diode element at a position X-X as indicated in FIG. 26A.

FIG. 26C is a cross-sectional view of the diode element at a position Y-Y as indicated in FIG. 26A.

In FIG. 26A through FIG. 26C, the same reference numbers are assigned to the same elements as those illustrated in FIG. 3A through FIG. 3C, and overlapping descriptions are omitted.

The diode element shown in FIG. 26A through FIG. 26C differs from the diode element shown in FIG. 3A through FIG. 3C in that the field oxide film 3a is provided on the surface of a portion of the p-type well diffusion layer 29 (corresponding to the base diffusion layer of the diode element) between the n-type body diffusion layer 31 (corresponding to the emitter diffusion layer of the diode element) and the n-type high concentration diffusion layer 37 (corresponding to the collector contact diffusion layer of the diode element), and is separated from the n-type high concentration diffusion layer 37 (the collector contact diffusion layer of the diode element) by a distance.

Moreover, the surface of the portion of the p-type well diffusion layer 29 (the base diffusion layer of the diode element) between the n-type body diffusion layer 31 (the emitter diffusion layer of the diode element) and the n-type high concentration diffusion layer 37 (the collector contact diffusion layer of the diode element) is not totally covered with the field oxide film 3a.

Furthermore, the field dope layer 41 below the field oxide film 3a is also formed to be separated from the n-type high concentration diffusion layer 37 (the collector contact diffusion layer of the diode element) by a distance.

According to the present embodiment, it is possible to reduce the reverse bias leakage current (the leakage current between the collector and the emitter) compared to the structure shown in FIG. 3A through FIG. 3C, in which the surface of the portion of the p-type well diffusion layer 29 between the n-type body diffusion layer 31 and the n-type high concentration diffusion layer 37 is totally covered with the field oxide film 3a.

The configuration of the present embodiment is particularly effective in a structure in which the p-type impurities of the p-type well diffusion layer 29 below the field oxide film 3a are sucked out by the field oxide film 3a.

The structure of the present embodiment can be fabricated in the same way as that shown in FIG. 4, and FIG. 7A through FIG. 18C, except that modification should be made to designs of the photo masks used in the steps shown in FIG. 13B, FIG. 17A, and FIG. 18A.

Figure 27:
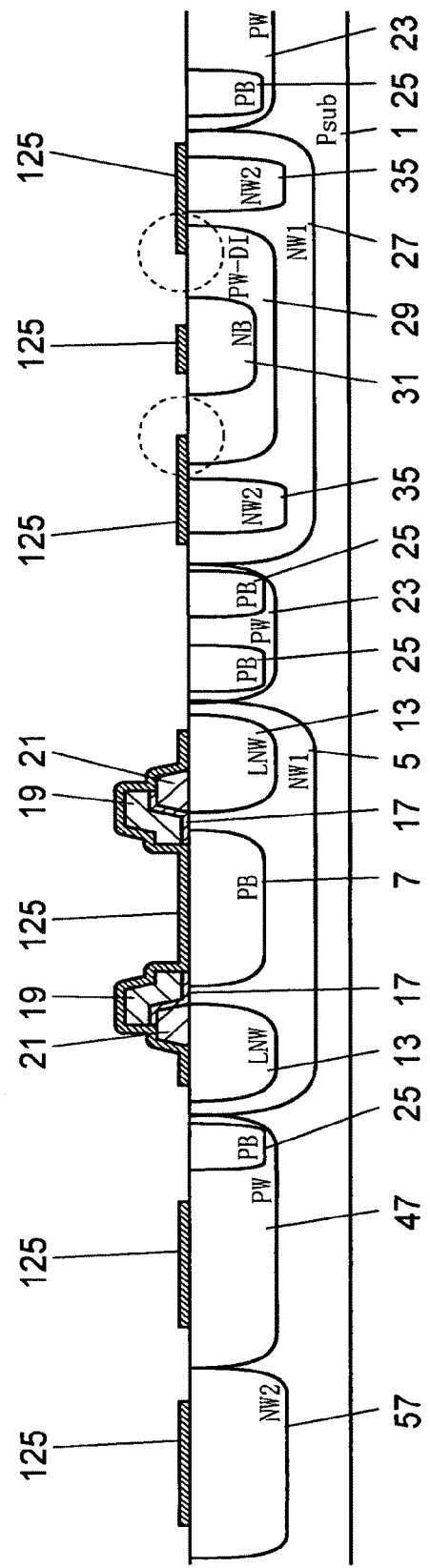
FIG. 27 is a cross-sectional view illustrating a step of the method of producing the semiconductor device of the present embodiment as shown in FIG. 26A through FIG. 26C, which replaces the step in FIG. 13B.

FIG. 27 is a cross-sectional view illustrating a step of the method of producing the semiconductor device of the present embodiment as shown in FIG. 26A through FIG. 26C, which replaces the step in FIG. 13B.

As described in the first embodiment, after the step in FIG. 13A, in the same way as shown in the step in FIG. 13B, the silicon nitride film 125 is formed to define a region where the field oxide film 3 is formed.

Here, as shown by the dashed-line circles in FIG. 27, the silicon nitride film 125 is also formed on a part of the p-type well diffusion layer 29.

That is, the step in FIG. 27 is basically the same as the step in FIG. 13B except that the pattern for forming the photo mask, which is used to define the region of the silicon nitride film 125, is different.

Then, the steps shown in FIG. 13C and FIG. 14A are executed, thereby, as described with reference to FIG. 26A through FIG. 26C, the field oxide film 3a is formed on the surface of the portion of the p-type well diffusion layer 29 between the n-type body diffusion layer 31 and the n-type high concentration diffusion layer 37.

Figure 28:
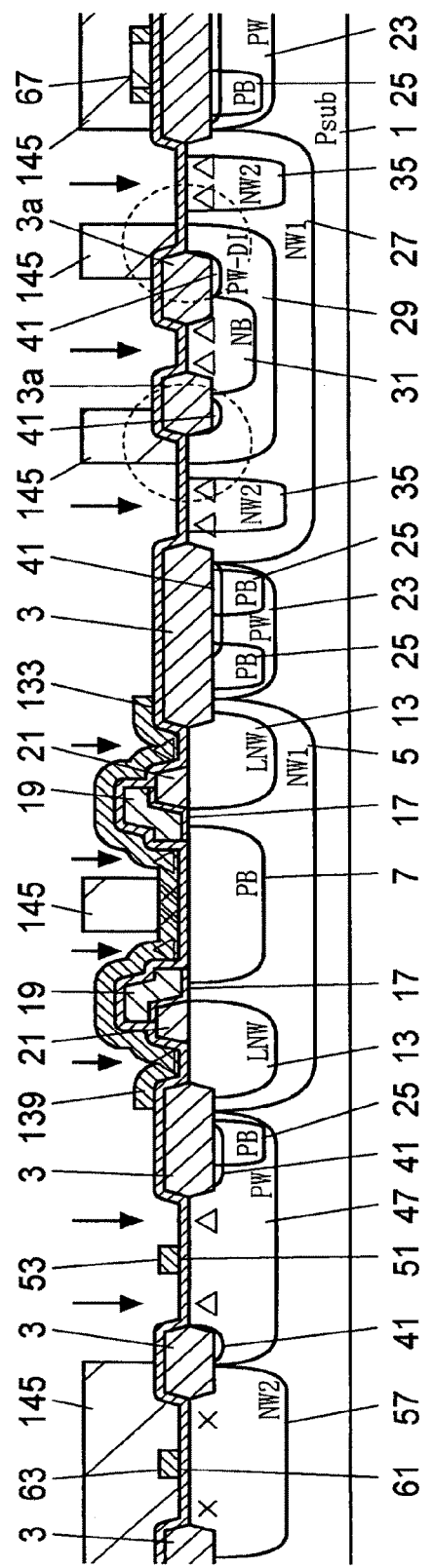
FIG. 28 is a cross-sectional view illustrating a step of the method of producing the semiconductor device of the present embodiment as shown in FIG. 26A through FIG. 26C, which replaces the step in FIG. 17A.

FIG. 28 is a cross-sectional view illustrating a step of the method of producing the semiconductor device of the present embodiment as shown in FIG. 26A through FIG. 26C, which replaces the step in FIG. 17A.

After the step in FIG. 16C, in the same way as shown in the step in FIG. 17A, the photo resist 145 is formed, and with the photo resist 145 as a mask, phosphorus ions (indicated by triangles "Δ" in FIG. 28) are implanted.

Here, as shown by the dashed-line circles in FIG. 28, the photo resist 145 is formed in such a way that the phosphorus ions are not implanted into the p-type well diffusion layer 29.

That is, the step in FIG. 28 is basically the same as the step in FIG. 18A except that the pattern of the photo mask for forming the photo resist 145 is different.

Due to this, as described with reference to FIG. 26A through FIG. 26C, the phosphorus ions are not implanted into a portion of the p-type well diffusion layer 29 between the n-type body diffusion layer 31 and the n-type high concentration diffusion layer 37, in which portion of the p-type well diffusion layer 29, the field oxide film 3a is not formed.

Figure 29:
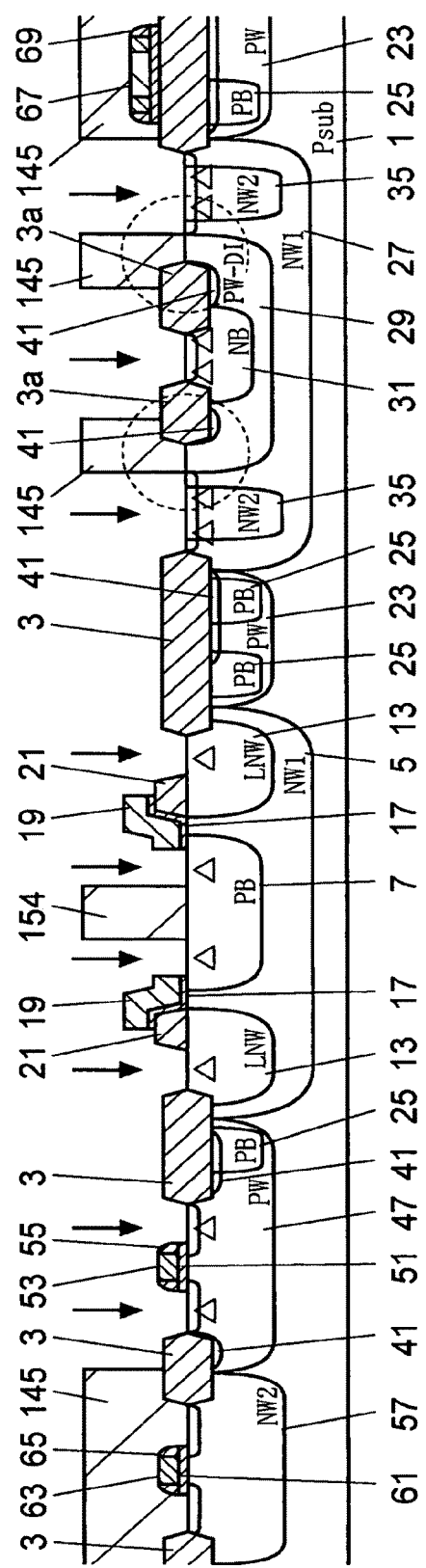
FIG. 29 is a cross-sectional view illustrating a step of the method of producing the semiconductor device of the present embodiment as shown in FIG. 26A through FIG. 26C, which replaces the step in FIG. 18A.

FIG. 29 is a cross-sectional view illustrating a step of the method of producing the semiconductor device of the present embodiment as shown in FIG. 26A through FIG. 26C, which replaces the step in FIG. 18A.

After the step in FIG. 17C, in the same way as shown in the step in FIG. 18A, the photo resist 145 is formed, and with the photo resist 145 as a mask, phosphorus ions (indicated by triangles "Δ" in FIG. 29) are implanted.

Here, as shown by the dashed-line circles in FIG. 29, the photo resist 145 is formed in such a way that the phosphorus ions are not implanted into the p-type well diffusion layer 29.

That is, the step in FIG. 29 is basically the same as the step in FIG. 18A except that the pattern of the photo mask for forming the photo resist 145 is different.

Due to this, as described with reference to FIG. 26A through FIG. 26C, the n-type high concentration diffusion layer 37 is not formed in the portion of the p-type well diffusion layer 29 between the n-type body diffusion layer 31 and the n-type high concentration diffusion layer 37, in which portion of the p-type well diffusion layer 29, the field oxide film 3a is not formed.

Then, the steps shown in FIG. 18B and FIG. 18C are executed, thereby, the structure as shown in FIG. 26A through FIG. 26C is obtained, in which the surface of the portion of the p-type well diffusion layer 29 between the n-type body diffusion layer 31 and the n-type high concentration diffusion layer 37 is not totally covered with the field oxide film 3a.

In the above method of producing the semiconductor device of the present embodiment, one only needs to modify designs of photo masks, and does not need to increase the number of steps for producing the semiconductor device of the present embodiment as shown in FIG. 26A through FIG. 26C compared to the method described in the first embodiment with reference to FIG. 4 and FIG. 7A through FIG. 18C.

In the present embodiment, it is described that the part of the surface of the portion of the p-type well diffusion layer 29 between the n-type body diffusion layer 31 and the n-type high concentration diffusion layer 37, in which part of the surface of the portion of the p-type well diffusion layer 29, the field oxide film 3a is not formed, is adjacent to the n-type high concentration diffusion layer 37 and is separated from the n-type body diffusion layer 31 by a distance. Certainly, the present embodiment is not limited to this. The part of the surface of the portion of the p-type well diffusion layer 29, in which the field oxide film 3a is not formed, may be arranged in other ways.

Figure 30A:
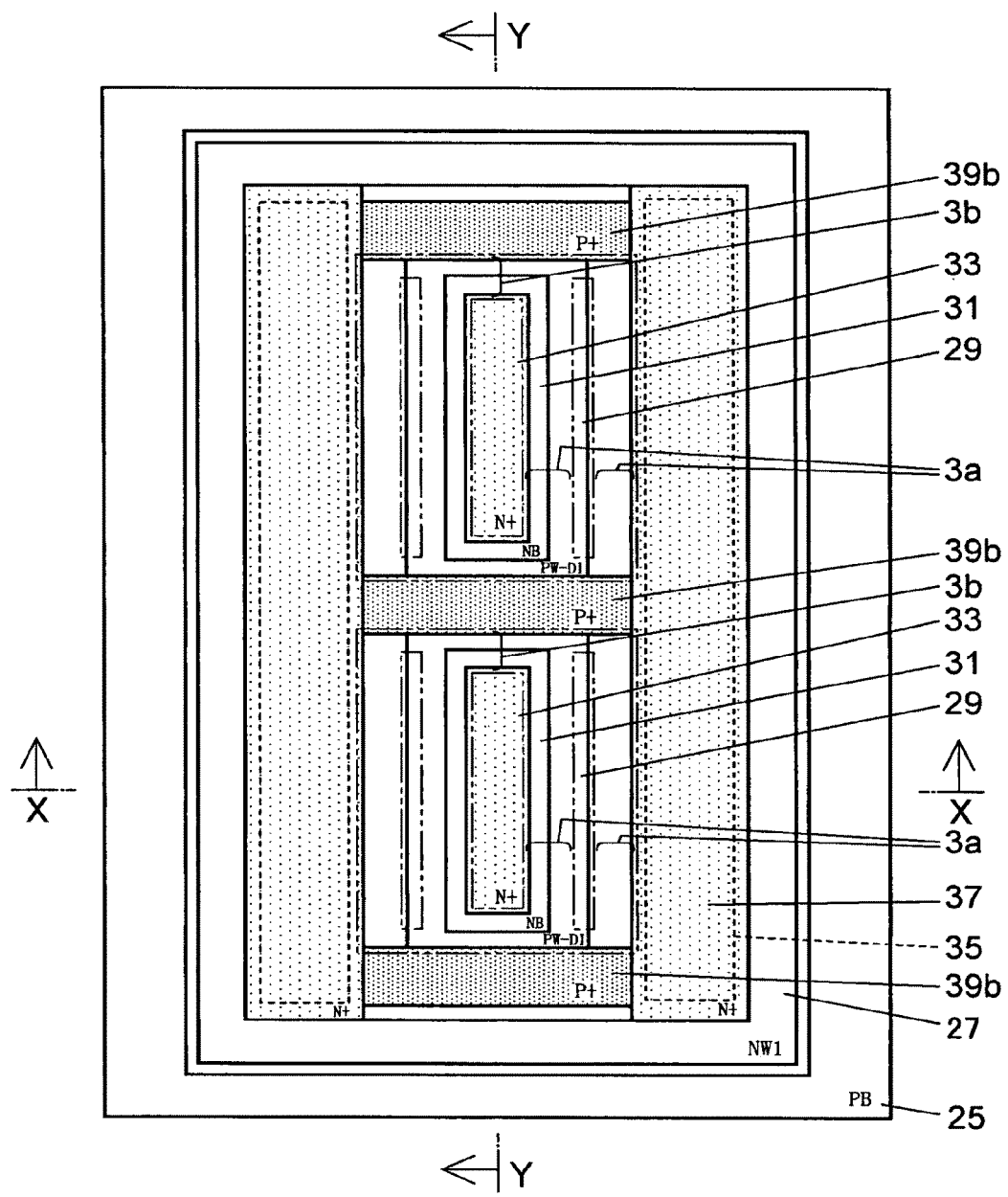
FIG. 30A is a plan view of the diode element which is a modification to the fifth embodiment.
Figure 30B:
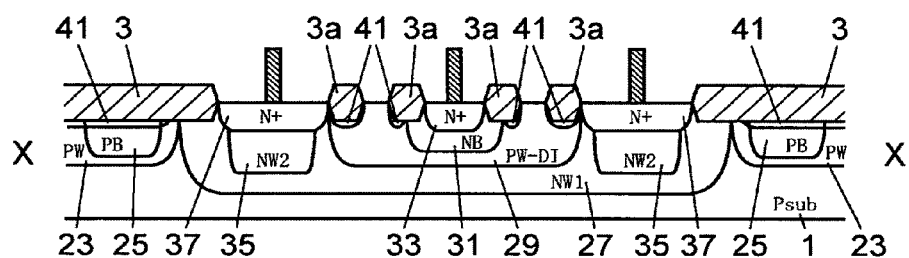
FIG. 30B is a cross-sectional view of the diode element at a position X-X as indicated in FIG. 30A.
Figure 30C:
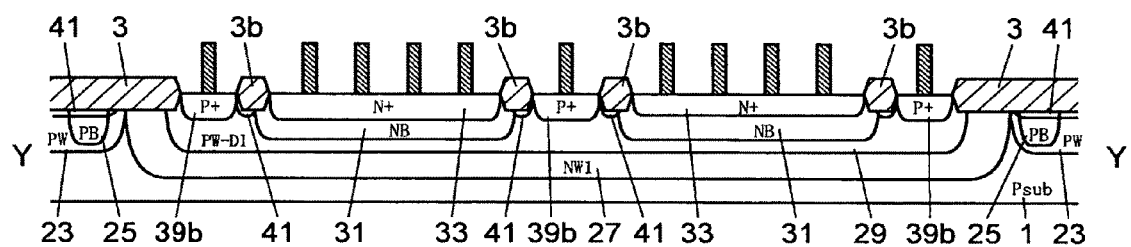
FIG. 30C is a cross-sectional view of the diode element at a position Y-Y as indicated in FIG. 30A.

FIG. 30A through FIG. 30C illustrates a modification to the diode element of the fifth embodiment of the present invention.

Specifically, FIG. 30A is a plan view of the diode element which is a modification to the fifth embodiment.

FIG. 30B is a cross-sectional view of the diode element at a position X-X as indicated in FIG. 30A.

FIG. 30C is a cross-sectional view of the diode element at a position Y-Y as indicated in FIG. 30A.

In FIG. 30A through FIG. 30C, the same reference numbers are assigned to the same elements as those illustrated in FIG. 26A through FIG. 26C, and overlapping descriptions are omitted.

As shown in FIG. 30A through FIG. 30C, the part of the surface of the portion of the p-type well diffusion layer 29 between the n-type body diffusion layer 31 and the n-type high concentration diffusion layer 37, in which part of the surface of the portion of the p-type well diffusion layer 29, the field oxide film 3a is not formed, may be formed to be separated from both the n-type body diffusion layer 31 and the n-type high concentration diffusion layer 37 by a distance.

Alternatively, the part of the surface of the portion of the p-type well diffusion layer 29, in which the field oxide film 3a is not formed, may be formed to adjacent to the n-type body diffusion layer 31 and to be separated from the n-type high concentration diffusion layer 37 by a distance.

In addition, a combination of two or three of a structure including the p-type high concentration diffusion layer 39a or 39b, a structure including the p-type high concentration diffusion layer 93 below the field oxide film 3a, and a structure in which in a portion of the p-type well diffusion layer 29, the field oxide film 3a is not formed, can be arranged in the portion of the p-type well diffusion layer 29 between the n-type body diffusion layer 31 and the n-type high concentration diffusion layer 37.

Because of the combination of these structures, it is possible to further reduce the reverse bias leakage current (the leakage current between the collector and the emitter).

Figure 31:
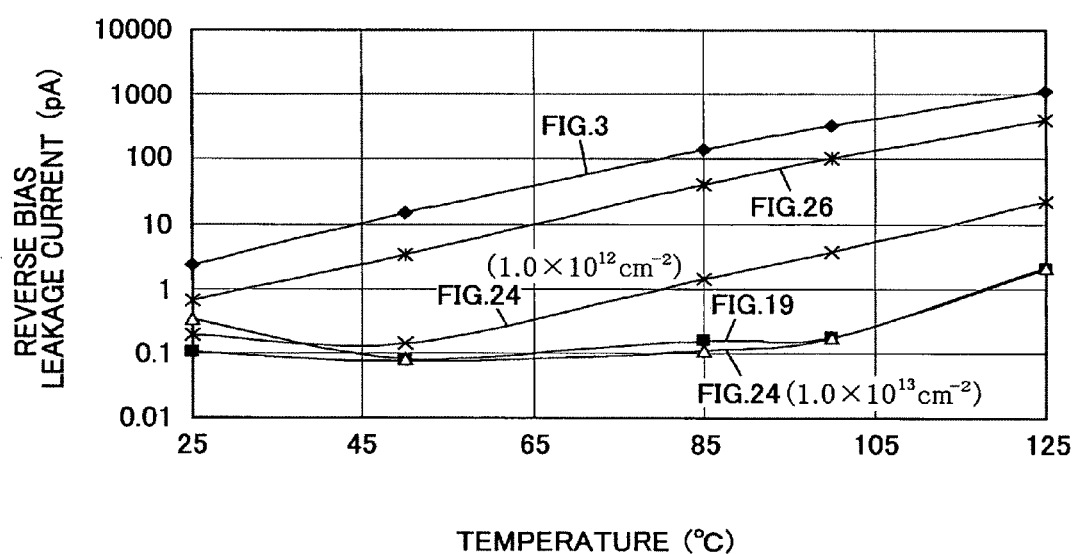
FIG. 31 presents measurement results of dependence of the reverse bias leakage current on the temperature of the diode elements shown in FIG. 3A through FIG. 3C, FIG. 19A through FIG. 19C, FIG. 24A through FIG. 24C, and FIG. 26A through FIG. 26C, respectively.
Figure 32:
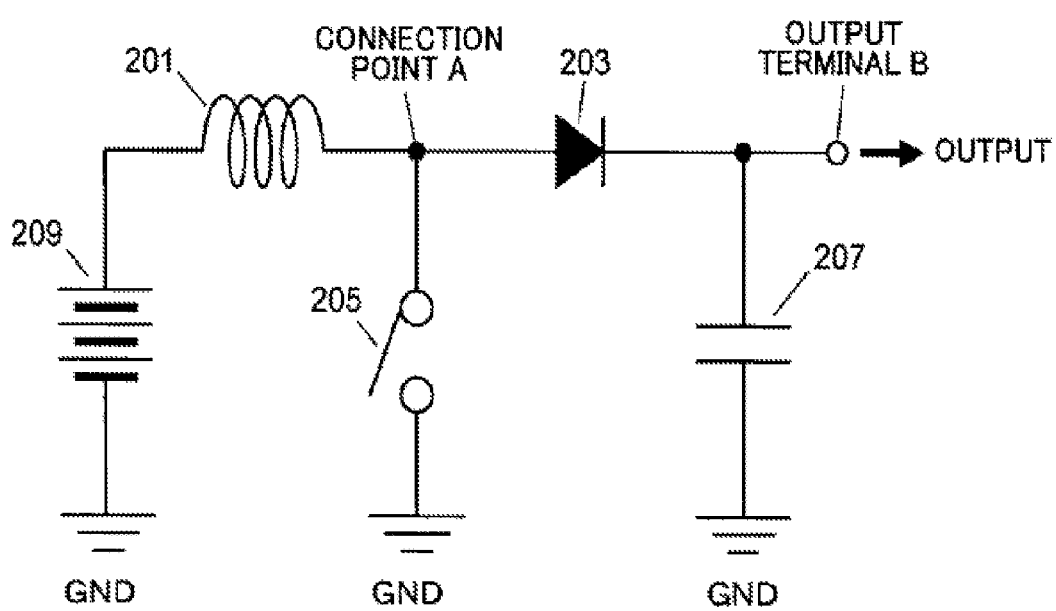
FIG. 32 is a circuit diagram illustrating an example of the step-up DC-DC converter.

FIG. 31 presents measurement results of dependence of the reverse bias leakage current on the temperature of the diode elements shown in FIG. 3A through FIG. 3C, FIG. 19A through FIG. 19C, FIG. 24A through FIG. 24C, and FIG. 26A through FIG. 26C, respectively.

In FIG. 31, the abscissa indicates the temperature (° C.), and the ordinate indicates the reverse bias leakage current in units of pA (pico-ampere).

In the measurement of the reverse bias leakage current, a leakage current is measured under the conditions that a voltage of 20 V is applied between the base and the emitter while the base and the collector are shorted.

In the measurements shown in FIG. 31, two different samples of the diode element shown in FIG. 24A through FIG. 24C are used for measurement, one sample of the diode element shown in FIG. 24A through FIG. 24C is formed with the implantation dose of the boron ions as $1.0 \times 10^{12}$ cm$^{-2}$ when forming the p-type high concentration diffusion layer 93 (the second base diffusion layer), and the other sample of the diode element is formed with the implantation dose of the boron ions as $1.0 \times 10^{13}$ cm$^{-2}$ when forming the p-type high concentration diffusion layer 93. In FIG. 31, the result of the former sample is indicated by a description "FIG. 24 ($1.0 \times 10^{12}$ cm$^{-2}$)", and the result of the latter one is indicated by a description "FIG. 24 ($1.0 \times 10^{13}$ cm$^{-2}$)".

FIG. 31 reveals that little leakage current occurs in the diode element shown in FIG. 19A through FIG. 19C and the diode element of FIG. 24 ($1.0 \times 10^{13}$ cm$^{-2}$).

Comparing the result of the diode element of FIG. 24 ($1.0 \times 10^{12}$ cm$^{-2}$) to that of the diode element of FIG. 24 ($1.0 \times 10^{13}$ cm$^{-2}$), it is found that the magnitude of the leakage current and the temperature dependence properties the diode element change depending on the implantation dose of the boron ions when forming the second base diffusion layer.

Comparing the result of the diode element shown in FIG. 26A through FIG. 26C (in which, the field oxide film 3a does not cover the whole surface of the portion of the p-type well diffusion layer 29 between the n-type body diffusion layer 31 and the n-type high concentration diffusion layer 37) to the diode element shown in FIG. 3A through FIG. 3C (in which, the field oxide film 3a covers the whole surface of the portion of the p-type well diffusion layer 29 between the n-type body diffusion layer 31 and the n-type high concentration diffusion layer 37), it is found that the leakage current is reduced in the diode element shown in FIG. 26A through FIG. 26C.

Further, from the results shown in FIG. 31, it is found that in the diode elements, surface leakage is dominant.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

For example, the LDMOS used as the switching element is not limited to the above examples. Any LDMOS transistor can be used as long as the LDMOS transistor includes a source diffusion layer, a channel diffusion layer having a conductivity opposite to that of the source diffusion layer and enclosing the side surface and the bottom surface of the source diffusion layer, and a drain diffusion layer having conductivity the same as that of the source diffusion layer and adjacent to the outer side of the channel diffusion layer; and the surface of a channel diffusion layer below a gate electrode acts as a channel region.

In addition, the diode element of the present invention is not limited to the above examples. Any diode element can be used as long as the diode element has a vertical bipolar transistor, which includes a collector diffusion layer, a base diffusion layer having a conductivity opposite to that of the collector diffusion layer and formed on the collector diffusion layer, and an emitter diffusion layer having a conductivity the same as that of the collector diffusion layer and formed on the base diffusion layer.

In the above embodiments, a p-type semiconductor substrate is used; certainly, an n-type semiconductor substrate may also be used.

in the above embodiments, an n-channel LDMOS is used as the switching element; certainly, the switching element may also be a p-channel LDMOS.

In the above embodiments, the diode element has a structure of an npn vertical bipolar transistor; certainly, the diode element may also have a pnp vertical bipolar transistor structure.

In the semiconductor device of the present invention, one of the n-channel LDMOS and the p-channel LDMOS, which constitutes the switching element, and one of the npn vertical bipolar transistor and the pnp vertical bipolar transistor structure, which constitutes the diode element, can be combined in any manner as desired.

Note that sometimes it is necessary to limit the diode element to the npn vertical bipolar transistor structure depending on the application of the DC-DC converter, for example, when the DC-DC converter is used for lighting LEDs.

The DC-DC converter of the present invention is not limited to the structure shown in FIG. 5, any step-up DC-DC converter can be used as long as the step-up DC-DC converter includes a semiconductor device having a switching element formed of a LDMOS transistor, a diode element having a vertical bipolar transistor structure, a switching terminal, an output terminal, a coil connected to the switching terminal, and a capacitor connected to the output terminal.

This patent application is based on Japanese Priority Patent Applications No. 2006-165589 filed on Jun. 15, 2006 and No. 2007-090883 filed on Mar. 30, 2007, the entire contents of which are hereby incorporated by reference.

What is claimed is:

1. A step-up DC-DC converter comprising:
    a switching element;
    a diode element formed in the same semiconductor substrate as the switching element;
    a switching terminal; and
    an output terminal,
    wherein the switching element includes a LDMOS transistor having a channel region formed of a surface portion of a body diffusion layer below a gate electrode of the LDMOS, said LDMOS transistor including:
        a source diffusion layer, wherein the body diffusion layer has a conductivity opposite to a conductivity of the source diffusion layer, and is formed to enclose a side surface and a bottom surface of the source diffusion layer, and
        a drain diffusion layer that has a conductivity the same as the conductivity of the source diffusion layer, and is formed outside and neighboring the body diffusion layer, and
    wherein the diode element includes a vertical bipolar transistor including:
        a collector diffusion layer that forms a collector of the diode element,
        a base diffusion layer that has a conductivity opposite to a conductivity of the collector diffusion layer, and forms a base of the diode element in the collector diffusion layer, said base being connected to the collector, and
        an emitter diffusion layer that has a conductivity the same as the conductivity of the collector diffusion layer, and forms an emitter of the diode element in the base diffusion layer, thereby producing a diode between the base and the emitter,
    wherein an anode of the diode element are connected to the switching terminal, and a cathode of the diode element is connected to the output terminal, and
    wherein the diode element further includes a high concentration diffusion layer formed in the base diffusion layer in a direction intersecting a longitudinal direction of the base diffusion layer, and the high concentration diffusion layer has the same conductivity and a higher impurity concentration as compared to the base diffusion layer.

2. The step-up DC-DC converter as claimed in claim 1, wherein the diode element comprises:
    a collector contact diffusion layer that has a conductivity the same as the conductivity of the collector diffusion layer, and is formed on a surface of the collector diffusion layer;
    a field oxide film that is formed from a LOCOS oxide film deposited on a surface of a portion of the base diffusion layer between the emitter diffusion layer and the collector contact diffusion layer; and
    a second base diffusion layer that is disposed on the portion of the base diffusion layer below the field oxide film,
    wherein an impurity concentration of the second base diffusion layer is higher than an impurity concentration of the base diffusion layer.

3. The step-up DC-DC converter as claimed in claim 1, wherein the drain diffusion layer and the collector diffusion layer have the same impurity concentration distribution.

4. A semiconductor device used in a step-up DC-DC converter, comprising:
    a switching element;
    a diode element formed in the same semiconductor substrate as the switching element;
    a switching terminal; and
    an output terminal,
    wherein the diode element includes a vertical bipolar transistor including:
        a collector diffusion layer that forms a collector of the diode element,
        a base diffusion layer that has a conductivity opposite to a conductivity of the collector diffusion layer, and forms a base of the diode element in the collector diffusion layer, said base being connected to the collector, and
        an emitter diffusion layer that has a conductivity the same as the conductivity of the collector diffusion layer, and forms an emitter of the diode element in the base diffusion layer, thereby producing a diode between the base and the emitter,
    wherein an anode of the diode element is connected to the switching terminal, and a cathode of the diode element is connected to the output terminal, and
    wherein the diode element further includes a high concentration diffusion layer formed in the base diffusion layer in a direction intersecting a longitudinal direction of the base diffusion layer, and the high concentration diffusion layer has the same conductivity and a higher impurity concentration as compared to the base diffusion layer.

5. The semiconductor device as claimed in claim 4, further comprising a well diffusion layer formed in the same substrate as the switching element and the diode element, the well diffusion layer electrically isolating the switching element from other elements in the substrate.

6. The semiconductor device as claimed in claim 5, wherein a planar shape of the well diffusion layer is rectangular.

7. The semiconductor device as claimed in claim 4, further comprising a well diffusion layer formed in the same substrate as the switching element and the diode element, the well diffusion layer surrounding the diode element.

8. The semiconductor device as claimed in claim 7, wherein a planar shape of the well diffusion layer is rectangular.

9. The semiconductor device as claimed in claim 4, wherein the diode element further includes a well diffusion layer formed in the collector diffusion layer and along a longitudinal direction of the base diffusion layer separated by an interval from the base diffusion layer, and the well diffusion layer formed in the collector diffusion layer has the same conductivity and a higher impurity concentration as compared to the collector diffusion layer.

10. The semiconductor device as claimed in claim 9, wherein the diode element further includes a high concentration diffusion layer formed on the well diffusion layer in the collector diffusion layer, and the high concentration diffusion layer has the same conductivity and a higher impurity concentration as compared to the well diffusion layer in the collector diffusion layer.

11. The semiconductor device as claimed in claim 4, wherein the diode element comprises:

a collector contact diffusion layer that has a conductivity the same as the conductivity of the collector diffusion layer, and is formed on a surface of the collector diffusion layer;

a field oxide film that is formed from a LOCOS oxide film deposited on a surface of a portion of the base diffusion layer between the emitter diffusion layer and the collector contact diffusion layer; and a second base diffusion layer that is disposed on the portion of the base diffusion layer below the field oxide film, wherein an impurity concentration of the second base diffusion layer is higher than an impurity concentration of the base diffusion layer.

* * * * *